US011244887B2

(12) United States Patent
Tsutsui et al.

(10) Patent No.: US 11,244,887 B2
(45) Date of Patent: Feb. 8, 2022

(54) THREE-DIMENSIONAL LAMINATED INTEGRATED CIRCUIT

(71) Applicant: SoftBank Corp., Tokyo (JP)

(72) Inventors: Takashi Tsutsui, Tokyo (JP); Shigenori Imanaka, Tokyo (JP); Tomohiko Furutani, Tokyo (JP)

(73) Assignee: SoftBank Corp., Tokyo (JP)

( * ) Notice: Subject to any disclaimer, the term of this patent is extended or adjusted under 35 U.S.C. 154(b) by 0 days.

(21) Appl. No.: 16/932,838

(22) Filed: Jul. 20, 2020

(65) Prior Publication Data
US 2020/0402888 A1 Dec. 24, 2020

Related U.S. Application Data

(63) Continuation-in-part of application No. PCT/JP2019/002351, filed on Jan. 24, 2019, and a continuation-in-part of application No. PCT/JP2018/041184, filed on Nov. 6, 2018, and a continuation-in-part of application No. PCT/JP2018/038379, filed on Oct. 15, 2018, and a
(Continued)

(51) Int. Cl.
*H01L 23/44* (2006.01)
*H01L 23/32* (2006.01)
*H01L 23/473* (2006.01)
*H01L 25/18* (2006.01)

(52) U.S. Cl.
CPC .............. *H01L 23/44* (2013.01); *H01L 23/32* (2013.01); *H01L 23/473* (2013.01); *H01L 25/18* (2013.01)

(58) Field of Classification Search
CPC ....................................................... H01L 23/44

USPC .......................................................... 257/713
See application file for complete search history.

(56) References Cited

U.S. PATENT DOCUMENTS 5,788,766 A  8/1998  Yamamoto
6,219,237 B1 *  4/2001  Geusic .................. H01L 23/473
                                                       165/80.4
(Continued)

FOREIGN PATENT DOCUMENTS

JP  H08227953 A  9/1996
JP  2005005529 A  1/2005
(Continued)

OTHER PUBLICATIONS (ISA/237) Written Opinion of the International Search Authority for International Patent Application No. PCT/JP2018/002310, issued/mailed by the Japan Patent Office dated Apr. 10, 2018.
(Continued)

*Primary Examiner* — Ajay Arora

(57) ABSTRACT

A three-dimensional stacked integrated circuit includes a plurality of interposers between respective integrated circuits of the three-dimensional stacked integrated circuit and below a lowermost integrated circuit, wherein a plurality of movement paths of a coolant are respectively provided in the plurality of interposers, and the plurality of movement paths of the coolant provided in the plurality of interposers are connected to each other. Alternatively, the three-dimensional stacked integrated circuit is configured by immersion and the system thereof is simplified by the coolant interacting with the outside in grooves provided to the edges of the interposers. In this case, a path for allowing the coolant to flow in the layer direction is not necessary.

25 Claims, 46 Drawing Sheets

Related U.S. Application Data continuation-in-part of application No. PCT/JP2018/002310, filed on Jan. 25, 2018.

(56) References Cited

U.S. PATENT DOCUMENTS

| | | |
|---|---|---|
| 2004/0251530 A1 | 12/2004 | Yamaji |
| 2007/0085198 A1 | 4/2007 | Shi |
| 2008/0036064 A1 | 2/2008 | Han |
| 2008/0150162 A1 | 6/2008 | Koizumi |
| 2010/0187683 A1 | 7/2010 | Bakir |
| 2012/0136596 A1 | 5/2012 | Yamaoka |
| 2012/0300402 A1* | 11/2012 | Vos ............ H01L 23/427 361/701 |
| 2013/0187275 A1 | 7/2013 | Ohira |
| 2014/0027895 A1 | 1/2014 | Mizuno |
| 2015/0348952 A1 | 12/2015 | Refai-Ahmed |
| 2016/0013114 A1 | 1/2016 | Vadhavkar |
| 2016/0351471 A1 | 12/2016 | Suwada |
| 2017/0186728 A1 | 6/2017 | Chainer |

FOREIGN PATENT DOCUMENTS

| | | |
|---|---|---|
| JP | 2008047894 A | 2/2008 |
| JP | 2008159619 A | 7/2008 |
| JP | 2009512215 A | 3/2009 |
| JP | 2009099683 A | 5/2009 |
| JP | 2013153083 A | 8/2013 |
| JP | 2014187228 A | 10/2014 |
| JP | 2015226061 A | 12/2015 |
| JP | 2015232500 A | 12/2015 |
| JP | 2016219733 A | 12/2016 |
| JP | 2017525150 A | 8/2017 |
| WO | 2011030467 A1 | 3/2011 |
| WO | 2012132019 A1 | 10/2012 |

OTHER PUBLICATIONS (ISA/237) Written Opinion of the International Search Authority for International Patent Application No. PCT/JP2018/038379, issued/mailed by the Japan Patent Office dated Jan. 8, 2019.

(ISA/237) Written Opinion of the International Search Authority for International Patent Application No. PCT/JP2018/041184, issued/mailed by the Japan Patent Office dated Jan. 15, 2019.

International Preliminary Report on Patentability for International Application No. PCT/JP2019/002351, issued by the International Bureau of WIPO dated Apr. 15, 2020.

* cited by examiner

THREE-DIMENSIONAL LAMINATED INTEGRATED CIRCUIT

BACKGROUND

1. Technical Field

The present invention relates to a semiconductor device and a computer.

The present application is related to the following international applications. The present application is a continuation-in-part application of the following international applications in the United States. The present application is an application claiming priority from the following international applications, and regarding the designated countries in which incorporation by reference of documents is permitted, the contents described in the following international applications are incorporated into the present application by reference and are a part of the present application.

1. International application PCT/JP2018/002310 Filing date Jan. 25, 2018
2. International application PCT/JP2018/038379 Filing date Oct. 15, 2018
3. International application PCT/JP2018/041184 Filing date Nov. 6, 2018
4. International application PCT/JP2019/002351 Filing date Jan. 24, 2019

2. Related Art

A technique of releasing heat from a SiP type semiconductor element has been known (for example, refer to Patent Document 1).

PRIOR ART DOCUMENTS

Patent Documents

[Patent Document 1] Japanese Unexamined Patent Application Publication No. 2008-47894

To further improve the computing power of the computing device, in the absence of not only an HBM (High Bandwidth Memory) that vertically stacks memory elements, but also a cooling technology that vertically stacks multiple semiconductor chips with high heat generation such as a CPU, GPU, and the like, configures a three-dimensional computing circuit, and efficiently dissipates heat generated at that time, a stacked three-dimensional integrated circuit cannot be configured except for a memory, a high-performance processing unit used for cloud servers and the like cannot be realized, and improvement of performance of the processing unit had reached its limit. By configuring a three-dimensional integrated circuit using the cooling method proposed in the present invention, the limit of performance improvement can be easily overcome.

SUMMARY OF THE INVENTION

According to a first aspect of the present invention, a semiconductor device is provided. The semiconductor device may include a plurality of stacked semiconductor chips. The semiconductor device may include interposers respectively between the plurality of semiconductor chips, or respectively between semiconductor chips mounted three-dimensionally. The respective interposers may be provided with a movement path of a coolant. The plurality of movement paths of the coolant provided in the plurality of interposers may be connected to each other.

The plurality of interposers may include a first interposer provided with grooves, and a second interposer that is provided between a surface of the first interposer on which the grooves are provided and a lower surface of the integrated circuit and blocks the grooves provided in the first interposer.

The movement paths of the coolant may be formed by spaces sandwiched between the grooves respectively formed in the first interposer and the second interposer, and by holes penetrating through the integrated circuit, the first interposer, and the second interposer. The coolant may flow through a space sandwiched between the grooves and the second interposer, and through the space formed by the holes penetrating through a plurality of the integrated circuits, the first interposer, and the second interposer.

The coolant movement path may be provided by heat pipes disposed in the grooves.

The heat pipes may cross diagonally over the layers outside of the semiconductor device and connect the plurality of interposers.

A groove formed in a first interposer among the plurality of interposers may include a plurality of first groove portions extending in a first direction. A groove formed in a second interposer among the plurality of interposers may include the plurality of first groove portions extending in a second direction that is different from the first direction.

The first direction and the second direction may be substantially orthogonal to each other.

The plurality of semiconductor chips may be connected between the grooves running along the plurality of layers by through vias. When viewed in the stacking direction of the plurality of semiconductor chips, the through vias may be provided at locations surrounded by the grooves. In addition, the through vias may be provided at positions corresponding to the semiconductors, be configured between the grooves of the interposers on which the grooves through which the coolant passes are provided, and couple the layers.

The plurality of semiconductor chips may be vertically connected between layers via the through vias. The plurality of interposers may be formed with surrounding grooves that surround the through vias. The plurality of semiconductor chips may be respectively bonded with the adjacent interposers by an adhesive provided in the surrounding grooves.

The plurality of semiconductor chips may respectively be a processing unit such as a CPU or a GPU. A logic block including a plurality of logic chips and the plurality of interposers may be mounted on a first main surface side of a substrate. The semiconductor device may further include a second main surface that is opposite of the first main surface of the substrate or one or more three-dimensional memory chips provided between the logic block and the first main surface. With the present configuration, by forming the shortest possible electric circuit between the three-dimensional stacked integrated circuit including a plurality of layers of processing units and the three-dimensional memory chips, it is ideal in that heat generation is suppressed and data communication between the memories, CPU, and GPU can be realized at a high-speed clock.

Without using a cooling pipe, a cooling pipeline for cooling is formed by grooves for passing coolant in a copper, aluminum plate, or silicon substrate and vertical layers are connected by vertical holes.

Another method proposed further this time is to, without using a cooling pipeline, form vertical and horizontal grooves that allow the coolant to pass through a copper, aluminum, or silicon substrate, to extend the grooves to the edges of the substrate and to open them to cool the semiconductor from the inside by immersing the coolant from the side surfaces by immersion without configuring a vertical pipeline through vertical holes. The vertical and horizontal grooves avoid parts configuring TSVs. When a copper or aluminum layer is inserted, it is necessary to fill the holes of the copper or aluminum plate in the part configuring the vertical TSV with a silicon substrate.

The grooves through which the coolant passes are configured by etching, CNC engraving, laser engraving, or digging the grooves vertically and horizontally with a press on the substrate layer. The grooves through which the coolant passes may be V-shaped, U-shaped, or channel-shaped.

According to a second embodiment of the present invention, individual semiconductors are mounted in conventional individual BGAs or a semiconductor package conforming to the same, and at that time, geometrical pads for connecting BGA terminals are provided on the upper surface of the package. This makes it possible to vertically stack a plurality of layers of individual semiconductor packages. Cooling is performed by immersion using the gaps of the stacked ball grids of the BGA terminals and the like. A cooling method and semiconductor packaging for immersion in which a ball grid of the BGA is mounted on the lower part of the semiconductor and the pads having a geometrical shape for contacting the BGA are mounted on the upper surface. By vertically stacking stacked integrated circuits thus described, the three-dimensional stacked integrated circuit for immersion is configured.

The semiconductors packages are vertically stacked and are held and pressed so that they do not shift. The holding mechanism may have guides so that the stacked semiconductors do not shift. Coolant flows through the gaps of the ball grid of the BGA terminals. In addition, the coolant does not flow between the interposers, and each semiconductor is composed of the same semiconductor package as before, except that a pad having a geometric shape is added to the upper surface, so difficulty of manufacturing does not increase. Since the data path has only the thickness in the vertical direction including the contacts, high speed interconnection is possible, and the essence of the present invention can be realized without changing any existing semiconductor manufacturing method.

Since impedance of a three-dimensional semiconductor according to item 13 increases when power is supplied, in item 26, a power supply electrode was provided in a peripheral part to lower the impedance and enable high current power supply.

In item 27, a lid was provided on the power supply electrode according to item 26 to further reduce the impedance. A stacked ceramic capacitor may be provided between positive and negative electrodes.

The summary clause does not necessarily describe all necessary features of the embodiments of the present invention. The present invention may also be a sub-combination of the features described above.

In item 1, the three-dimensional stacked integrated circuit is shown, wherein a plurality of interposers between respective integrated circuits of the three-dimensional stacked integrated circuit and below a lowermost integrated circuit, wherein a plurality of movement paths of a coolant are respectively provided in the plurality of interposers, and the plurality of movement paths of the coolant provided in the plurality of interposers are connected to each other.

In item 2, the three-dimensional stacked integrated circuit according to item 1 is shown, wherein the plurality of interposers include a first interposer provided with grooves, and a second interposer that is provided between a surface of the first interposer on which the grooves are provided and a lower surface of the integrated circuit and blocks the grooves provided in the first interposer, and the movement paths of the coolant are formed by a space sandwiched between the grooves respectively formed in the first interposer and the second interposer, and by holes penetrating through the integrated circuit, the first interposer, and the second interposer, and the coolant flows through the spaces sandwiched between the grooves and the second interposer, and through the space formed by the holes penetrating through the plurality of integrated circuits, the first interposer, and the second interposer.

In item 3, the three-dimensional stacked integrated circuit according to item 1 is shown, wherein the movement paths of the coolant are formed by a heat pipe running through grooves formed in each of the plurality of interposers and grooves sandwiched between the integrated circuits, and regarding the movement path of the coolant, the heat pipe disposed in the grooves may pass through the outside of the semiconductor device to become the path of the heat pipe of the next layer and allow the coolant to flow.

In item 4, the three-dimensional stacked integrated circuit according to item 3 is shown, wherein the grooves formed in at least one interposer among the plurality of interposers includes a first groove and a second groove formed to the edge of the interposer, and the heat pipe includes
 a first portion disposed in the first groove,
 a second portion disposed in the second groove, and
 a third portion that curves outside of the interposer and connects to the first portion and the second portion.

In item 5, the three-dimensional stacked integrated circuit according to any one of items 2 to 4 is shown, wherein in the plurality of interposers, grooves formed in adjacent interposers are substantially orthogonal to each other between the adjacent interposers.

In item 6, the three-dimensional stacked integrated circuit according to any one of items 1 to 5 is shown, wherein the plurality of integrated circuits are connected via through vias.

In item 7, the three-dimensional stacked integrated circuit according to any one of items 1 to 6 are shown wherein the plurality of integrated circuits and interposer layers in which grooves are formed are bonded or pressure-bonded with an adhesive including die bonding agent and bonding tape.

In item 8, the three-dimensional stacked integrated circuit according to any one of items 1 to 7 is shown, wherein the three-dimensional stacked integrated circuit includes a substrate, an HBM (high bandwidth memory) provided on the substrate, and a three-dimensional array of a plurality of processing units, a plurality of general-purpose GPUs, and a plurality of general-purpose DSP units provided on the substrate, and the substrate is disposed between the plurality of processing units, the plurality of general-purpose GPUs, and the plurality of general-purpose DSP units and the HBM, or the HBM is disposed between the plurality of processing units, the plurality of general-purpose GPUs, and the plurality of general-purpose DSP units and the substrate.

In item 9, the three-dimensional stacked integrated circuit according to any one of items 1 to 8 is shown, wherein, without using a cooling pipe, a cooling pipeline for cooling is formed by grooves for passing coolant in a copper, aluminum plate, or silicon substrate and vertical layers are connected by vertical holes.

In item 10, the three-dimensional stacked integrated circuit according to item 1 is shown, wherein, without using a cooling pipeline, vertical and horizontal grooves are formed that allow the coolant to pass through a copper, aluminum, or silicon substrate, the grooves are extended to the edges of the substrate and they are opened to cool the semiconductor from the inside by immersing the coolant from the side surfaces by immersion without configuring a vertical pipeline through vertical holes. The vertical and horizontal grooves avoid parts configuring TSVs. By allowing the coolant to flow outside in each layer through grooves provided to the edges of the interposers, a three-dimensional stacked integral circuit in which the configuration of the cooling system is simplified is shown. The three-dimensional stacked integrated circuit is shown wherein, when a copper or aluminum layer is inserted as the material for forming a groove, it is necessary to fill the holes of the copper or aluminum plate in the part configuring the vertical TSV with a silicon substrate.

In item 11, the three-dimensional stacked integrated circuit according to item 9 and item 10 is shown, wherein the grooves through which the coolant passes are configured by etching, engraving, shaving with a computer NC, or digging the grooves vertically and horizontally with a press on the substrate layer. The grooves through which the coolant passes are V-shaped, U-shaped, or channel-shaped.

In item 12, a three-dimensional stacked integrated circuit and a method is shown wherein the grooves according to any one of items 1 to 11 are unidirectional, and packing is provided to prevent closed cavitation by providing an inlet and an outlet instead of using immersion. The three-dimensional stacked integrated circuit is shown wherein, in the case where immersion is used, by providing the grooves in one direction or vertically and horizontally and providing only an open-type inlet, cavitation is prevented by applying a positive pressure from the inlet.

In item 13, individual semiconductors are mounted in conventional individual BGAs or a semiconductor package conforming to the same, and at that time, geometrical pads for connecting BGA terminals are provided on the upper surface of the package. This makes it possible to vertically stack a plurality of layers of individual semiconductor packages. Cooling is performed by immersion using the gaps of stacked ball grids of the BGA terminals and the like. A cooling method and semiconductor packaging for immersion in which a ball grid of the BGA is mounted on the lower part of the semiconductor and the pads having a geometrical shape for contacting the BGA are mounted on the upper surface. By vertically stacking stacked integrated circuits thus described, the three-dimensional stacked integrated circuit for immersion is configured.

The semiconductors packages are vertically stacked and are held and pressed so that they do not shift. The holding mechanism may have guides so that the stacked semiconductors do not shift. Coolant flows through the gaps of the ball grid of the BGA terminals. In addition, the coolant does not flow between the interposers, and each semiconductor is composed of the same semiconductor package as before, except that a pad having a geometric shape is added to the upper surface, so difficulty of manufacturing does not increase. Since the data path has only the thickness in the vertical direction including the contacts, high speed interconnection is possible, and the essence of the present invention can be realized without changing any existing semiconductor manufacturing method.

In item 14, the three-dimensional stacked integrated circuit according to item 13 is shown, wherein the pads are spring contacts.

In item 15, a method that is the cooling method of the three-dimensional semiconductor according to item 13 and 14 is shown, wherein the method speeds up the operation of stacked memories and processors by using vertical connection of the semiconductors stacked by the pads in the vertical bus.

In item 16, the three-dimensional stacked integrated circuit according to any one of items 1 to 15 is shown, wherein other than a CPU, a GPGPU, and a central processing unit of virtual currency mining, an HBM is also mounted on the three-dimensional semiconductor of this cooling method, or memory layers are inserted between the layers.

In item 17, a device configuring a processing unit and a method are shown, wherein in the case where the memory layers according to item 16 are sandwiched, the floating capacitance of the memory bus can be minimized and ultra-high-speed operation becomes possible, since it is sufficient to couple only the operation layers and the memory layers through the TSVs.

In item 18, the three-dimensional stacked integrated circuit according to any one of items 1 to 17 is shown, wherein a metal plate such as an aluminum plate is prepared on the top and bottom (the back of the PCB and the back of the semiconductor) as a material to not only come in contact with the BGA, but to prevent decomposition of the three-dimensional cooling semiconductor by positive pressure due to injection of the coolant for preventing cavitation, and four or more points are held by clips. A member such as an insulator is sandwiched between the aluminum plate and the PCB.

In item 19, the three-dimensional stacked integrated circuit according to any one of items 1 to 18 is shown, wherein by providing multiple TSVs of data paths for redundancy and stacking multiple processor arrays including defective points, the data paths may have defective points, and the processor elements may also be used in a form in which the number of defective points gradually increases by three-dimensionally mounting a fine semiconductor that includes defective points from the beginning.

In item 20, the three-dimensional stacked integrated circuit according to any one of items 1 to 19 is shown, wherein the three-dimensional stacked integrated circuit is cooled by immersion and operated at a temperature at which cavitation does not occur.

In item 21, the three-dimensional stacked integrated circuit according to any one of items 1 to 20 is shown, wherein regardless of being immersed in liquid, cavitation is prevented by mounting an adapter on any side of the semiconductor and injecting a solution by positive pressure with a pump.

In item 22, the three-dimensional stacked integrated circuit according to any one of items 1 to 21 is shown, wherein operation is performed while preventing cavitation from occurring by controlling a clock frequency by providing an acoustic sensor and using the output of the acoustic sensor.

In item 23, the three-dimensional stacked integrated circuit according to item 22 is shown, wherein a metal plate such as an aluminum plate is prepared on the top and bottom (the back of the PCB and the back of the semiconductor) as a material to prevent decomposition of the three-dimensional cooling semiconductor by positive pressure due to injection of the coolant for preventing cavitation, and four or more points are held by clips. The three-dimensional stacked integrated circuit is shown wherein a member such as an insulator is sandwiched between the aluminum plate and the PCB.

In item 24, the three-dimensional stacked integrated circuit according to item 23 is shown, wherein an acoustic sensor detects whistling that occurs when the coolant boils, and controls the frequency within a range in which the whistling does not occur.

In item 25, the three-dimensional stacked integrated circuit according to item 24 is shown, wherein the depth and length of the grooves are changed to prevent resonance so that the whistling does not resonate. In this case, the semiconductor may have a trapezoidal shape in order to change the lengths of the grooves. In the case where there are vertical and horizontal grooves, the trapezoid becomes irregular to prevent resonance in each of the vertical and horizontal directions.

In item 26, the semiconductor according to item 13 is shown, wherein by installing electrodes in the corners, peripheral parts, or both of the semiconductor in which BGA packages are stacked and by bringing metal rod-shaped electrodes in contact with the electrodes, stable GND potential with low impedance and a power supply potential are supplied. The metal rod-shaped electrode may have a structure having a capacitor between positive and negative electrodes.

In item 27, the semiconductor according to item 26 is shown, wherein the semiconductor may include a lid having a function of connecting the electrodes for pressing down the stacked semiconductors and supply a stable potential with low impedance. The lid may be provided with a spring or the like to press down the semiconductor. In addition, the lid may have a path for connecting the potentials to each other to connect the positive and negative potentials.

In item 28, the semiconductor according to item 10, item 11, and item 12 may be a normal FC-BGA substrate without grooves in the first layer. The semiconductor of the first layer and the interposer of the first layer are connected by TSVs. Between the FC-BGA substrate of the first layer and the semiconductor of the first layer, FC pads are surrounded by underfill or the like so that water does not enter the FC pads between themselves and the semiconductor of the first layer.

In item 29, the semiconductor according to item 28 is shown, wherein in the stacking parts of its interposers and semiconductor chips, FC pads are solidified with underfill or the like so that coolant does not penetrate the FC pads.

In item 30, in the case of the semiconductor according to item 28 and item 29, it is not always necessary that the grooves through which the coolant passes and the areas of the FC pads with TSVs alternate with each other, and since the area for configuring the semiconductor is lost when there are too many vertical TSV zones, the areas for FC pads with TSVs may be limited in number. The grooves may be adjacent to each other.

In item 31, in the semiconductor according to item 10, item 11, item 12, item 28, item 29, and item 30, by installing electrodes in the corners, peripheral parts, or both of the semiconductor as in item 26 and item 27, and by bringing metal rod-shaped electrodes in contact with the electrodes, stable GND potential with low impedance and a power supply potential are supplied. The metal rod-shaped electrode may have a structure having a capacitor between positive and negative electrodes. The semiconductor may include a lid having a function of connecting the electrodes for pressing down the stacked semiconductors and supply a stable potential with low impedance. The lid may be provided with a spring or the like to press down the semiconductor. In addition, the lid may have a path for connecting the potentials to each other to connect the positive and negative potentials.

In item 32, the semiconductor according to item 13 is shown, wherein the package having pads on its upper surface according to item 13, for connecting the BGA terminal on the upper surface on its upper and lower sides, is configured itself by a FC-BGA substrate provided in a recess for accommodating the semiconductor and by the lid of a heat spreader.

The difference from a normal FC-BGA substrate is that it has a geometrical pad electrodes (lands) for connecting the BGA package of the surface one above to the upper surface excluding the recess. There are FC bumps that join to the semiconductor in the recess part. The part that should be added to a normal FC-BGA substrate are pads (lands), provided on the surface, for connecting BGA bumps of an upper package by adding a substrate with a hole for storing a semiconductor in the center and extending it upward with a through hole.

The reason why the BGA pads are not installed on the upper surface of the place on the semiconductor surface is to install the heat spreader on the recess of the substrate in the semiconductor part, apply a compound, and cover it with a lid. The recessed part may be configured in a state of joining a substrate with a hole for storing a semiconductor in the center in the manufacturing process of the substrate, and connecting the substrate that configures the lower part of the package and the upper pads (lands) with through holes. In a case where the distances between the BGA bumps and the pads (lands) are the same between the first layer and the second and subsequent layers, an internal bus of the three-dimensional semiconductor to be configured this time may be configured by coupling the BGA bumps of all of the layers and the lands with through holes.

Alternatively, the semiconductor chip and the FC-BGA substrate on an upper lid may be directly bonded with FC balls, and the substrate part and the semiconductor chip may be vertically bonded with the FC balls.

In item 33, the semiconductor according to item 32 is shown, wherein the semiconductor itself may be the same in all layers. The FC-BGA substrate of the first layer has pads connected to the upper layer and has pads penetrating the substrate of the upper lid. The FC-BGA substrate on the second and subsequent layers is provided with pads that vertically penetrate the BGA at the peripheral part and are connected to the upper lid.

The second and subsequent layers other than the first layer to be soldered to the PCB may be configured by a BGA with small bumps.

The BGA pads on the upper surface of the first layer and the BGA bumps and pads of the second and subsequent layers are for interlayer coupling, and bumps and bump intervals smaller than those of the first layer may be adopted. The BGA pads on the upper surface of the first layer and the BGA bumps of the second and subsequent layers may or may not include an external bus connection.

Only the lowermost chip may be responsible for interconnection with the external bus. In case where the BGA connection with small bumps does not include the external bus connection, the signal propagation distance becomes extremely short, which enables high-speed clock operation. In addition, since the signal is a non-terminated connection, the operation mode takes into consideration reflection as in a PCI bus. Since it is configured by the BGA with small bumps, holes may be formed in the upper FC-BGA substrate and the lower FC-BGA substrate layer, and the layers may be stacked using guide pins or the like in order to improve the alignment accuracy of the stacking.

The electrodes may be provided by plating in the holes of guide pins by a power supply method according to item 26 and item 27, and the guide pins may also be used as bars for power supply.

In item 34, the semiconductor according to item 32 and item 33 is shown, wherein by adopting BGA bumps of the same size in all layers without using the BGA with small bumps according to item 33, in the second and subsequent layers as well, the package is configured by the FC-BGA substrate with the recess for storing the semiconductor chip just as in the first layer, and the package is closed with a compound and a heat spreader. By removing the BGA bumps on the heat spreader part that covers the package, disposing the BGA bumps for the external connection bus inside the lower part of the chip that is blocked by the chip and cannot be penetrated vertically, and disposing the BGA bumps for chip-to-chip interconnection on the outside, simply by removing some BGA bumps for external connection, the second and subsequent layers may be configured by a package based on the same semiconductor in all layers and the same substrate in all layers besides the fact that some BGA bumps are not present.

In item 35, in the case of the semiconductor according to item 10, item 11, item 12, item 28, item 29, and item 30, the grooves through which the coolant passes are not necessarily dug in the interposers but may be dug on the back surfaces of the semiconductors. In this case, the interposers play a role of passing the TSVs and a role of protecting the semiconductor surface on which the compound is mounted. The semiconductors and the interposers to be stacked may be waterproofly fixed with an underfill, an adhesive (glue), an adhesive film, or the like. By doing so, the semiconductors are made thinner by how much the grooves are not dug in the interposers, and the thermal resistance of the interposers is reduced.

DESCRIPTION OF EXEMPLARY EMBODIMENTS

Hereinafter, the present invention will be described through embodiments of the invention, but the following embodiments do not limit the invention according to the claims. Further, not all of the combinations of features described in the embodiments are essential to the solving means of the invention.

Figure 1:
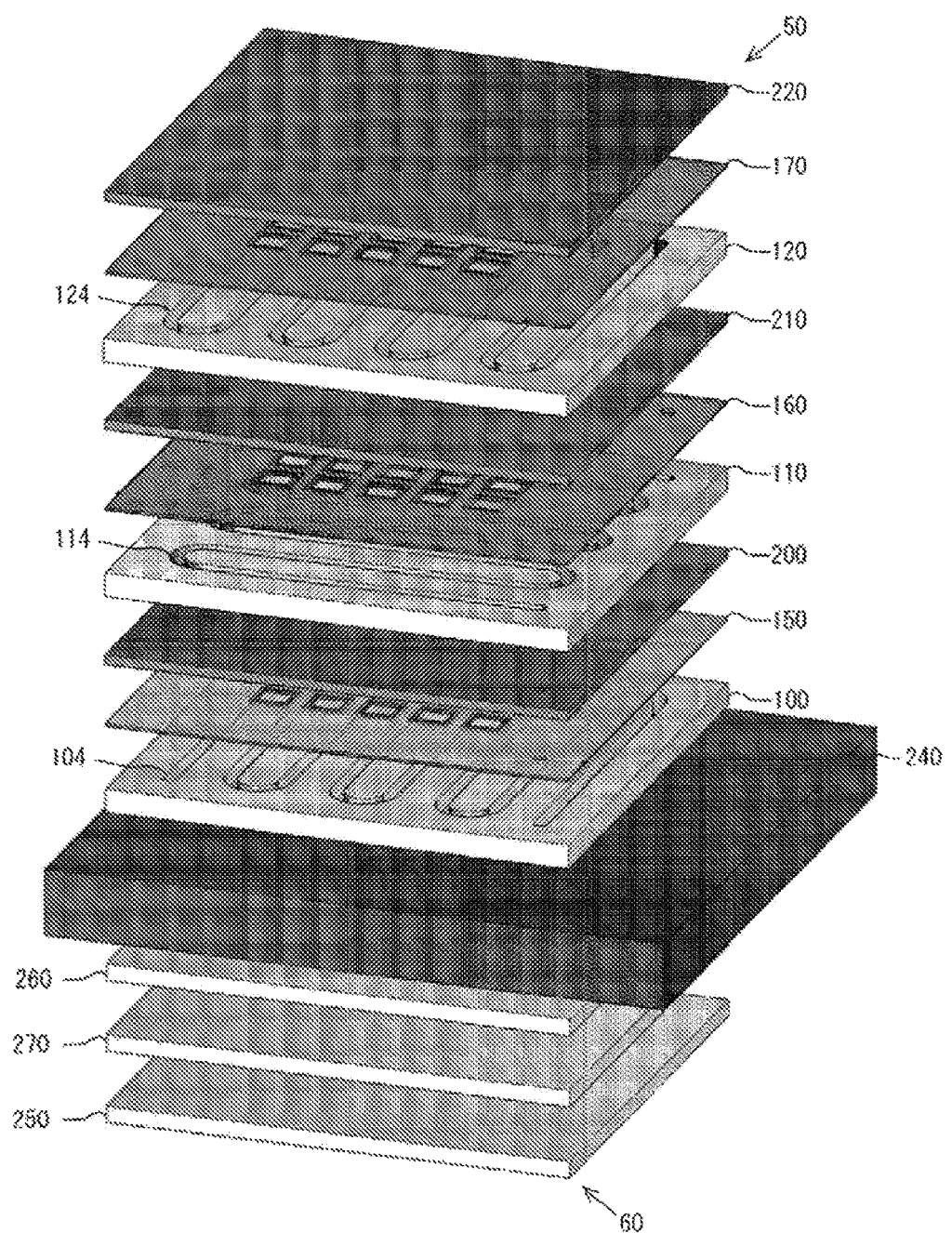
FIG. 1 schematically shows an exploded perspective view of a semiconductor device 10.
Figure 2:
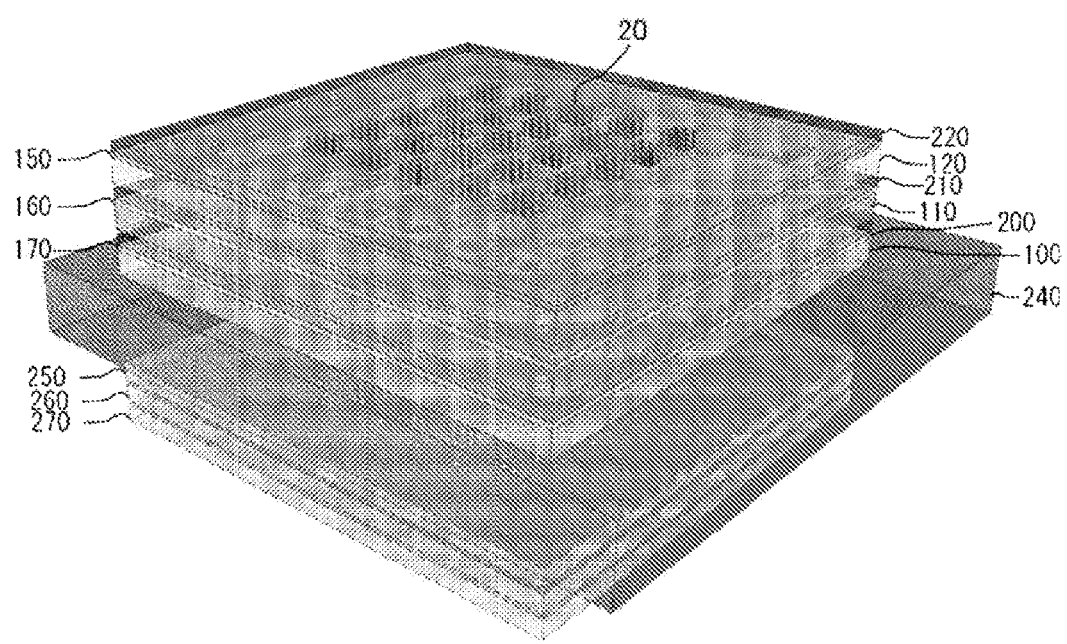
FIG. 2 schematically shows a perspective view of a substrate 240, a logic block 50, and a memory block 60.
Figure 3:
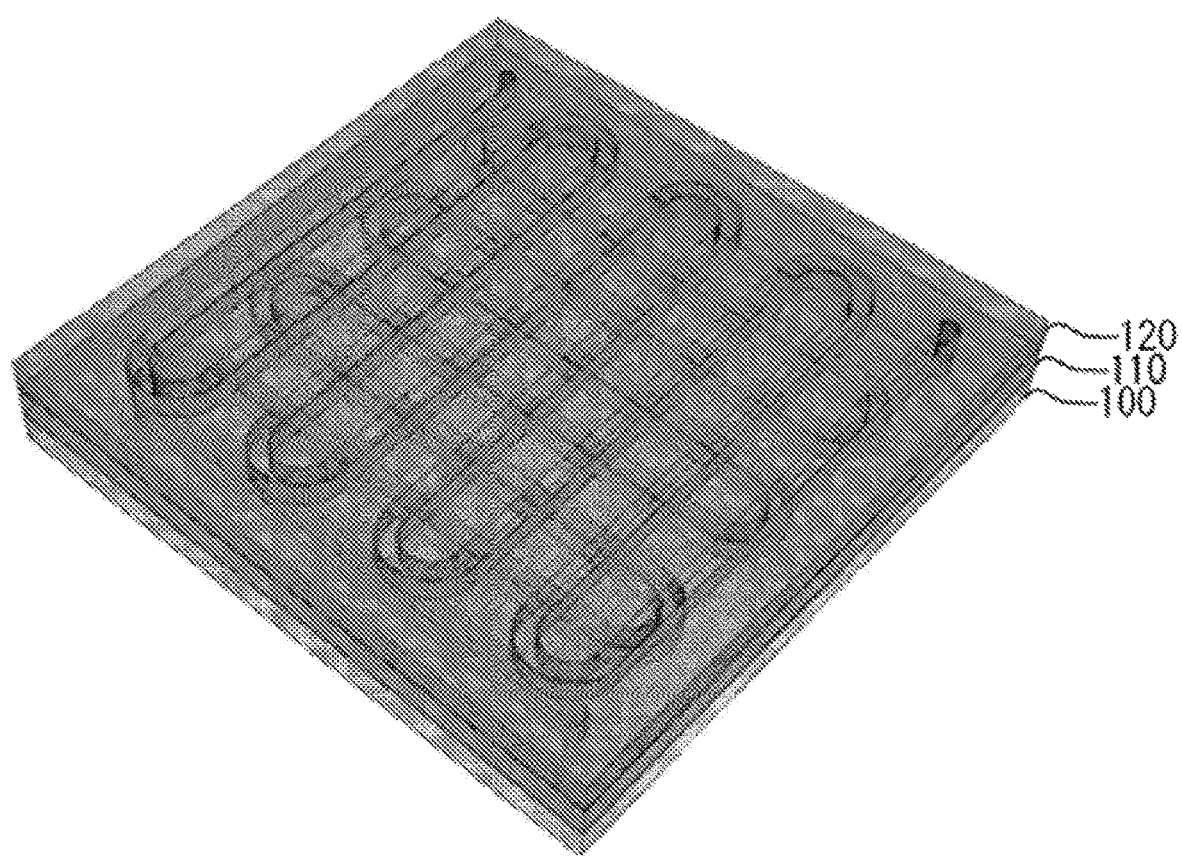
FIG. 3 is a perspective view schematically showing a state in which an interposer 100, an interposer 110, and an interposer 120 are stacked in a stacking direction.
Figure 4:
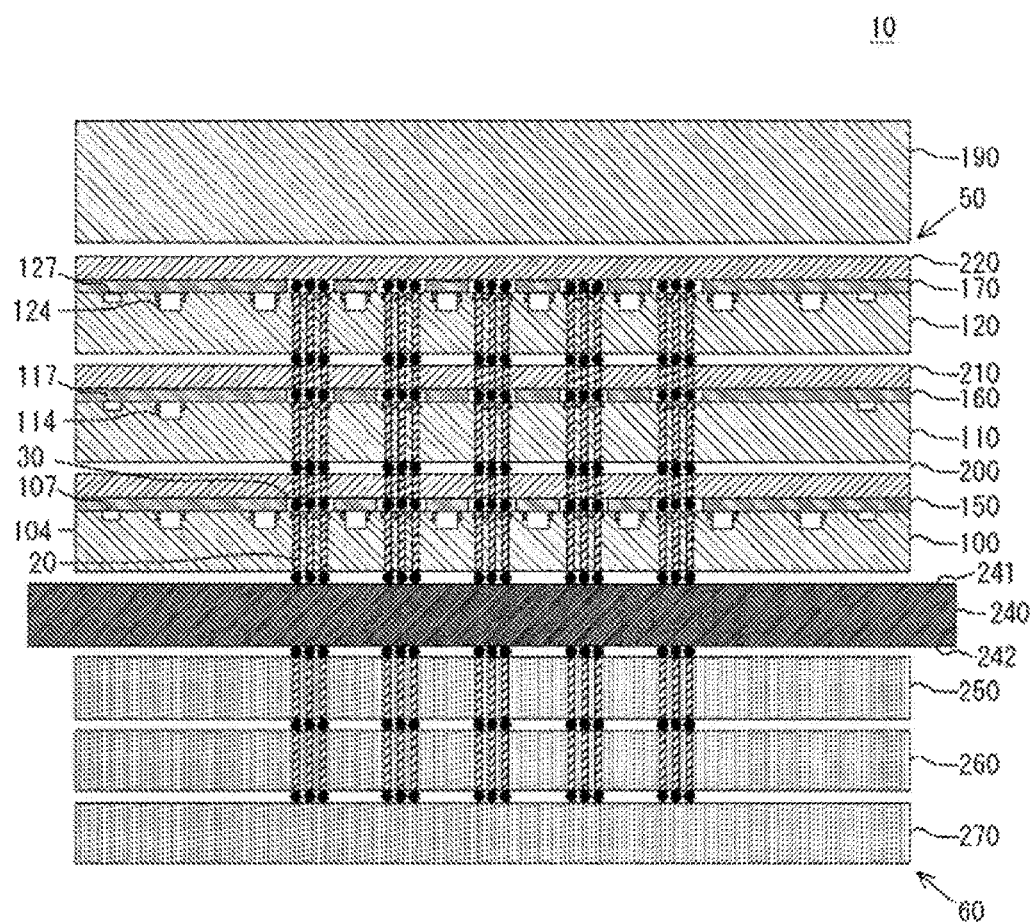
FIG. 4 schematically shows a cross section of the semiconductor device 10.
Figure 5:
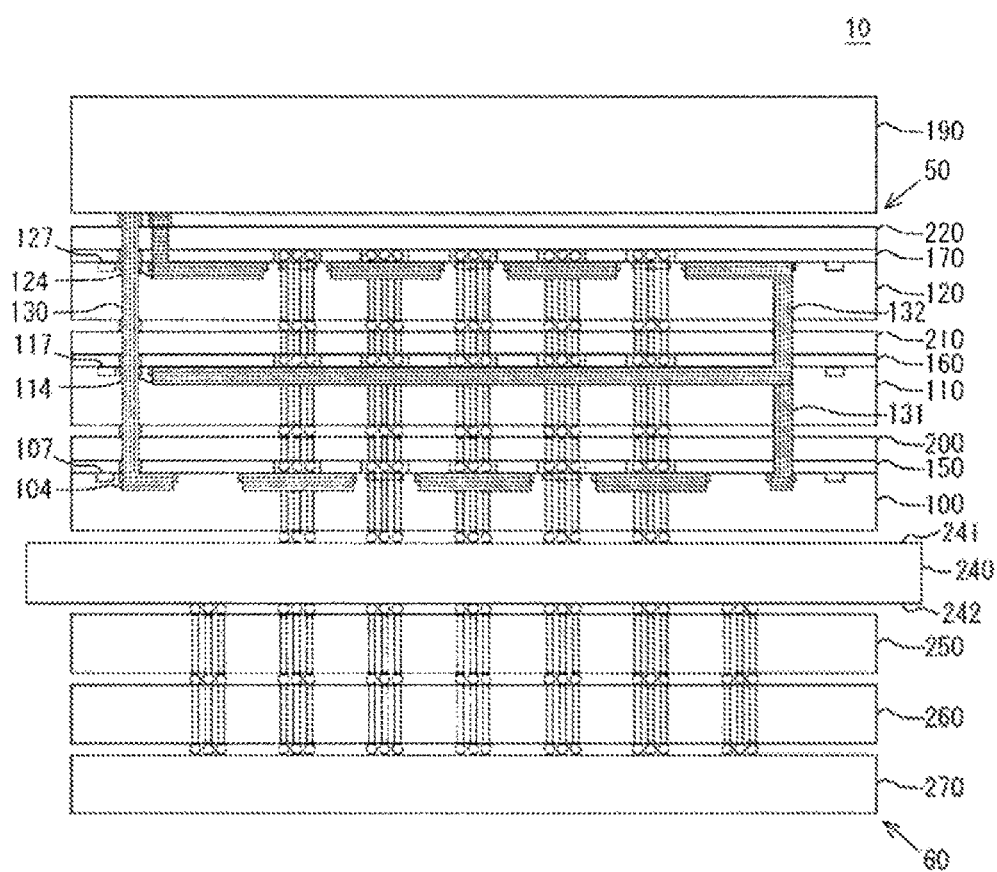
FIG. 5 is a perspective cross-sectional view showing a flow path of a coolant of a semiconductor chip.
Figure 6:
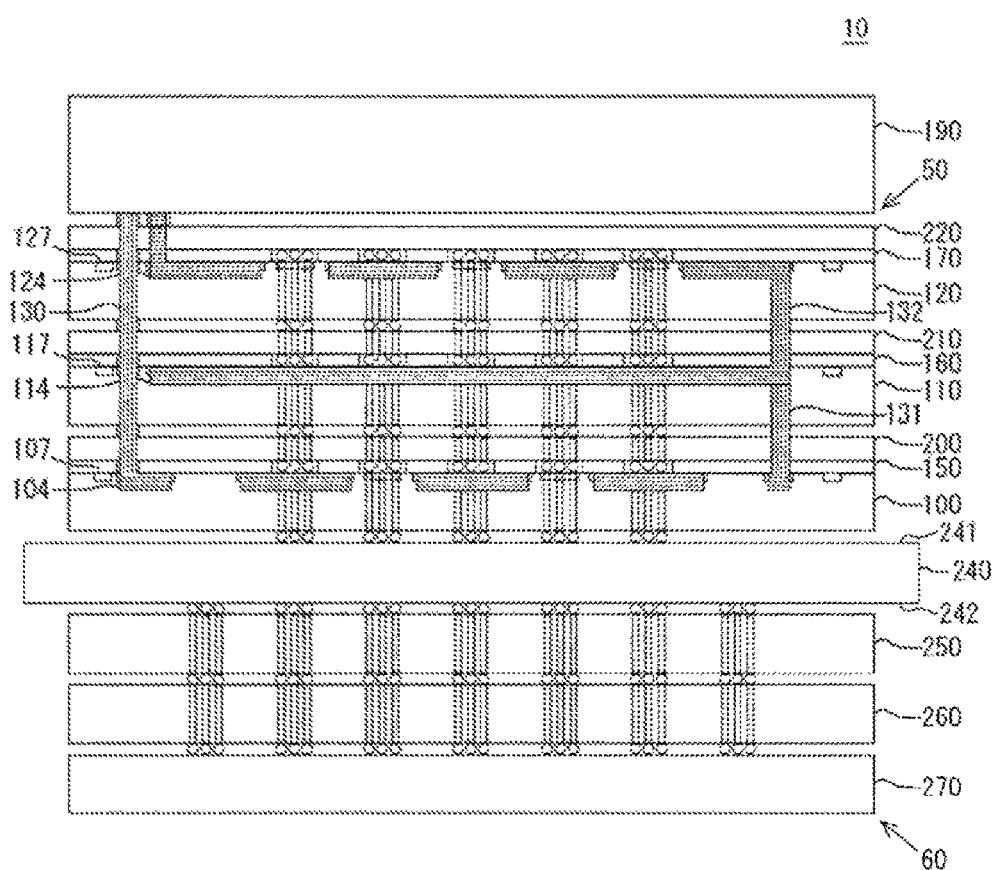
FIG. 6 shows a schematic perspective view of the interposer 100, the interposer 110, and the interposer 120.

FIG. 1 schematically shows an exploded perspective view of a substrate 240, a logic block 50, and a memory block 60 of a semiconductor device 10. FIG. 2 schematically shows a perspective view of the substrate 240, the logic block 50, and the memory block 60. In FIG. 1 and FIG. 2, some members forming the semiconductor device 10 are shown transparently. FIG. 3 is a perspective view schematically showing a state in which an interposer 100, an interposer 110, and an interposer 120 are stacked in a stacking direction. In FIG. 3, the interposer 100, the interposer 110, and the interposer 120 are shown transparently. FIG. 4 schematically shows a cross section of the semiconductor device 10. FIG. 5 is a perspective cross-sectional view showing a flow path of a coolant for cooling a semiconductor chip 200, a semiconductor chip 210, and a semiconductor chip 220. FIG. 6 shows a schematic perspective view of the interposer 100, the interposer 110, and the interposer 120. The semiconductor device 10 is included in a computer. The semiconductor device 10 is a three-dimensional stacked integrated circuit.

The semiconductor device 10 includes the substrate 240, the semiconductor chip 200, the semiconductor chip 210, the semiconductor chip 220, the interposer 100, the interposer 110, the interposer 120, an interposer 150, an interposer 160, an interposer 170, a memory chip 250, a memory chip 260, a memory chip 270, and a cooling device 190. In the drawings used for describing the embodiments, each member is not drawn on a uniform scale but may be drawn schematically for the purpose of clearly showing the members. In FIG. 1 to FIG. 3, the illustration of a groove 107, a groove 117, and a groove 127 are omitted.

The semiconductor chip 200, the semiconductor chip 210, the semiconductor chip 220, the interposer 100, the interposer 110, the interposer 120, the interposer 150, the interposer 160, and the interposer 170 are included in the logic block 50. The memory chip 250, the memory chip 260, and the memory chip 270 are included in the memory block 60. The memory block 60 may be an HBM. The cooling device 190 is provided on the upper part of the logic block 50.

The memory chip 250, the memory chip 260, and the memory chip 270 function as the main memory in the computer. The semiconductor chip 200, the semiconductor chip 210 and the semiconductor chip 220 may each include a cache memory therein.

The semiconductor chip 200, the semiconductor chip 210, and the semiconductor chip 220 are logic chips each including an integrated circuit. As an example, the semiconductor chip 200, the semiconductor chip 210, and the semiconductor chip 220 are a DSP, a GPU, and a CPU, respectively. The DSP may be a general-purpose DSP. The GPU may be a general-purpose GPU. It is noted that the semiconductor device 10 may include one or more CPU, one or more DSP, and one or more GPU. The semiconductor device 10 may include each of a plurality of CPUs, a plurality of DSPs, and a plurality of GPUs.

The semiconductor chip 200, the semiconductor chip 210, the semiconductor chip 220, the interposer 100, the interposer 110, the interposer 120, the interposer 150, the interposer 160, and the interposer 170 are mounted on a first main surface 241 of the substrate 240. The memory chip 250, the memory chip 260, and the memory chip 270 are mounted on a second main surface 242 of the substrate 240 opposite to the first main surface 241.

The semiconductor chip 200, the semiconductor chip 210, and the semiconductor chip 220 are stacked and mounted on the substrate 240. The semiconductor chip 200 is an integrated circuit disposed on the lowermost surface. The interposer 100 and the interposer 150 are provided between the substrate 240 and the semiconductor chip 200. The interposer 110 and the interposer 160 are provided between the semiconductor chip 200 and the semiconductor chip 210. The interposer 120 and the interposer 170 are provided between the semiconductor chip 210 and the semiconductor chip 220. The interposer 100, the interposer 150, the semiconductor chip 200, the interposer 110, the interposer 160, the semiconductor chip 210, the interposer 120, the interposer 170, and the semiconductor chip 220 are provided in this order from the main surface 241 side of the substrate 240. The semiconductor layers of each of the semiconductor chip 200, the semiconductor chip 210, and the semiconductor chip 220 and the interposer layer including the interposer 100, the interposer 110, and the interposer 120 are bonded or pressure-bonded with an adhesive including a die bonding agent or a bonding tape.

The semiconductor chip 200, the semiconductor chip 210, the semiconductor chip 220, and the memory block 60 are connected via vias 20 and micro bumps 30. The vias 20 are through vias. The vias 20 are provided in each of the interposer 100, the interposer 110, the interposer 120, the semiconductor chip 200, the semiconductor chip 210, the semiconductor chip 220, the memory chip 250, the memory chip 260, and the memory chip 270. The vias 20 are silicon through vias (TSVs). It is noted that in FIG. 1, the illustration of the vias 20 is omitted.

In this way, the semiconductor device 10 includes the substrate 240 provided with the memory block 60, and the three-dimensional array of the CPU, the general-purpose GPU, and the general-purpose DSP unit provided above the substrate 240. The substrate 240 is disposed between the CPU, the GPU, and the DSP and the HBM.

A groove 104 is formed in the interposer 100. A groove 114 is formed in the interposer 110. A groove 124 is formed in the interposer 120. The coolant from the cooling device 190 flows through the groove 104, the groove 114, and the groove 124. The interposer 150 and the semiconductor chip 200 are provided with vertical holes in the stacking direction, and a coolant passage 131 is formed by these vertical holes. The interposer 160, the semiconductor chip 210, and the interposer 120 are each provided with vertical holes in the stacking direction, and a coolant passage 132 is formed by these holes. Through holes are formed in each of the interposer 150, the semiconductor chip 200, the interposer 110, the interposer 160, the semiconductor chip 210, the interposer 120, the interposer 170, and the semiconductor chip 220, and a coolant passage 130 communicating from the groove 104 to the cooling device 190 is formed by these through holes. The coolant from the cooling device 190 is returned to the cooling device 190 through the groove 124, the coolant passage 132, the groove 114, the coolant passage 131, the groove 104, and the coolant passage 130.

The interposer 100 has a surface 102 facing the substrate 240, and a surface 101 opposite to the surface 102. The groove 104 and a groove 301 are formed in the interposer 100. Specifically, in the interposer 100, the groove 104 and the groove 301 are formed in the surface 101 facing the semiconductor chip 200. The groove 301 is provided along the groove 104 so as to surround the groove 104. The groove 104 and the groove 301 are formed by fine processing using laser processing, etching, NC processing, and the like.

The interposer 110 includes a surface 112 facing the semiconductor chip 200 and a surface 111 opposite to the surface 112. The interposer 110 is provided with the groove 114 and a groove 302. Specifically, in the interposer 110, the groove 114 and the groove 302 are formed in the surface 111 facing the semiconductor chip 210. The groove 114 and the groove 302 are formed by fine processing using laser processing, etching, NC processing, and the like.

The interposer 120 includes a surface 122 facing the semiconductor chip 210 and a surface 121 opposite to the surface 122. The groove 124 and a groove 303 are formed in the interposer 120. Specifically, in the interposer 120, the groove 124 and the groove 303 are formed in the surface 121 facing the semiconductor chip 220. The groove 114 and the groove 302 are formed by fine processing using laser processing, etching, NC processing, and the like.

The upper parts of the groove 104, the groove 114, the groove 124, the groove 301, the groove 302, and the groove 303 are each blocked by the interposer 150, the interposer 160, and the interposer 170. The interposer 150, the interposer 160, and the interposer 170 may include an opening only in the region where the via 20 penetrates.

The coolant flows through the groove 104, the groove 114, and the groove 124. Specifically, the coolant flows through the space formed by the groove 104 and the interposer 150. Similarly, the coolant flows through the space formed by the groove 114 and the interposer 160 and the space formed by the groove 124 and the interposer 170. The semiconductor chip 200, the semiconductor chip 210, and the semiconductor chip 220 are cooled by the coolant passing through the groove 104, the groove 114, and the groove 124. The coolant may be a liquid. The coolant may be, for example, an ammonia-based liquid. The coolant may be a perfluorocarbon. The coolant is preferably substantially non-corrosive.

The semiconductor chip 220 has a through hole penetrating through the semiconductor chip 220 in the stacking direction formed therein, and the coolant from the cooling device 190 flows through the through hole and is guided to one end 123 of the groove 124.

On the other end of the groove 124 of the interposer 120, a through hole 129 penetrating to the surface 122 is formed. In addition, the semiconductor chip 210 has a through hole penetrating through the semiconductor chip 210 in the stacking direction formed therein, and the coolant that flows through the groove 124 of the interposer 120 flows through the through hole 129 and the through hole of the semiconductor chip 210 and is guided to one end 113 of the groove 114 of the interposer 110.

On the other end of the groove 114 of the interposer 110, a through hole 119 penetrating to the surface 112 is formed. The semiconductor chip 200 has a through hole penetrating the semiconductor chip 200 in the stacking direction formed therein, and the coolant that flows through the groove 114 of the interposer 110 flows through the through hole 119 and the through hole of the semiconductor chip 200 and is guided to one end 103 of the groove 104 of the interposer 100.

The coolant guided to the one end 103 of the groove 104 of the interposer 100 flows through to the other end 109 inside the groove 104. In the interposer 110 and the interposer 120, a through hole 118 and a through hole 128 are each formed at positions corresponding to the other end 109 of the groove 104 of the interposer 100. In addition, also in each of the semiconductor chip 200, the semiconductor chip 210, and the semiconductor chip 220, through holes are formed at positions corresponding to the other end 109 of the groove 104. The coolant guided to the other end 109 of the interposer 100 is returned to the cooling device 190 through these through holes. Thereby, the movement paths of the coolant supplied from the cooling device 190 are formed by the groove 104, the groove 114, and the groove 124. That is, the groove 104, the groove 114, and the groove 124 provide the flow path of the coolant.

In this way, the movement paths of the coolant formed by the groove 104, the groove 114, and the groove 124 are provided on each of the interposer 100, the interposer 110, and the interposer 120. In addition, the plurality of movement paths of the coolant provided on each of the interposer 100, the interposer 110, and the interposer 120 are connected to one another. The coolant is supplied from the cooling device 190 to the groove 124, flows sequentially through the groove 124, the groove 114, and the groove 104, and returns to the cooling device 190. The cooling device 190 includes a heatsink and the like, and cools the coolant. In this way, the logic block 50 is cooled by the coolant circulating inside the logic block 50. It is noted that the coolant may be supplied from the cooling device 190 to the through hole 128, reaches the other end 109 of the groove 104 through the through hole 118, flow sequentially through the groove 104, the one end 103 of the groove 104, the through hole 119, the groove 114, the one end 113 of the groove 114, the through hole 129, the groove 124, and the one end 123 of the groove 124, and return to the cooling device 190.

In the semiconductor device 10 of the first embodiment, the movement paths of the coolant are formed by the grooves formed in each of the plurality of interposers including the interposer 100, the interposer 110, and the interposer 120, the spaces sandwiched between the adjacent interposers among the interposer 150, the interposer 160, and the interposer 170, and the holes penetrating through the semiconductor chip 200, the semiconductor chip 210, the semiconductor chip 220, the interposer 150, the interposer 110, the interposer 160, the interposer 120, and the interposer 170. The coolant flows through the space formed by the grooves formed in each of the plurality of interposers including the interposer 100, the interposer 110, and the interposer 120, the spaces sandwiched between the adjacent interposers among the interposer 150, the interposer 160, and the interposer 170, and the holes penetrating through the semiconductor chip 200, the semiconductor chip 210, the semiconductor chip 220, the interposer 150, the interposer 110, the interposer 160, the interposer 120, and the interposer 170. The interposer 100, the interposer 110, and the interposer 120 are examples of a first interposer, and the interposer 150, the interposer 160, and the interposer 170 are examples of a second interposer.

According to the semiconductor device 10, the semiconductor chip 200, the semiconductor chip 210, the semiconductor chip 220, the memory chip 250, the memory chip 260, and the memory chip 270 can be stacked in the vertical direction of the main surface 241 of the substrate 240. Therefore, the physical length of the bus from the logic block 50 to the memory block 60 can be shortened as compared with the case where the memory block 60 is disposed in parallel to the main surface 241 of the substrate 240. In addition, the routing of the bus inside of the interposer 100 can be simplified. Therefore, increase in power consumption can be suppressed and heat generation in the bus can be suppressed. In addition, since the physical length of the bus from the logic block 50 to the memory block 60 can be shortened, it may not be necessary to provide a high-order cache memory in the semiconductor chip 200, the semiconductor chip 210, and the semiconductor chip 220. Thereby, the snooping cost may be reduced in some cases. In addition, the error correction cost of the memory can be reduced. Thereby, the performance of the semiconductor device can be improved.

In addition, according to the semiconductor device 10, since the stacked semiconductor chip 200, semiconductor chip 210, and semiconductor chip 220 can be efficiently cooled, it is possible to three-dimensionally stack the semiconductor chips of the processing unit that generates heat. Therefore, according to the semiconductor device 10, the performance of the semiconductor device can be dramatically improved by the packaging without significantly innovating the processor technology.

The groove 301 is provided with an adhesive for bonding the interposer 100 and the interposer 150. Similarly, the groove 302 is provided with an adhesive for bonding the interposer 110 and the interposer 160. The groove 303 is provided with an adhesive for bonding the interposer 120 and the interposer 170. The coolant flowing through the groove 104, the groove 114, and the groove 124 can be prevented from flowing outside by the groove 301, the groove 302, and the groove 303.

A groove 107 surrounding the groove 104 is formed in the interposer 100. The groove 107 is provided with an adhesive for bonding the interposer 100 and the interposer 150. Similarly, a groove 117 surrounding the groove 114 is formed in the interposer 110, and the groove 117 is provided with an adhesive for bonding the interposer 110 and the interposer 160. In addition, a groove 127 surrounding the groove 124 is formed in the interposer 120, and the groove 127 is provided with an adhesive for bonding the interposer 120 and the interposer 170.

Figure 7:
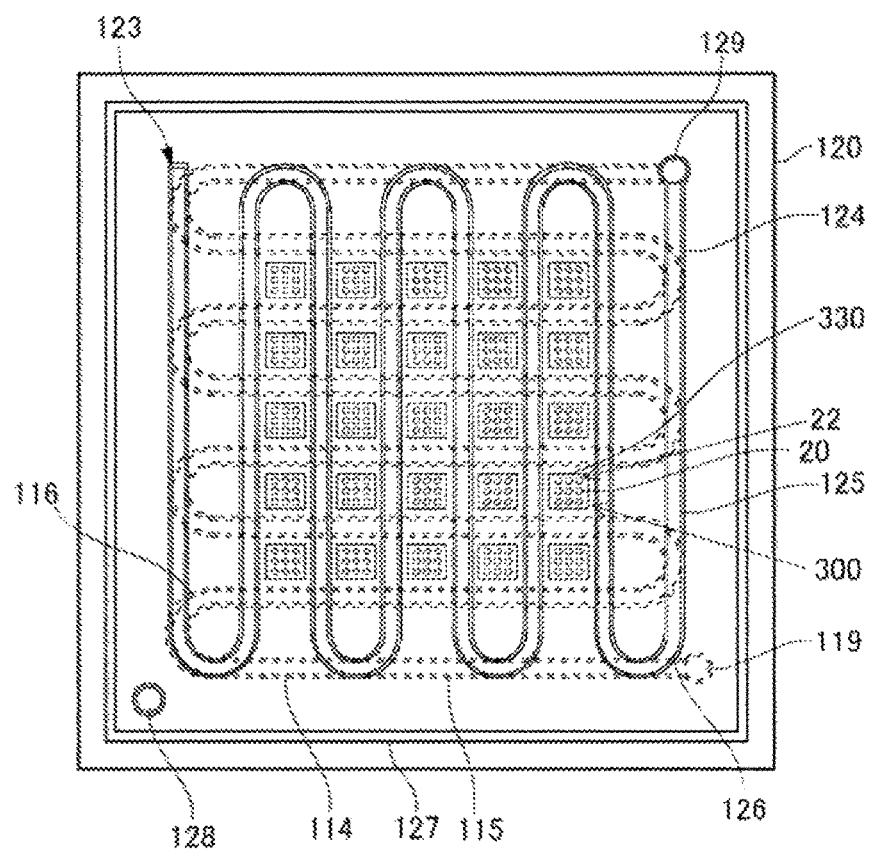
FIG. 7 schematically shows a plan view of the interposer 120 when viewed in the stacking direction.

FIG. 7 schematically shows a plan view of the interposer 120 when viewed in the stacking direction.

In the interposer 120, a surrounding groove 300 surrounding a via group 22 is formed around the via group 22 including a plurality of the vias 20. One via group 22, as an example, may include nine vias 20 arranged in three rows and three columns. The surrounding groove 300 is provided with an adhesive for bonding the interposer 120 and the interposer 170. Thereby, the gap between the interposer 120 and the semiconductor chip 220 can be blocked around the via 20 by the adhesive provided in the surrounding groove 300. Thereby, since the via 20 can be blocked, it is possible to reliably prevent the coolant flowing through the groove 124 from reaching the via 20. Similarly in the interposer 110, a plurality of surrounding grooves 300 surrounding each of the via groups are formed, and the surrounding groove 300 is provided with an adhesive for bonding the interposer 110 and the interposer 160. In addition, similarly in the interposer 100, a plurality of surrounding grooves 300 surrounding each of the via groups is formed, and the surrounding groove 300 is provided with an adhesive for bonding the interposer 100 and the interposer 150.

As shown in FIG. 6, a meandering groove is formed in each of the interposer 100, the interposer 110, and the interposer 120. As shown in FIG. 7, the groove 124 of the interposer 120 includes a plurality of linearly extending first groove portions 125 and curved second groove portions 126. The first groove portion 125 is a part of the groove 124 that extends in a direction substantially orthogonal to the direction connecting the one end 123 and the other end of the groove 124.

In FIG. 7, the groove 114 formed in the interposer 110 below the interposer 120 is shown by a dotted line. The groove 114 has a shape obtained by rotating the groove 124 by 90 degrees. The groove 114 of the interposer 110 includes a linearly extending first groove portion 115 and a curved second groove portion 116. The first groove portion 115 is a part of the groove 114 that extends in a direction substantially orthogonal to the direction connecting the one end 113 to the other end of the groove 114. The direction in which the first groove portion 125 extends and the direction in which the first groove portion 115 extends are substantially orthogonal to each other.

Similarly, the shape of the groove 104 formed in the interposer 100 is roughly the shape obtained by rotating the groove 114 formed in the interposer 110 by 90 degrees. In this way, in the interposer 100, the interposer 110, and the interposer 120, the grooves formed in the adjacent interposers are substantially orthogonal to each other between the layers. Therefore, when viewed in the stacking direction of the semiconductor chips, there is a region 330 surrounded by the groove 104, the groove 114, and the groove 124 of the interposers. When viewed in the stacking direction of the semiconductor chips, the region 330 does not interfere with any of the interposers included in the semiconductor device 10. Specifically, the region 330 is a quadrangular region surrounded by the first groove portion 125 and the first groove portion 115 which are orthogonal to each other. The via 20 is provided in the region 330. In this way, when viewed in the stacking direction of the semiconductor chip 200, the semiconductor chip 210, and the semiconductor chip 220, the through via 20 is provided at a position where it is not obstructed by the groove 104, the groove 114, and the groove 124. Therefore, the grooves through which the coolant flows do not interfere with the via 20.

In this way, the direction in which the plurality of first groove portions 125 formed in the interposer 120 extends differs from the direction in which the plurality of first groove portions 115 formed in the interposer 110 extends. The via 20 is provided at a position surrounded by the groove 104, the groove 114, and the groove 124 when viewed in the stacking direction of the semiconductor chips. Therefore, the grooves of the interposers do not interfere with the via 20.

It is noted that as described above, in the semiconductor device 10, the coolant that flows from the cooling device 190 to the groove 104 of the interposer 100 flows through the through hole 118 and the through hole 128 and is returned to the cooling device 190. As another mode, a flow path communicating with the groove 104 of the interposer 100 may be formed in the substrate 240, and through this flow path, the coolant may be taken out of the logic block 50 from a coolant outlet provided in the substrate 240 and returned to the cooling device 190. In addition, the semiconductor device 10 may be provided with a pump for circulating the coolant.

Figure 8:
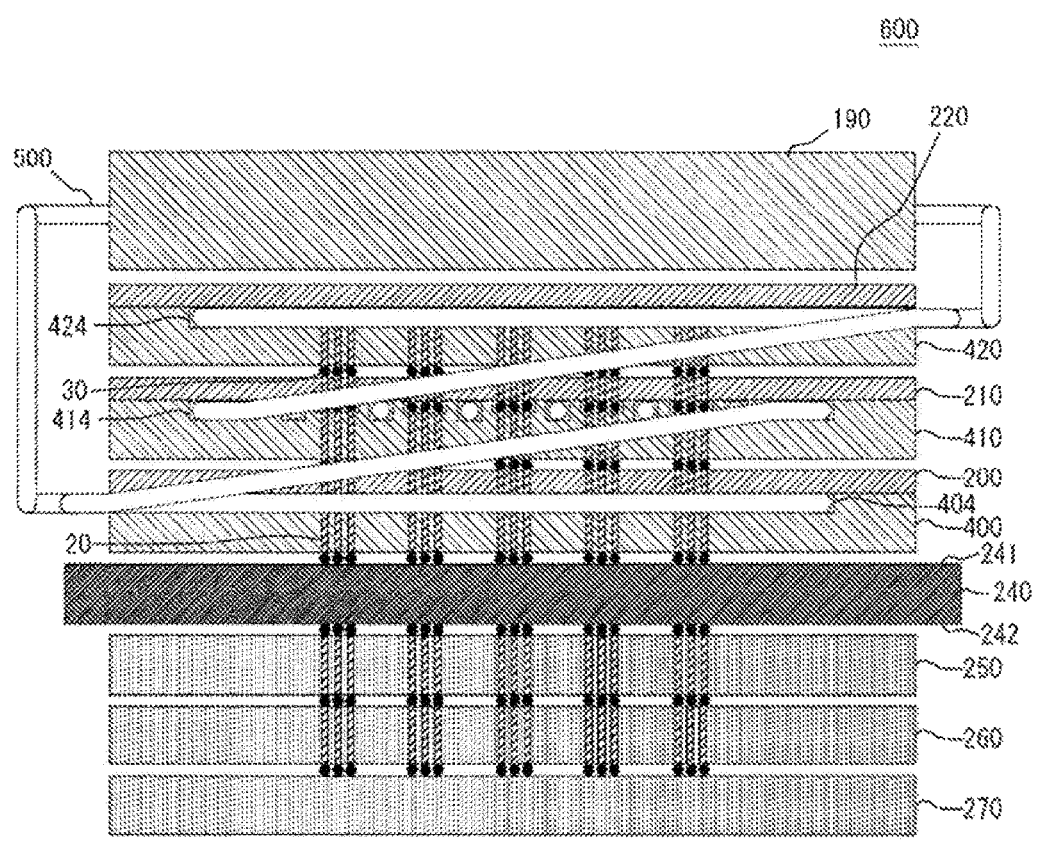
FIG. 8 schematically shows a cross-sectional view of a semiconductor device 600 according to a second embodiment together with a heat pipe 500.
Figure 9:
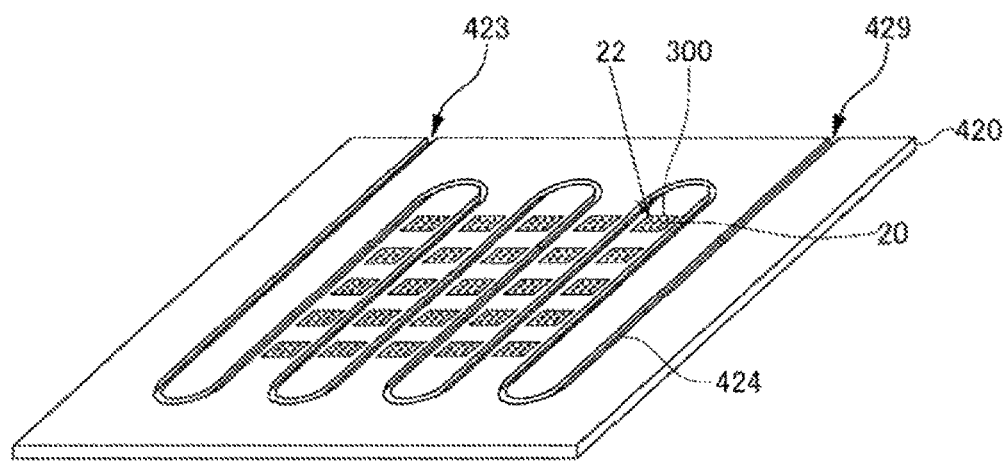
FIG. 9 shows a schematic perspective view of an interposer 420 forming the semiconductor device 600.
Figure 10:
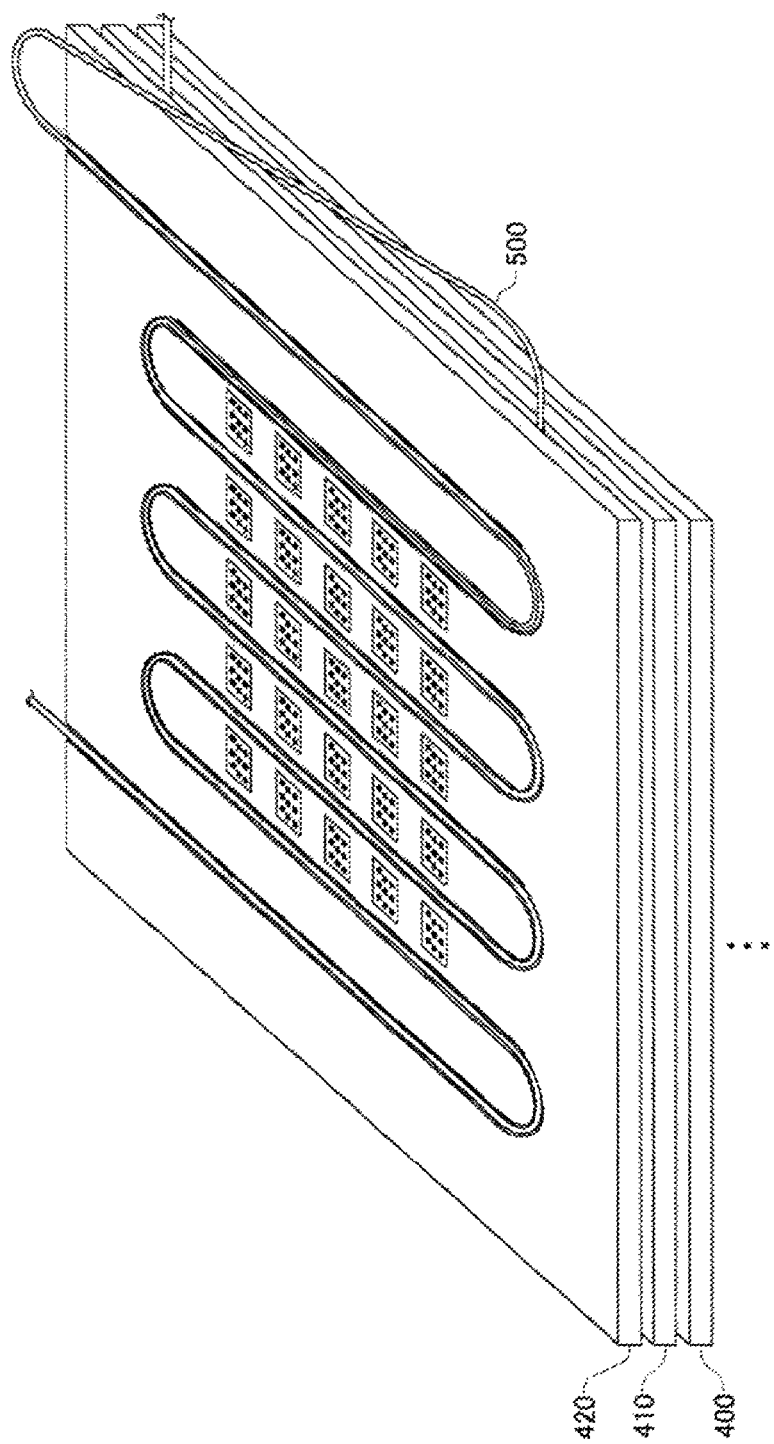
FIG. 10 is a schematic perspective view of a part of the semiconductor device 600 that includes an interposer 420, a semiconductor chip 220, and an interposer 410.

FIG. 8 schematically shows a cross-sectional view of a semiconductor device 600 according to a second embodiment together with a heat pipe 500. FIG. 9 shows a schematic perspective view of an interposer 420 forming the semiconductor device 600. FIG. 10 is a schematic perspective view of a part of the semiconductor device 600 that includes the interposer 420, the semiconductor chip 220, and an interposer 410.

The semiconductor device 600 has a configuration in which the heat pipe 500 is provided in grooves in place of the configuration in which the coolant flows through grooves formed in the interposers, and does not include the interposer 150, the interposer 160, and the interposer 170. In addition, an interposer 400, the interposer 410, and the interposer 420 of the semiconductor device 600 do not include the through hole 118, the through hole 119, the through hole 128, and the through hole 129, as well as the groove 107, the groove 117, and the groove 127. A groove 404, a groove 414, and a groove 424 respectively included in the interposer 400, the interposer 410, and the interposer 420 have different shapes from the groove 104, the groove 114, and the groove 124. The semiconductor device 600 according to the second embodiment is different from the semiconductor device 10 according to the first embodiment in these points. Regarding the semiconductor device 600 according to the second embodiment, differences from the semiconductor device 10 will be mainly described, and other descriptions may be omitted.

The interposer 420 is a member corresponding to the interposer 120. The interposer 410 is a member corresponding to the interposer 110. The interposer 400 is a member corresponding to the interposer 100.

As shown in FIG. 9, both ends of the groove 424 of the interposer 420 are located at outer edges of the interposer 420. Specifically, one end 423 and the other end 429 of the groove 424 of the interposer 420 are located at edges of the interposer 420. Similarly, both ends of the groove included in the interposer 410 are located at outer edges of the interposer 410.

As shown in FIG. 10, the heat pipe 500 inserted into the groove 424 of the interposer 420 extends outside the interposer 420 from the one end 423 and the other end 429. The heat pipe 500 extending from the other end 429 of the interposer 420 is provided in a state where it is inserted into the interposer 410 from one end of a groove formed in an edge part of the interposer 410. As shown in FIG. 6, the heat pipe 500 is disposed such that the directions of the plurality of parts of the heat pipe 500 that extend linearly are substantially orthogonal to each other between adjacent interposers.

In this way, in the semiconductor device 600 according to the second embodiment, the movement path of the coolant is provided by the heat pipe 500 disposed in the grooves formed in the interposers. The heat pipe 500 connects the plurality of interposers outside of the semiconductor device 600. It is noted that in the case where the heat pipe 500 is provided in the grooves as in the second embodiment, it is necessary that the heat pipe 500 and the semiconductor chips are surely in contact with each other. Therefore, it is preferable to strongly directly bond the lower surface of the semiconductor chip to the upper surface of the adjacent interposer.

As shown in the semiconductor device 600, the movement path of the coolant may be formed by a heat pipe running through grooves formed in each of the plurality of interposers and grooves sandwiched between the integrated circuits. Regarding the movement path of the coolant, the heat pipe disposed in the grooves may pass through the outside of the semiconductor device to become the path of the heat pipe of the next layer and allow the coolant to flow.

Figure 11:
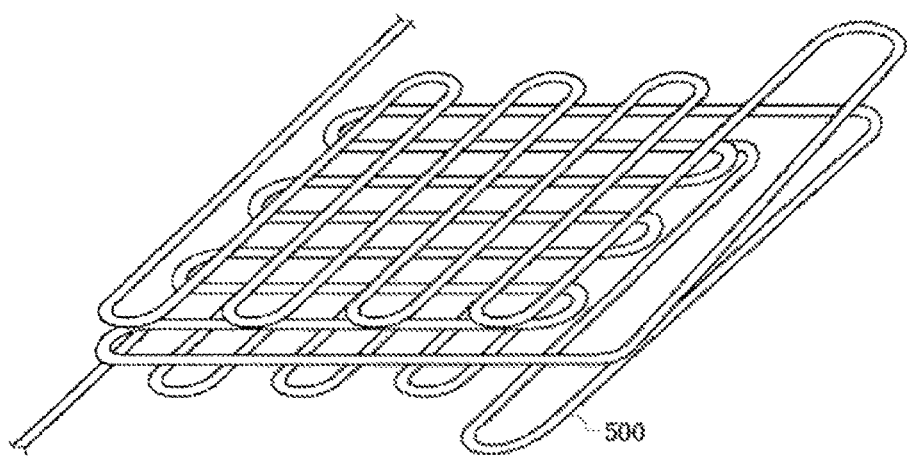
FIG. 11 shows a schematic perspective view showing the arrangement structure of the heat pipe.

FIG. 11 shows a schematic perspective view showing the arrangement structure of the heat pipe. Similarly to the heat pipe 500 shown in FIG. 8 to FIG. 10, a heat pipe 540 shown in FIG. 11 runs inside the three layers of interposers and is provided such that one coolant flow path is formed through the three layers of interposers.

Figure 12:
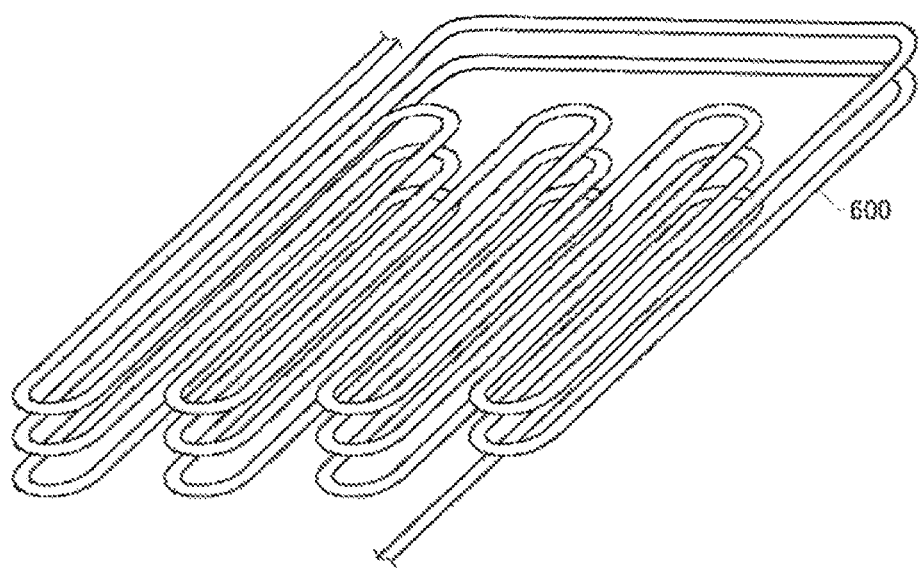
FIG. 12 is a perspective view showing a modified example of the heat pipe arrangement structure.

FIG. 12 is a perspective view showing a modified example of the heat pipe arrangement structure. The heat pipe 500 described above is disposed such that the directions of the plurality of parts of the heat pipe 500 that extend linearly are substantially orthogonal to each other between adjacent interposers. On the other hand, in a heat pipe 550 according to the present modified example, the heat pipe parts disposed in each interposer have the same shape, and the heat pipe parts provided in each interposer are disposed parallel to each other.

In the heat pipe 550, when viewed in the stacking direction of the semiconductor chip 200, the semiconductor chip 210, and the semiconductor chip 220, a rectangular region whose long sides are the straight sides and which does not overlap with any of the heat pipe parts is formed. If the via 20 is formed in the rectangular region, the heat pipe and the via 20 do not interfere with each other. In this way, in the case where the coolant flow paths are provided in parallel between the interposers, the via 20 may be formed in the rectangular region that does not overlap with any of the coolant flow paths in the stacking direction.

It is noted that the heat pipe 500 and the heat pipe 550 may be inserted into a gap of the interposers and disposed in the interposers. In addition, the interposers may be stacked in a state where heat pipes are disposed in the grooves of the interposers in advance, and after the interposers are stacked, the heat pipes of the adjacent interposers may be connected to each other outside of the semiconductor device 600.

Figure 13:
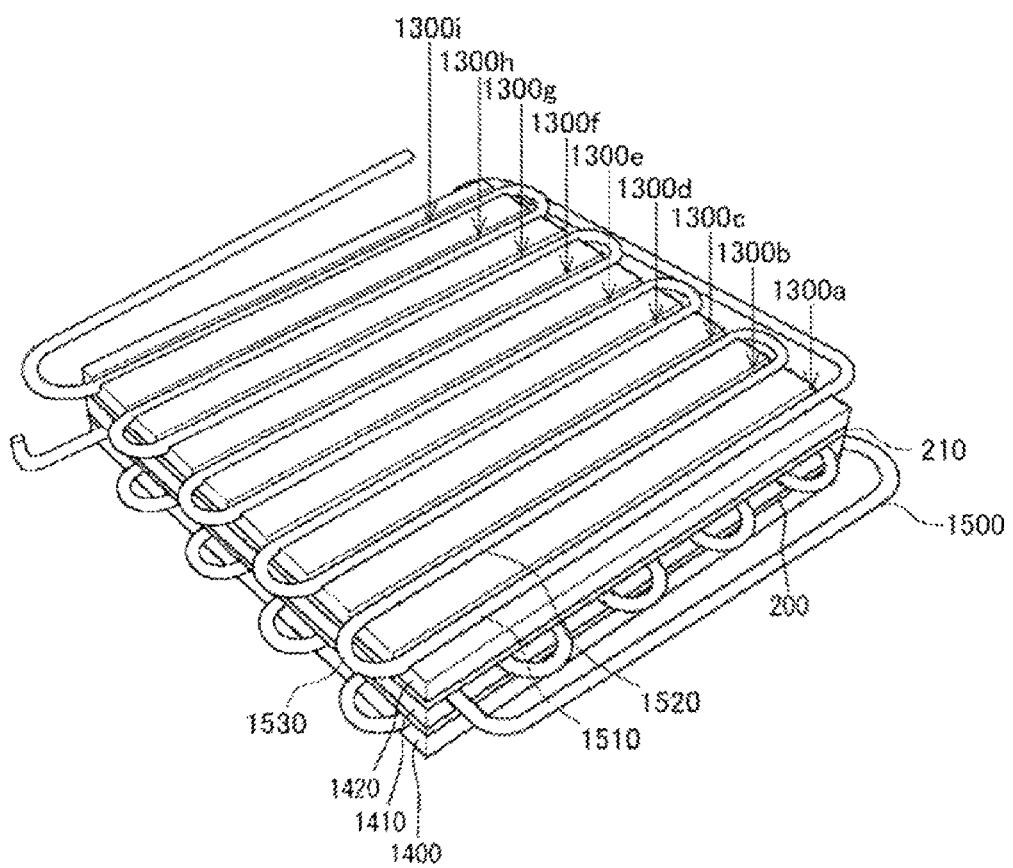
FIG. 13 shows an interposer 1100, an interposer 1110, an interposer 1120, and a heat pipe 1500 in the modified example of the semiconductor device 600.
Figure 14:
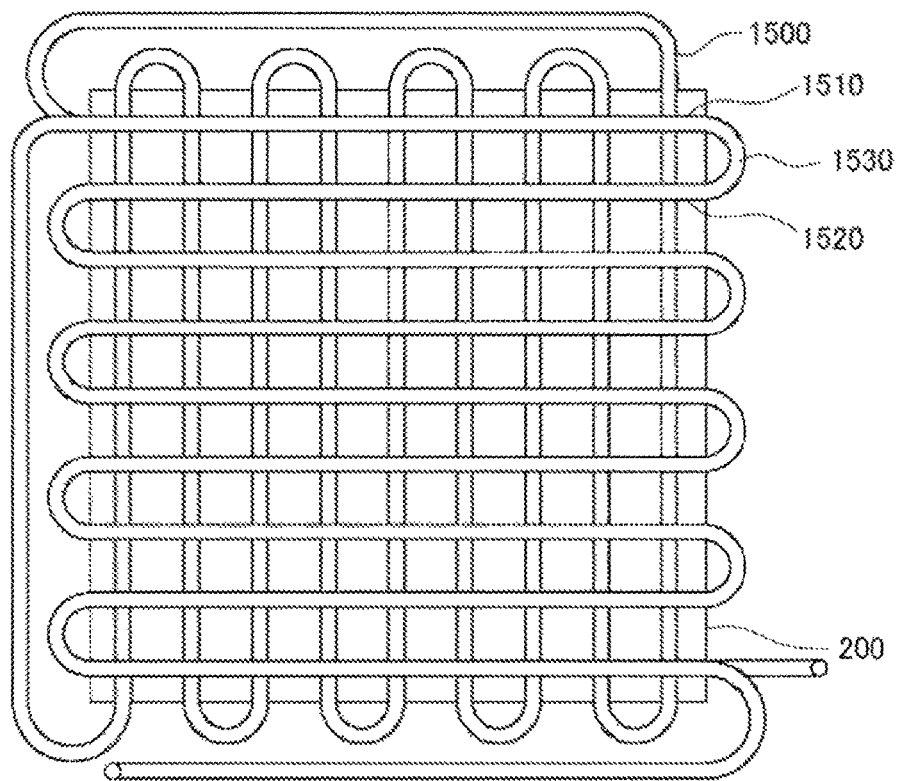
FIG. 14 is a front view showing the arrangement of the interposer 1100, the interposer 1110, the interposer 1120, the heat pipe 1500, and a semiconductor chip 200 in the modified example.

FIG. 13 is a perspective view showing an interposer 1100, an interposer 1110, an interposer 1120, and a heat pipe 1500 in a modified example of the semiconductor device 600. FIG. 14 is a front view showing the arrangement of the interposer 1100, the interposer 1110, the interposer 1120, the heat pipe 1500, and the semiconductor chip 200 in the modified example. In this modified example, the interposer 1100, the interposer 1110, and the interposer 1120 include a plurality of grooves formed to the respective edges. In addition, the heat pipe 1500 includes curved parts outside of the interposers. This modified example differs from the semiconductor device 600 in these points. Here, the differences from the semiconductor device 600 will be mainly described, and other descriptions may be omitted.

As shown in FIG. 13, the interposer 1120 includes a plurality of grooves 1300a, 1300b, 1300c, 1300d, 1300e, 1300f, 1300g, 1300h, and 1300i that extend linearly. It is noted that the grooves 1300a, 1300b, 1300c, 1300d, 1300e, 1300f, 1300g, 1300h, and 1300i may be collectively referred to as the grooves 1300. The grooves 1300 are formed from one edge of the interposer 1120 to the other edge. The grooves 1300 extend linearly and are provided substantially parallel to each other. The heat pipe 1500 running through the inside of the interposer 1120 includes a linear part 1510 disposed in the groove 1300a, a linear part 1520 disposed in the groove 1300b, and a curved part 1530 that curves outside of the interposer 1120 and connects the linear part 1510 and the linear part 1520. Similarly in the other grooves 1300, the heat pipe 1500 has a curved part connecting between the adjacent grooves outside of the interposer. The same applies to the other interposer 1110 and interposer 1100. Since the curved parts of the heat pipe can be provided outside of the interposer and the semiconductor chip, the degree of freedom of curvature of the heat pipe can be increased.

In the semiconductor described above, there may be a temperature detection circuit for detecting the temperature of the coolant and a heater for returning the coolant from a radiator in a liquid phase after cooling to a gas phase by adjusting it to precisely the boiling point, before it recirculates from the lower surface of a three-dimensional semiconductor. By including these temperature adjustment mechanisms of the coolant, the coolant can be recirculated so that the coolant inside of the semiconductor does not boil and the semiconductor does not vibrate due to a cavitation effect or the like.

Figure 15:
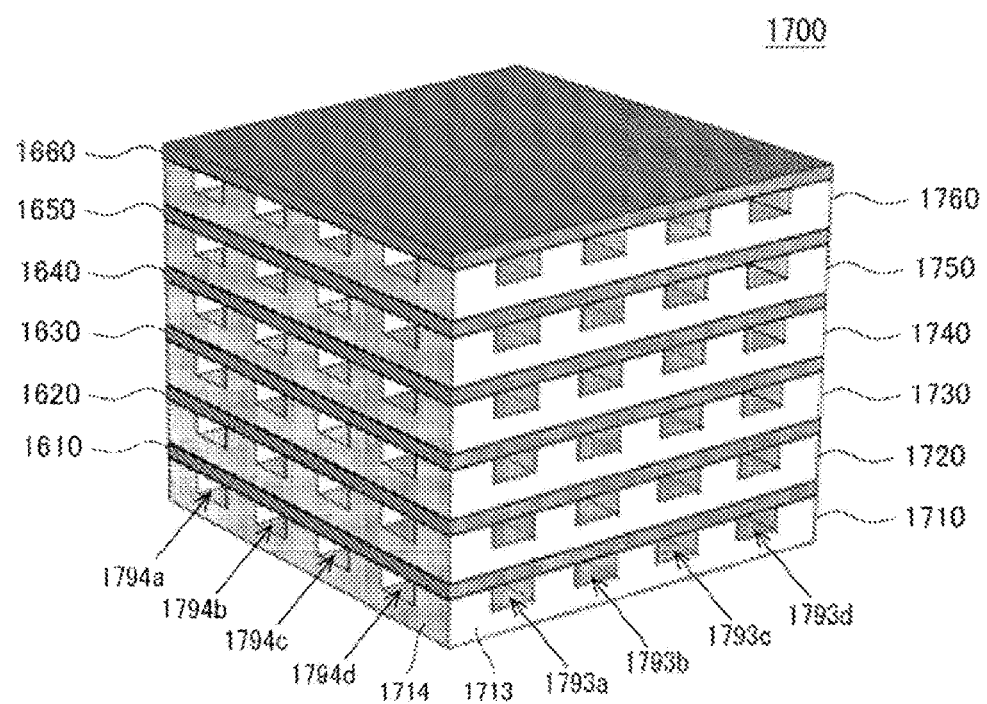
FIG. 15 schematically shows a perspective view of a semiconductor device 1700 according to another embodiment.
Figure 16:
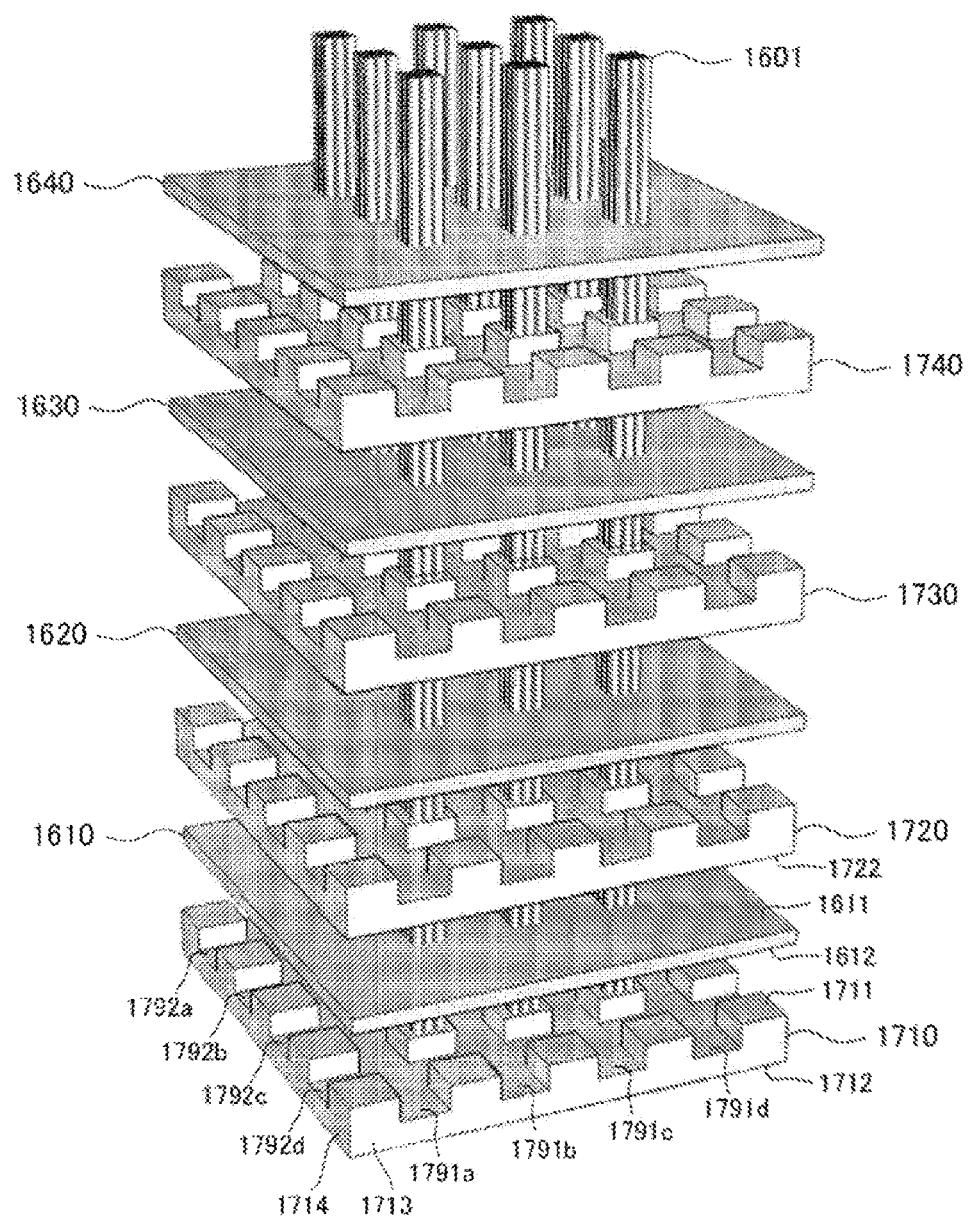
FIG. 16 schematically shows an exploded perspective view of the semiconductor device 1700.

FIG. 15 schematically shows a perspective view of a semiconductor device 1700 according to another embodiment. FIG. 16 schematically shows an exploded perspective view of the semiconductor device 1700.

As shown in FIG. 15, the semiconductor device 1700 includes a semiconductor chip 1610, a semiconductor chip 1620, a semiconductor chip 1630, a semiconductor chip 1640, a semiconductor chip 1650, a semiconductor chip 1660, an interposer 1710, an interposer 1720, an interposer 1730, an interposer 1740, an interposer 1750, and an interposer 1760.

The semiconductor chip 1610, the semiconductor chip 1620, the semiconductor chip 1630, the semiconductor chip 1640, the semiconductor chip 1650, and the semiconductor chip 1660 are members corresponding to the semiconductor chip 200 described above. The semiconductor chip 1610, the semiconductor chip 1620, the semiconductor chip 1630, the semiconductor chip 1640, the semiconductor chip 1650, and the semiconductor chip 1660 are each a DSP, a GPU, a CPU, and the like. The interposer 1710, the interposer 1720, the interposer 1730, the interposer 1740, the interposer 1750, and the interposer 1760 are formed by a copper, aluminum, or silicon substrate.

In the semiconductor device 1700, the interposer 1710, the semiconductor chip 1610, the interposer 1720, the semiconductor chip 1620, the interposer 1730, the semiconductor chip 1630, the interposer 1740, the semiconductor chip 1640, the interposer 1750, the semiconductor chip 1650, the interposer 1760, and the semiconductor chip 1660 are stacked in this order from bottom to top. That is, the interposer 1710 is provided below the semiconductor chip 1610. The interposer 1720 is provided between the semiconductor chip 1610 and the semiconductor chip 1620. The interposer 1730 is provided between the semiconductor chip 1620 and the semiconductor chip 1630. The interposer 1740 is provided between the semiconductor chip 1630 and the semiconductor chip 1640. The interposer 1750 is provided between the semiconductor chip 1640 and the semiconductor chip 1650. The interposer 1760 is provided between the semiconductor chip 1650 and the semiconductor chip 1660.

Specifically, a lower surface 1612 of the semiconductor chip 1610 is bonded or pressure-bonded to an upper surface 1711 of the interposer 1710. An upper surface 1611 of the semiconductor chip 1610 is bonded or pressure-bonded to a lower surface 1722 of the interposer 1720. Similarly, the respective lower surfaces of the semiconductor chip 1620, the semiconductor chip 1630, the semiconductor chip 1640, the semiconductor chip 1650, and the semiconductor chip 1660 are bonded or pressure-bonded to the upper surface of a lower interposer among the interposer 1720, the interposer 1730, the interposer 1740, the interposer 1750, and the interposer 1760, and the respective upper surfaces are bonded or pressure-bonded to the lower surface of an upper interposer among the interposer 1730, the interposer 1740, the interposer 1750, and the interposer 1760.

Similarly to the semiconductor device 10 shown in FIG. 4 and the like, a plurality of TSVs and a plurality of micro bumps are formed in the semiconductor chip 1610, the semiconductor chip 1620, the semiconductor chip 1630, the semiconductor chip 1640, the semiconductor chip 1650, and the semiconductor chip 1660. For example, the semiconductor chip 1660 is connected to the interposer 1760 via the plurality of TSVs and the plurality of micro bumps, and the interposer 1760 is connected to the semiconductor chip 1650 via the plurality of TSVs and the plurality of micro bumps. Similarly, the semiconductor chip 1610, the semiconductor chip 1620, the semiconductor chip 1630, the semiconductor chip 1640, and the semiconductor chip 1650 are connected to a lower interposer among the interposer 1720, the interposer 1730, the interposer 1740, the interposer 1750, and the interposer 1760 via the plurality of TSVs and the plurality of micro bumps. It is noted that in the exploded perspective view of FIG. 16, a via group 1601 including the plurality of TSVs schematically shows the positions of the TSVs, and the illustration of the micro bumps are omitted in FIG. 16.

A plurality of grooves 1791 including a groove 1791a, a groove 1791b, a groove 1791c, and a groove 1791d and a plurality of grooves 1792 including a groove 1792a, a groove 1792b, a groove 1792c, and a groove 1792d are formed in the upper surface 1711 of the interposer 1710. The grooves 1791 and the grooves 1792 may be formed by fine processing using etching, engraving by NC or laser processing, press processing, or the like.

The grooves 1791 extend from a side surface 1713 substantially orthogonal to the upper surface 1711 to the opposite side surface and penetrates therethrough. In this way, a plurality of openings 1793 including an opening 1793a, an opening 1793b, an opening 1793c, and an opening 1793d are formed in the side surface 1713. The grooves 1792 extend from a side surface 1714 substantially orthogonal to the upper surface 1711 and the side surface 1713 to the opposite side surface and penetrates therethrough. In this way, a plurality of openings 1794 including an opening 1794a, an opening 1794b, an opening 1794c, and an opening 1794d are formed in the side surface 1714. It is noted that the side surface 1713 and the side surface 1714 form a part of the outer surface of the semiconductor device 1700.

The groove 1791a, the groove 1791b, the groove 1791c, and the groove 1791d extend substantially parallel to each other. The groove 1792a, the groove 1792b, the groove 1792c, and the groove 1792d extend substantially parallel to each other. The direction in which the grooves 1791 extend and the direction in which the grooves 1792 extend are substantially orthogonal to each other. Each of the grooves 1791 intersects with each of the grooves 1792. The via group 1601 penetrates in the stacking direction in a region of the upper surface 1711 where the grooves 1791 and the grooves 1792 are not formed, specifically, a rectangular region surrounded by the grooves 1791 and the grooves 1792.

The interposer 1720, the interposer 1730, the interposer 1740, the interposer 1750, and the interposer 1760 have the same structure as the interposer 1710. The interposer 1720, the interposer 1730, the interposer 1740, the interposer 1750, and the interposer 1760 are stacked such that the grooves 1791 and the grooves 1792 are aligned in the stacking direction. The via group 1601 is formed across the stacking direction in a region of the interposer 1720, the interposer 1730, the interposer 1740, the interposer 1750, and the interposer 1760 where the grooves 1791 and the grooves 1792 are not formed.

In this way, the interposer 1710, the interposer 1720, the interposer 1730, the interposer 1740, the interposer 1750, and the interposer 1760 each include the plurality of grooves 1791 or the grooves 1792. In addition, the interposer 1710, the interposer 1720, the interposer 1730, the interposer 1740, the interposer 1750, and the interposer 1760 each include the plurality of openings 1793 or the openings 1794 that are formed in the side surface 1713 or the side surface 1714 that differs from the upper surface 1711 having the grooves 1791 or the grooves 1792 formed thereon, and that communicate with the grooves 1791 or the grooves 1792 formed in the upper surface 1711.

The grooves 1791 and the grooves 1792 form the movement path of the coolant. The coolant flows into the grooves 1791 and/or the grooves 1792 from outside the semiconductor device 1700 through the openings 1793 and/or the openings 1794, and flows outside of the semiconductor device 1700 from the grooves 1791 and/or the grooves 1792 through the openings 1793 and/or the openings 1794. As the coolant, a liquid insulating coolant having high insulating properties such as a fluorine compound can be applied. According to the semiconductor device 1700, the semiconductor chip 1610, the semiconductor chip 1620, the semiconductor chip 1630, the semiconductor chip 1640, the semiconductor chip 1650, and the semiconductor chip 1660 can be cooled from the lower surfaces.

Figure 17:
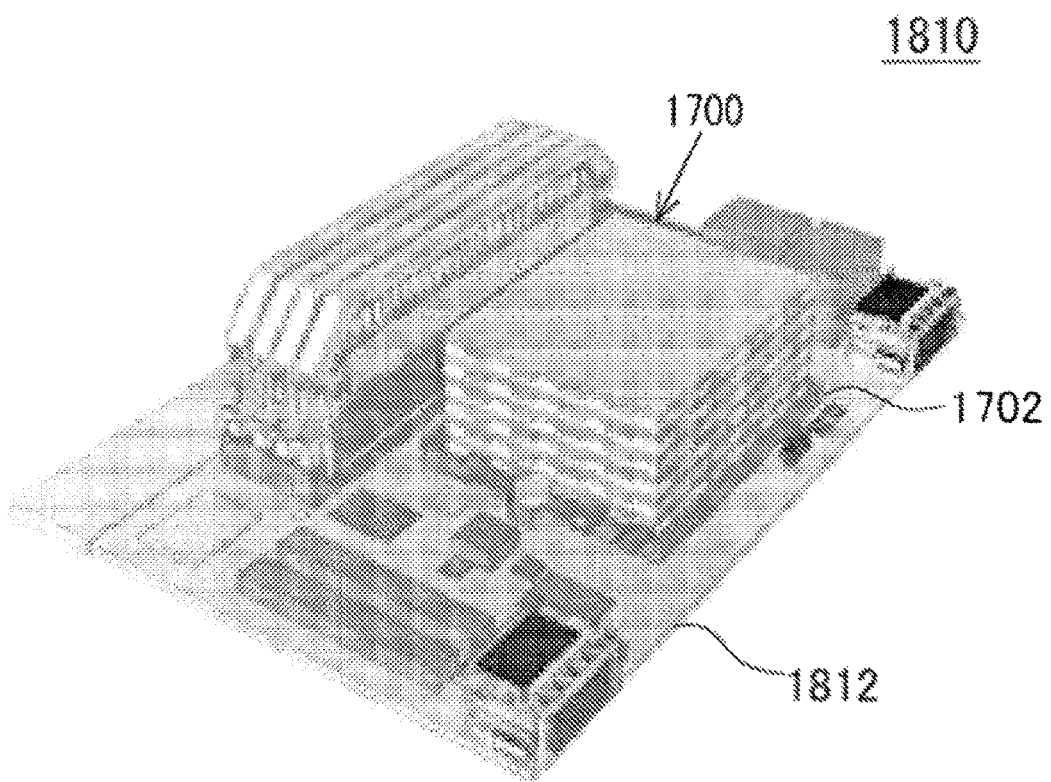
FIG. 17 schematically shows a perspective view of a computer 1810 including the semiconductor device 1700.

FIG. 17 schematically shows a perspective view of a computer 1810 including the semiconductor device 1700. As shown in FIG. 17, the semiconductor device 1700 is mounted on a substrate 1702. The substrate 1702 is mounted on a main substrate 1812. In addition to the semiconductor device 1700, the main substrate 1812 is mounted with various types of IC chips, electronic circuits such as a power supply circuit and a memory, electronic elements such as a resistor and a capacitor, and electronic components such as a connector for attaching an external device such as an external storage.

Figure 18:
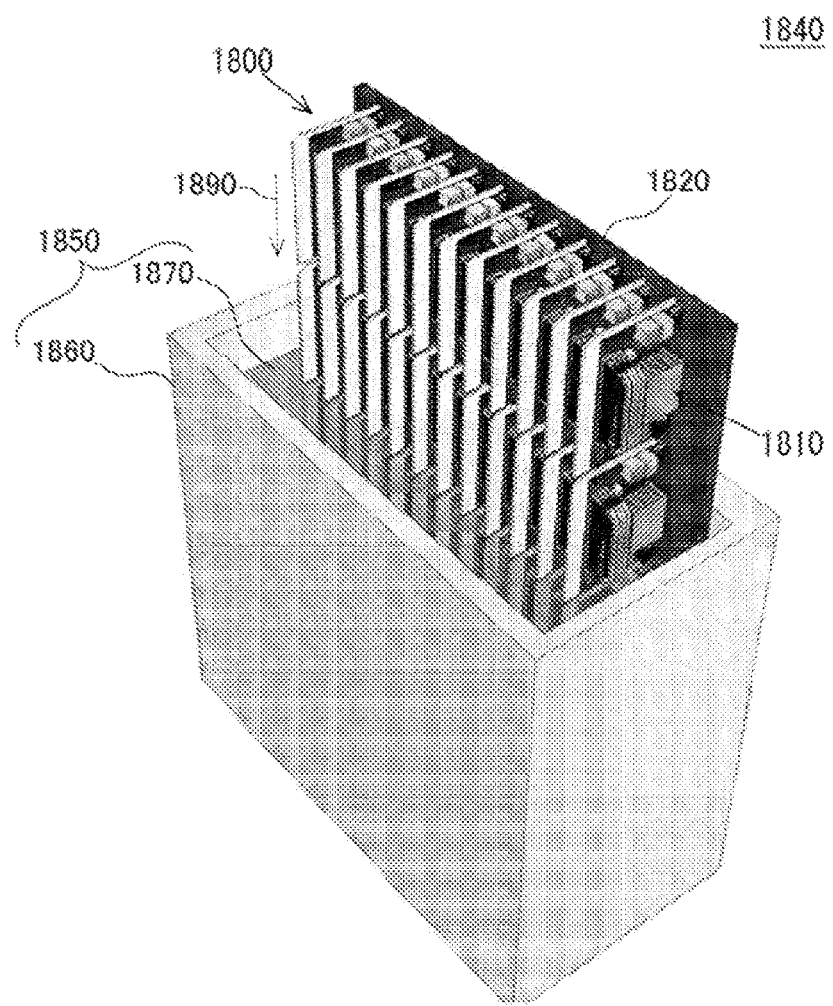
FIG. 18 schematically shows a computer system 1840 including a computer unit 1800 and a cooling system 1850.

FIG. 18 schematically shows a computer system 1840 including a computer unit 1800 and a cooling system 1850. The computer unit 1800 includes a plurality of computers having the same configuration as the computer 1810 and a mount 1820 to which the plurality of computers are attached. The cooling system 1850 includes an immersion tank 1860 and a coolant 1870. The computer unit 1800 is immersed in the immersion tank 1860 filled with the coolant 1870. An arrow 1890 in FIG. 18 shows the direction in which the computer unit 1800 is immersed in the immersion tank 1860.

In the computer unit 1800, the grooves 1791 and the grooves 1792 of the semiconductor device 1700 are fluidly connected to each other by the internal space of the immersion tank 1860 filled with the coolant 1870. Therefore, the coolant 1870 inside of the immersion tank 1860 flows into the grooves 1791 and/or the grooves 1792 from outside the semiconductor device 1700 through the openings 1793 and/or the openings 1794 of the semiconductor device 1700, and flows outside of the semiconductor device 1700 from the grooves 1791 and/or the grooves 1792 through the openings 1793 and/or the openings 1794.

The coolant 1870 may flow in the immersion tank 1860 by natural convection generated by heat generated in the computer unit 1800. The coolant 1870 may also flow in the immersion tank 1860 by a pump. In the semiconductor device 1700, openings including the openings 1793 and the openings 1794 are formed in the four sides of the semiconductor device 1700 including the side surface 1713 and the side surface 1714, and each of the openings communicate to any of the grooves among the grooves 1791 and the grooves 1792. Therefore, regardless of the flowing direction of the coolant 1870 in the immersion tank 1860, the coolant 1870 can flow into the semiconductor device 1700 from any of the openings and flow out of the semiconductor device 1700 through any of the openings.

According to the semiconductor device 1700 described with reference to FIG. 15 to FIG. 18, since the grooves 1791 and the grooves 1792 can be applied as the movement path of the immersion coolant, it is not necessary to use a cooling pipe such as a heat pipe. In addition, it is not necessary to form a coolant path in the stacking direction. In addition, it is not necessary to provide the semiconductor device 1700 with a pump for moving the coolant in the semiconductor device 1700.

In the semiconductor device described above, a mode may be adopted in which the semiconductor chips and the interposers are bonded by pressure-bonding without using an adhesive. It is noted that from the viewpoint of yield, it is often preferable to form the grooves that serve as the movement path of the coolant in the interposers. However, in the semiconductor device described above, a mode may be adopted in which grooves serving as the movement path of the coolant is formed on the surface of each of the semiconductor chips opposite to the surface on which the circuit is mounted.

As explained above, provided is a three-dimensional stacked integrated circuit that creates grooves that pass the coolant through copper, aluminum plate, or silicon substrates without using a cooling pipe, connects the upper and lower layers through vertical holes, and configure a pipeline. In addition, it creates vertical and horizontal grooves that pass the coolant through copper, aluminum plate, or silicon substrates without using a cooling pipe, and by extending the grooves to the edges of the substrates and opening the grooves, it cools the inside of the semiconductor by immersing and releasing the coolant layer-by-layer from the peripheral surfaces of the semiconductors by immersion, without configuring a pipeline for allowing the coolant to flow in the layer direction.

The vertical and horizontal grooves avoid the parts that configure TSVs. By allowing the coolant to flow outside in each layer through grooves provided to the edges of the interposers, a three-dimensional stacked integral circuit in which the configuration of the cooling system is simplified is provided. When a copper or aluminum layer is inserted as the material for forming a groove, it is necessary to fill the hole of the copper or aluminum plate in the part configuring the vertical TSV with a silicon substrate.

Other than a CPU, a GPGPU, and a central processing unit of virtual currency mining, an HBM is also mounted on the three-dimensional semiconductor of this cooling method, or memory layers are inserted between the layers. In the case where the memory layers are sandwiched, it is sufficient to couple only the operation layers and the memory layers through the TSVs, so the floating capacitance of the memory bus can be minimized and ultra-high-speed operation becomes possible.

Especially when it is used for mining and the like, by providing multiple TSVs of data paths for redundancy and stacking multiple processor arrays including defective points like a large-scale apartment, the data paths may have defective points, and the processor elements may also be used in a form in which the number of defective points gradually increases by three-dimensionally mounting a fine semiconductor, such as a 5 nm semiconductor, that includes defective points from the beginning.

Figure 19:
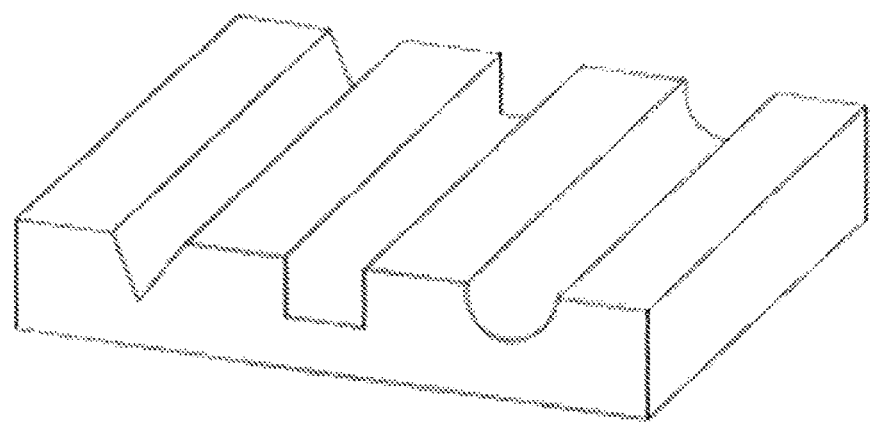
FIG. 19 schematically shows a configuration of the grooves described above.

FIG. 19 schematically shows a configuration of the grooves described above. The grooves through which the coolant passes are configured by etching, engraving, shaving with a computer NC, or digging the grooves vertically and horizontally with a press on the substrate layer. The grooves through which the coolant passes are V-shaped, U-shaped, or channel-shaped.

Figure 20:
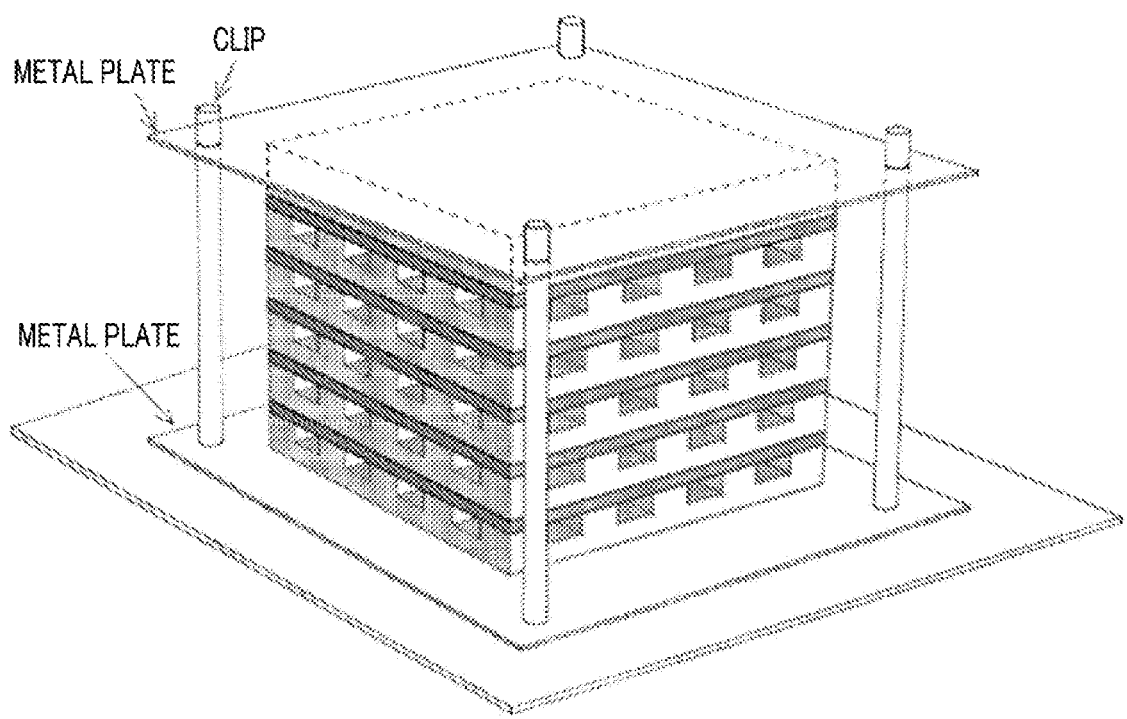
FIG. 20 schematically shows a configuration for preventing decomposition of a three-dimensional cooling semiconductor.

FIG. 20 schematically shows a configuration for preventing decomposition of a three-dimensional cooling semiconductor. A metal plate such as an aluminum plate is prepared on the top and bottom (the back of the PCB and the back of the semiconductor) as a material to not only come in contact with the BGA, but to prevent decomposition of the three-dimensional cooling semiconductor by positive pressure due to injection of the coolant for preventing cavitation, and four or more points are held by clips. A member such as an insulator is sandwiched between the aluminum plate and the PCB.

Figure 21:
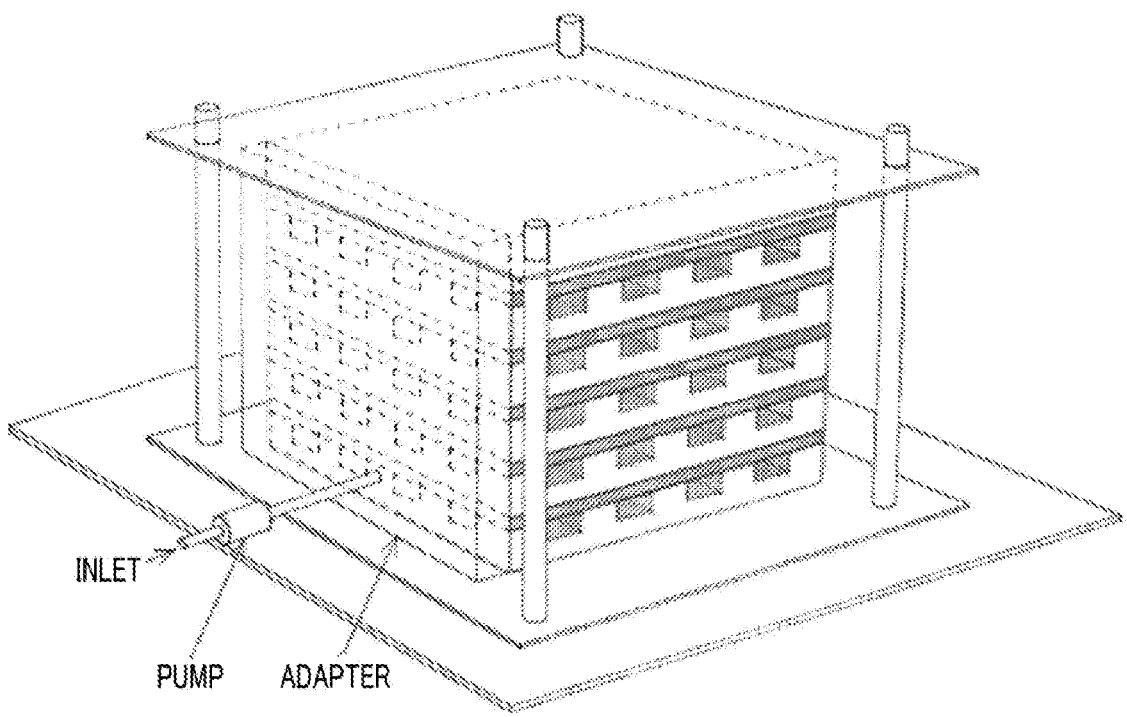
FIG. 21 schematically shows a configuration for preventing cavitation of a coolant.

FIG. 21 schematically shows a configuration for preventing cavitation of the coolant. Regardless of being immersed in liquid, cavitation is prevented by mounting an adapter on any side of the semiconductor and injecting a solution by positive pressure with a pump. It may be operated at a temperature at which immersion does not cause cavitation.

Figure 22:
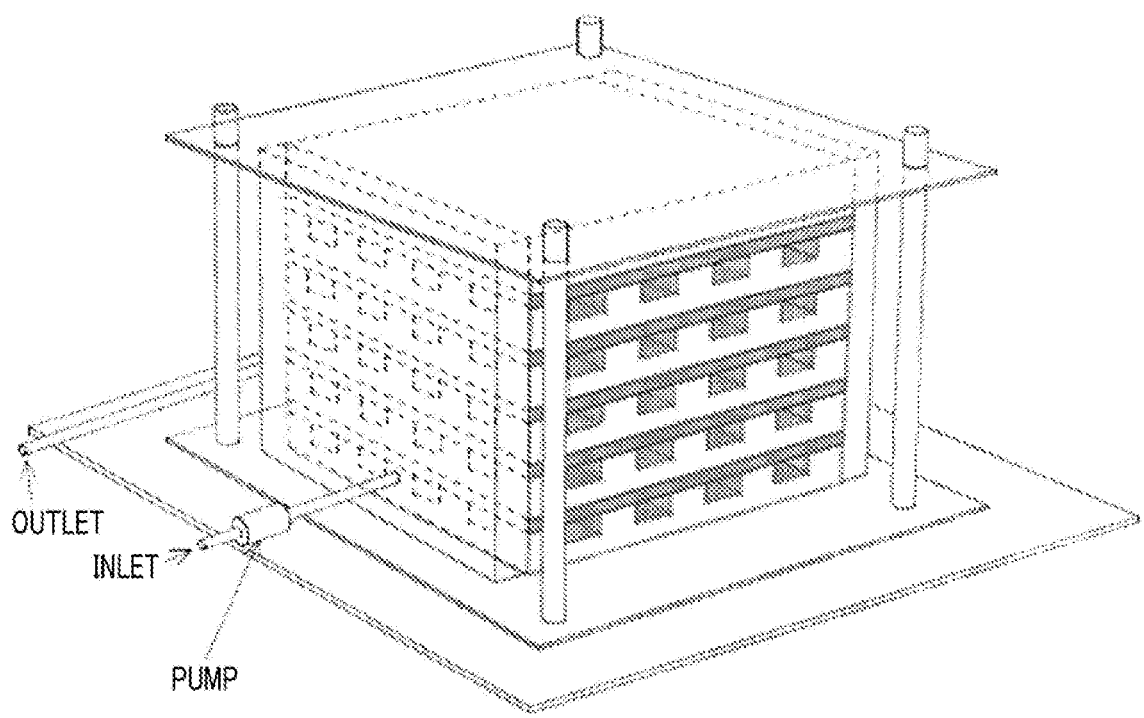
FIG. 22 schematically shows a configuration for preventing cavitation of the coolant.
Figure 23:
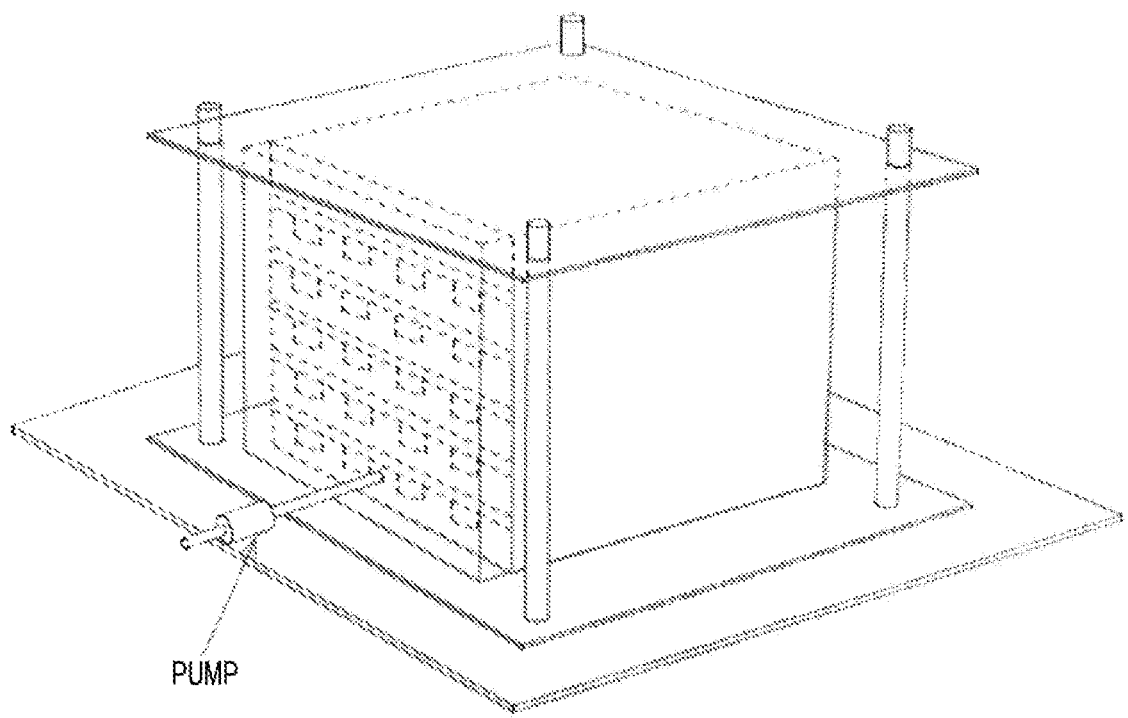
FIG. 23 schematically shows a configuration for preventing cavitation of the coolant.

FIG. 22 schematically shows a configuration for preventing cavitation of the coolant. It applies only to a case where the grooves are unidirectional, and packing is provided to prevent closed cavitation by providing an inlet and an outlet instead of using immersion. FIG. 23 schematically shows a configuration for preventing cavitation of the coolant. In the case where immersion is used, by providing the grooves in one direction or vertically and horizontally and providing only an open-type inlet, cavitation is prevented by applying a positive pressure from the inlet.

Figure 24:
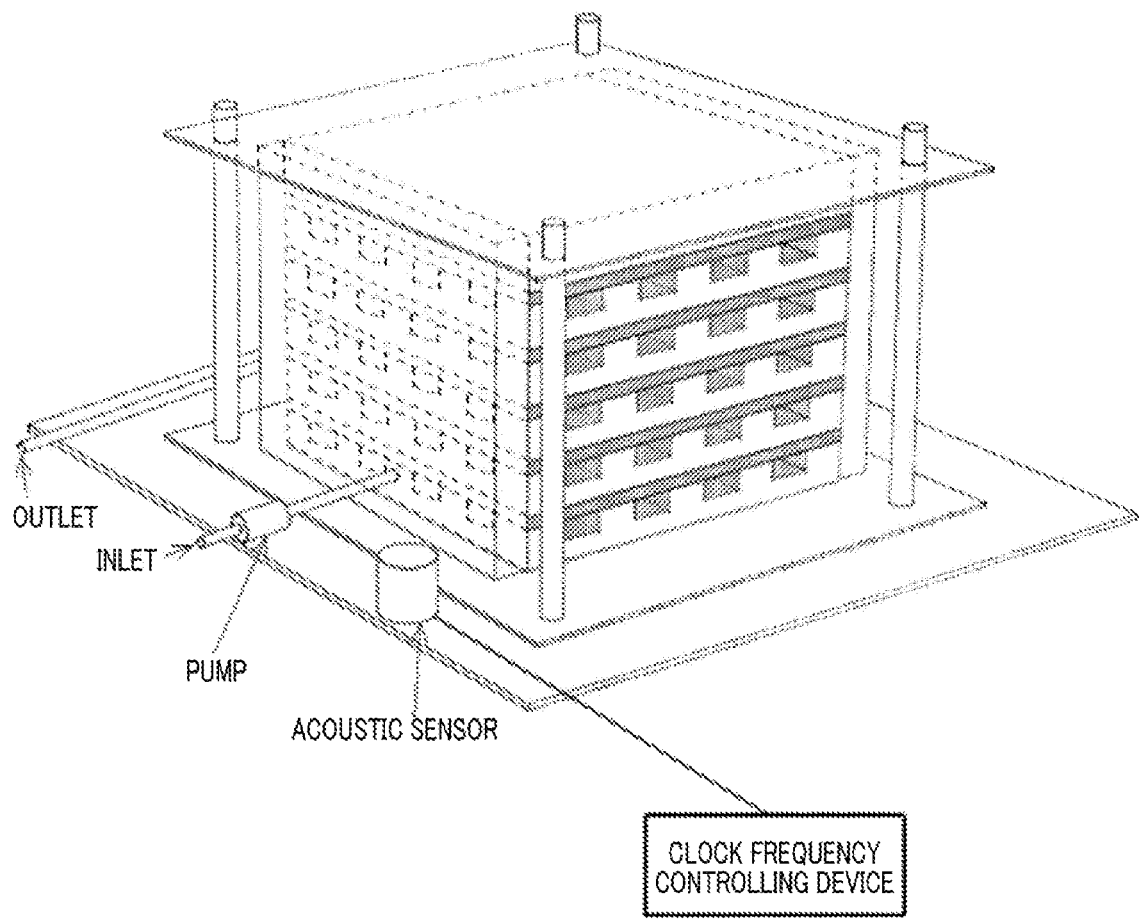
FIG. 24 schematically shows a configuration for operating while preventing cavitation.

FIG. 24 schematically shows a configuration for operating while preventing cavitation. Operation is performed while preventing cavitation from occurring by controlling a clock frequency by providing an acoustic sensor and using the output of the acoustic sensor. A metal plate such as an aluminum plate is prepared on the top and bottom (the back of the PCB and the back of the semiconductor) as a material to prevent decomposition of the three-dimensional cooling semiconductor by positive pressure due to injection of the coolant for preventing cavitation, and four or more points are held by clips. A member such as an insulator is sandwiched between the aluminum plate and the PCB. An acoustic sensor detects whistling that occurs when the coolant boils, and controls the frequency within a range in which the whistling does not occur.

Figure 25:
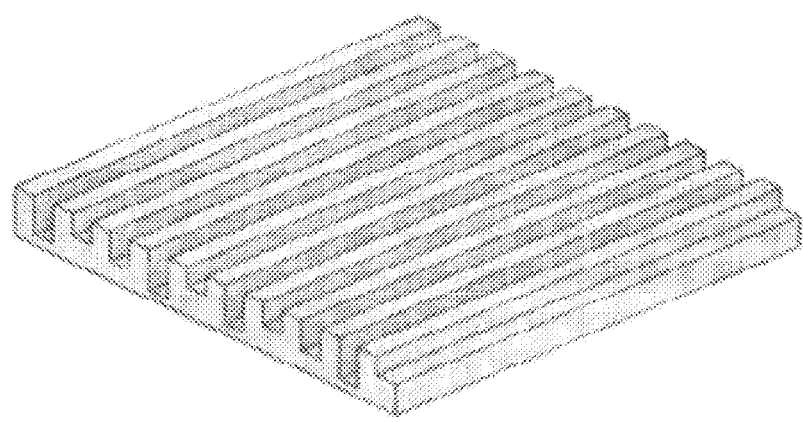
FIG. 25 schematically shows a configuration for preventing whistling from resonating.
Figure 26:
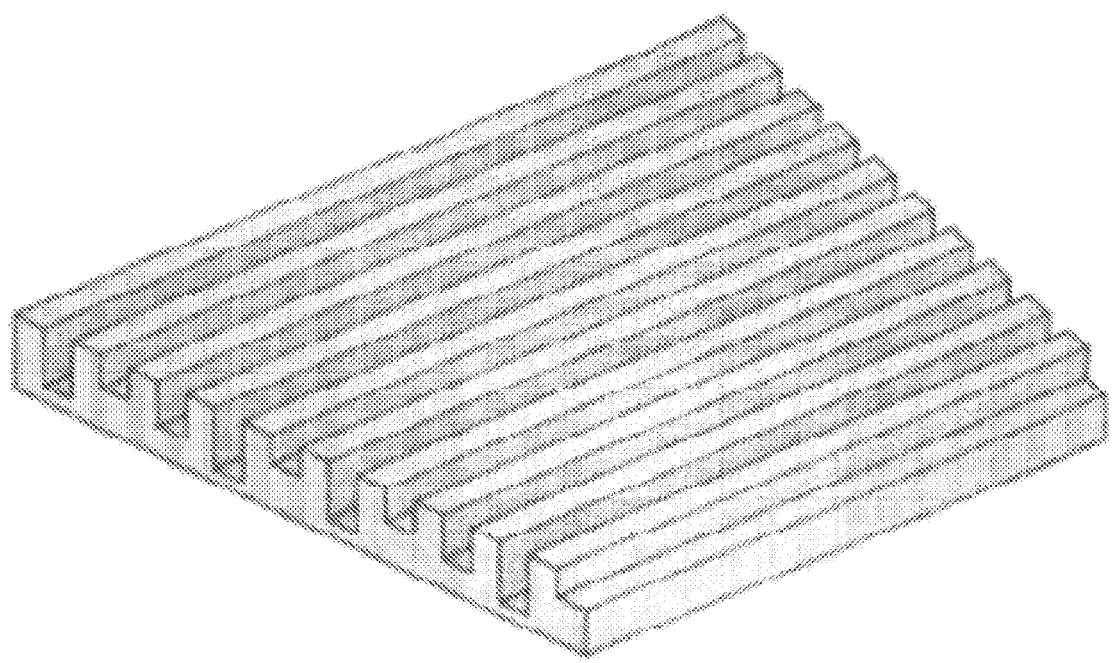
FIG. 26 schematically shows another configuration for preventing the whistling from resonating.
Figure 27:
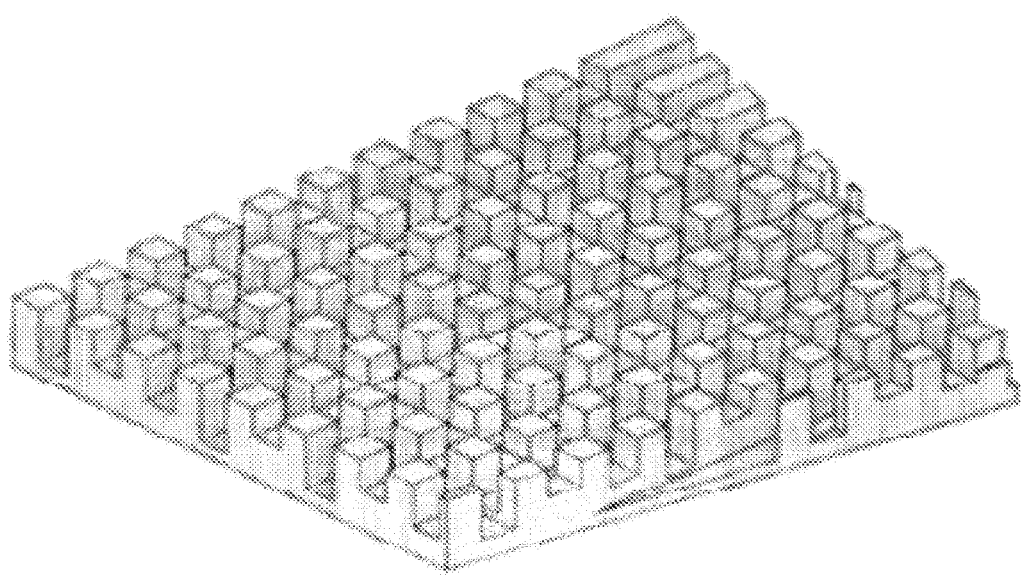
FIG. 27 schematically shows another configuration for preventing whistling from resonating.

FIG. 25 schematically shows a configuration for preventing whistling from resonating. FIG. 26 schematically shows another configuration for preventing the whistling from resonating. FIG. 27 schematically shows another configuration for preventing the whistling from resonating. The depth and length of the grooves may be changed to prevent resonance so that the whistling does not resonate. In this case, the semiconductor may have a trapezoidal shape in order to change the lengths of the grooves. In the case where there are vertical and horizontal grooves, the trapezoid becomes irregular to prevent resonance in each of the vertical and horizontal directions.

Figure 28:
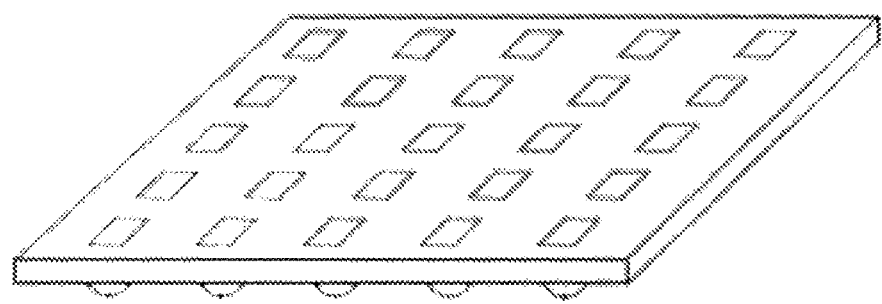
FIG. 28 schematically shows a semiconductor package for cooling a three-dimensional stacked integrated circuit by immersion.

FIG. 28 schematically shows a semiconductor package for cooling a three-dimensional stacked integrated circuit by immersion. The semiconductor package is a BGA or a package conforming to the BGA, and has a configuration in which pads having a geometrical shape (a circle, a square, a triangle, a star shape, or the like) for contacting the BGA are also provided on the surface of the semiconductor package so that the semiconductor can be vertically stacked. It is mounted by immersion using gaps in the contact grid. A semiconductor packaging for immersion wherein a ball grid of the BGA is mounted on the lower part of the semiconductor and the pads having a geometrical shape (a circle, a square, a triangle, a star shape, or the like) for contacting the BGA are mounted on the upper surface, and a cooling method are provided. By vertically stacking single-layer stacked integrated circuits thus devised, the three-dimensional stacked integrated circuit for immersion is configured. The semiconductors are vertically stacked and are held and pressed so that they do not shift. Coolant flows through the gaps of the ball grid of the metal contacts. Since the data path has only the thickness in the vertical direction including the contacts, high speed interconnection is possible, and the essence of the present invention can be realized without changing any existing semiconductor manufacturing method. The pads may be spring contacts.

The shape of the semiconductor shown in FIG. 28 is intended for the vertical bus connection of the central processing unit, the GPGPU, the semiconductor memory, and the HBM intended for cooling by immersion. Although there is a case of pads wherein pads are formed on the semiconductor, this is only parent-child mounting, and the present invention differs from this case in that the present invention is intended for cooling by immersion using gaps between stacked BGA packages having a structure like a parent turtle and a baby turtle as a cooling structure by performing immersion using gaps of the ball grids of the BGA or the like, and is characterized by connections of the terminals of the BGA or the like and contacts configuring a data bus in the vertical direction. Therefore, although the data bus extends outside of the semiconductor, high-frequency bus operation is possible by keeping the distance to a minimum. That is, the three-dimensional semiconductor cooling method of the present invention aims to speed up the operation of the stacked memories and processors by using the vertical connection of the semiconductors stacked by the pads in the vertical bus.

Figure 29:
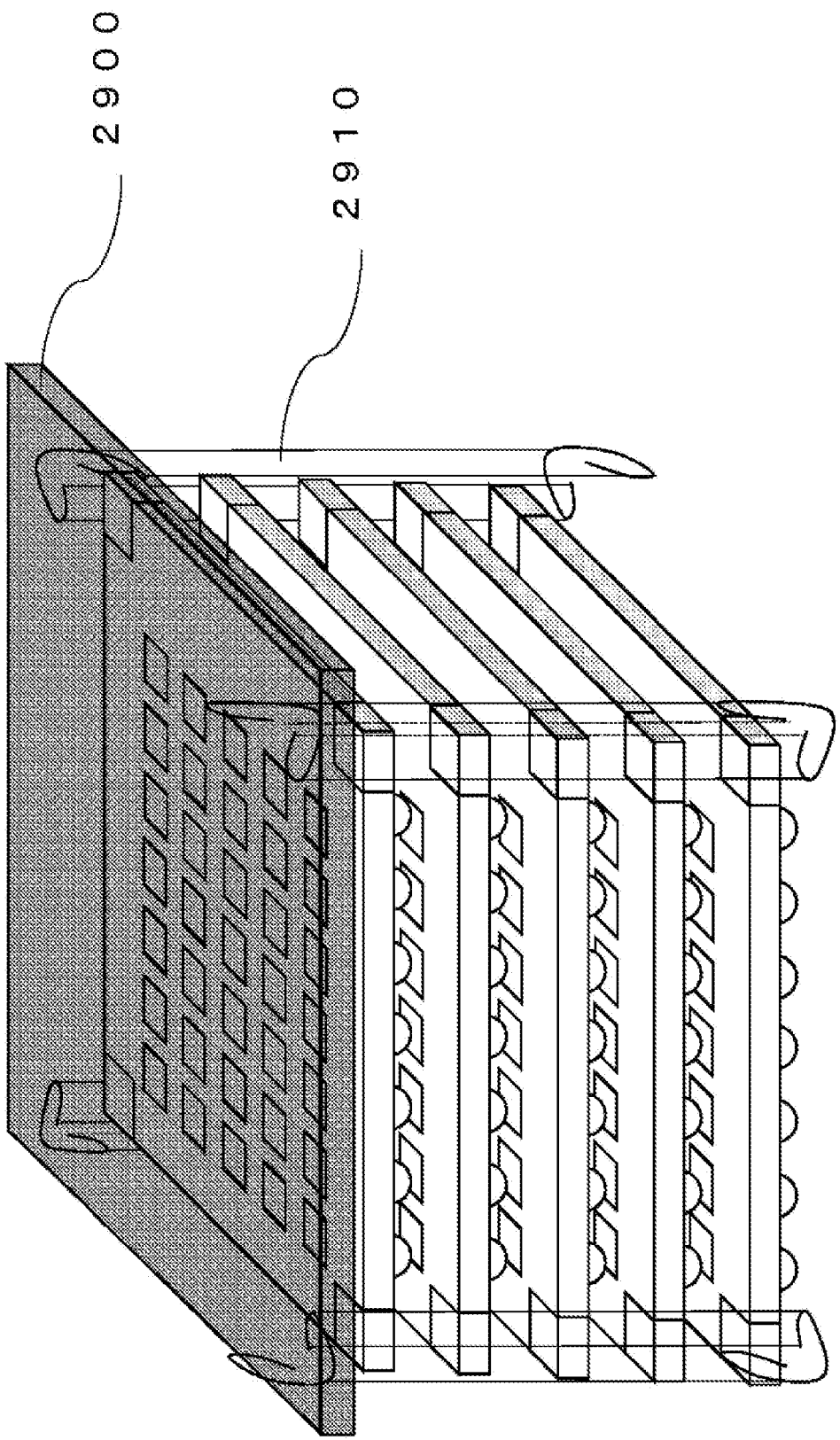
FIG. 29 shows a case of power feeding at the corner of a semiconductor in which BGA packages are stacked.
Figure 30:
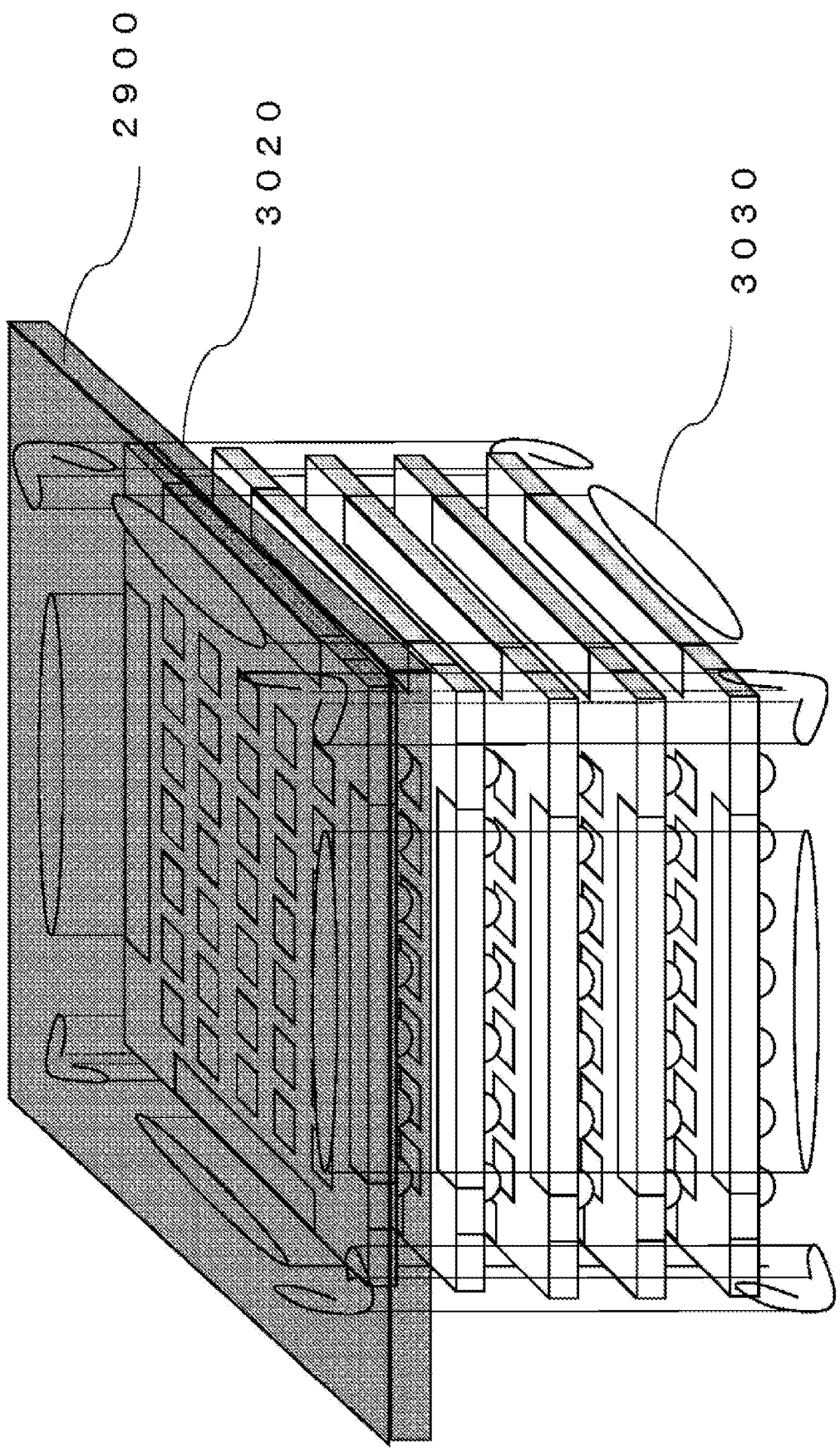
FIG. 30 shows a case of power feeding on a side surface of a semiconductor in which BGA packages are stacked.
Figure 31:
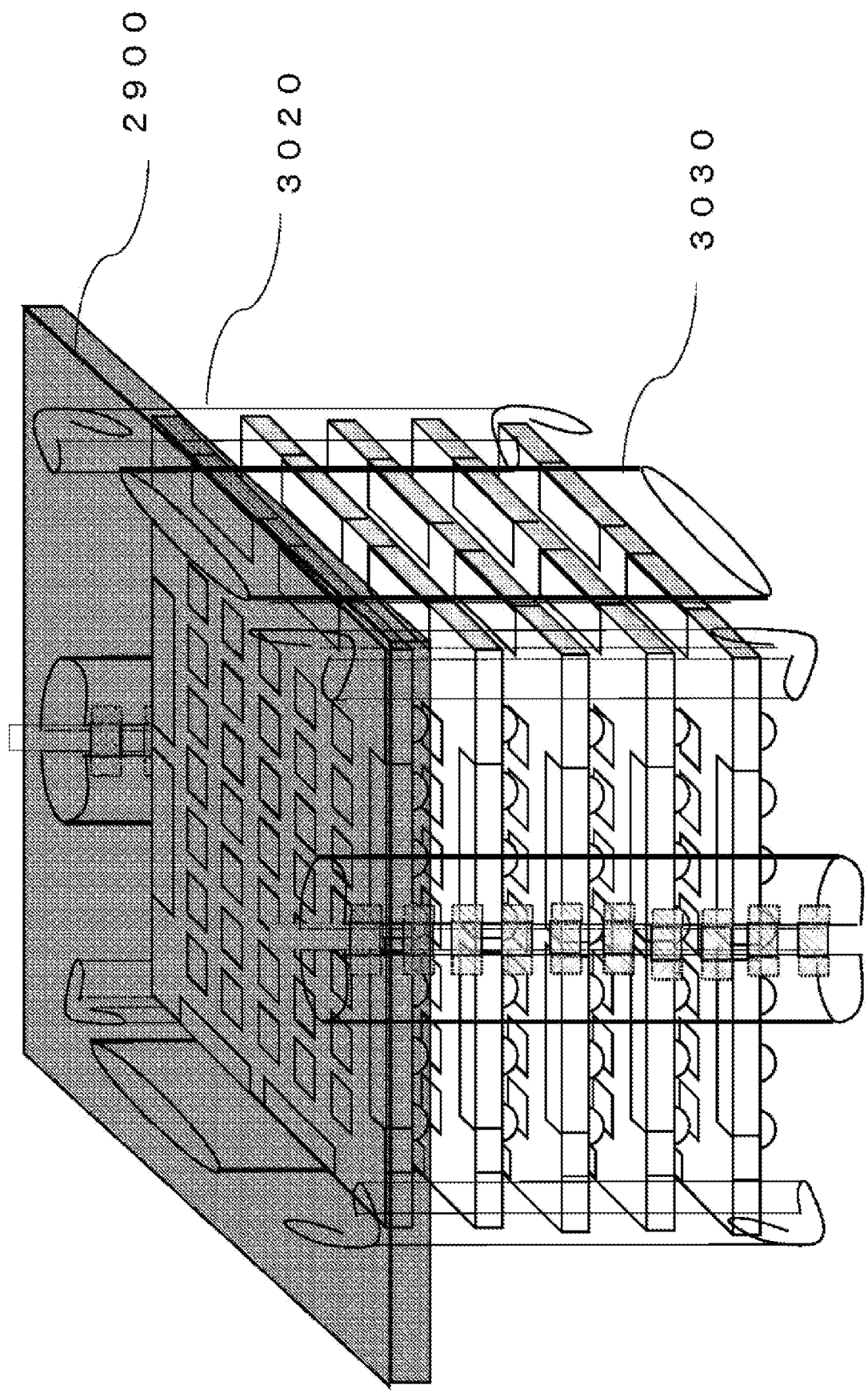
FIG. 31 shows a case of positive and negative power feeding on the side surface of a semiconductor in which BGA packages are stacked.
Figure 32:
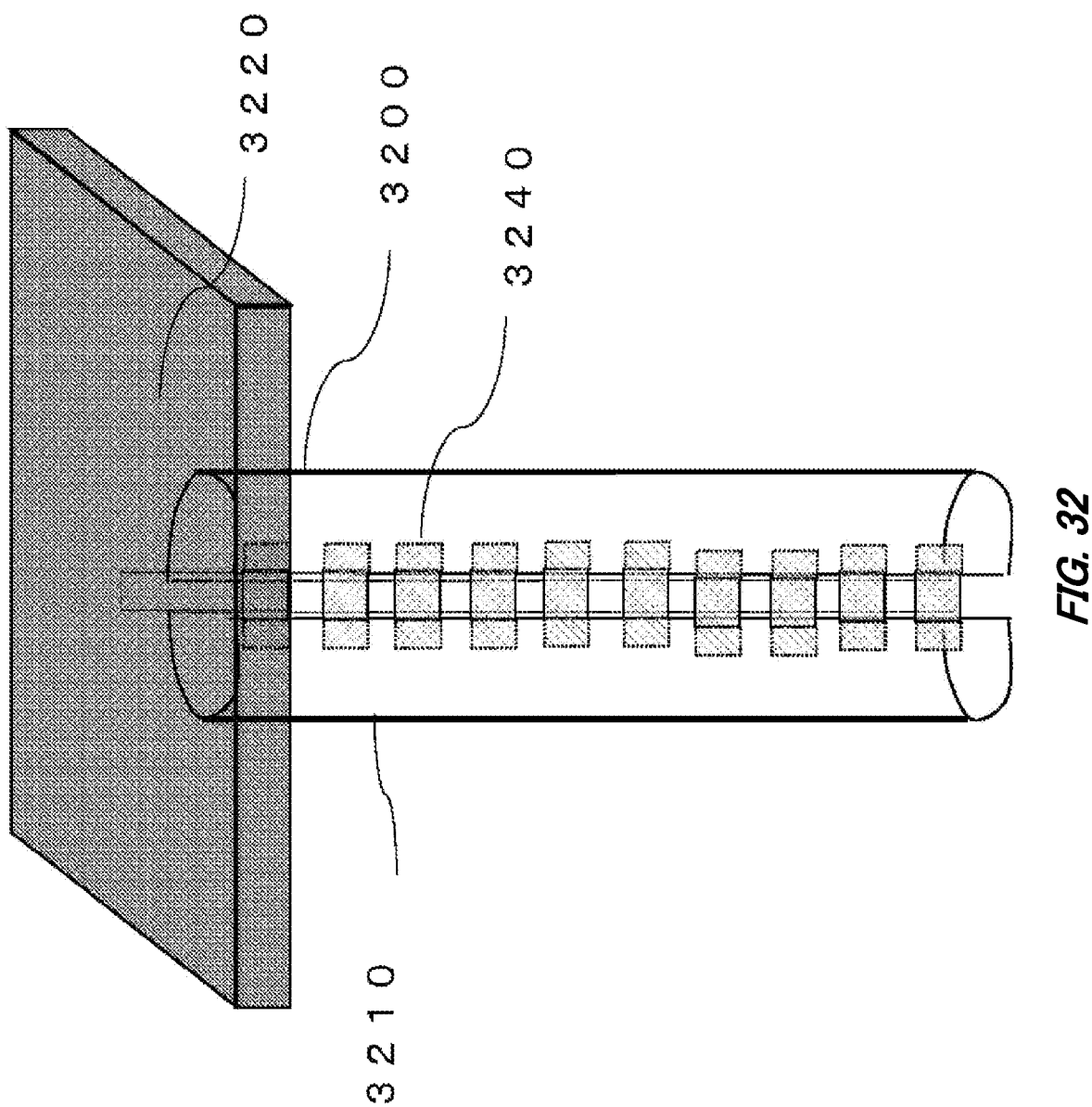
FIG. 32 shows a structure of a metal rod-shaped electrode.
Figure 33:
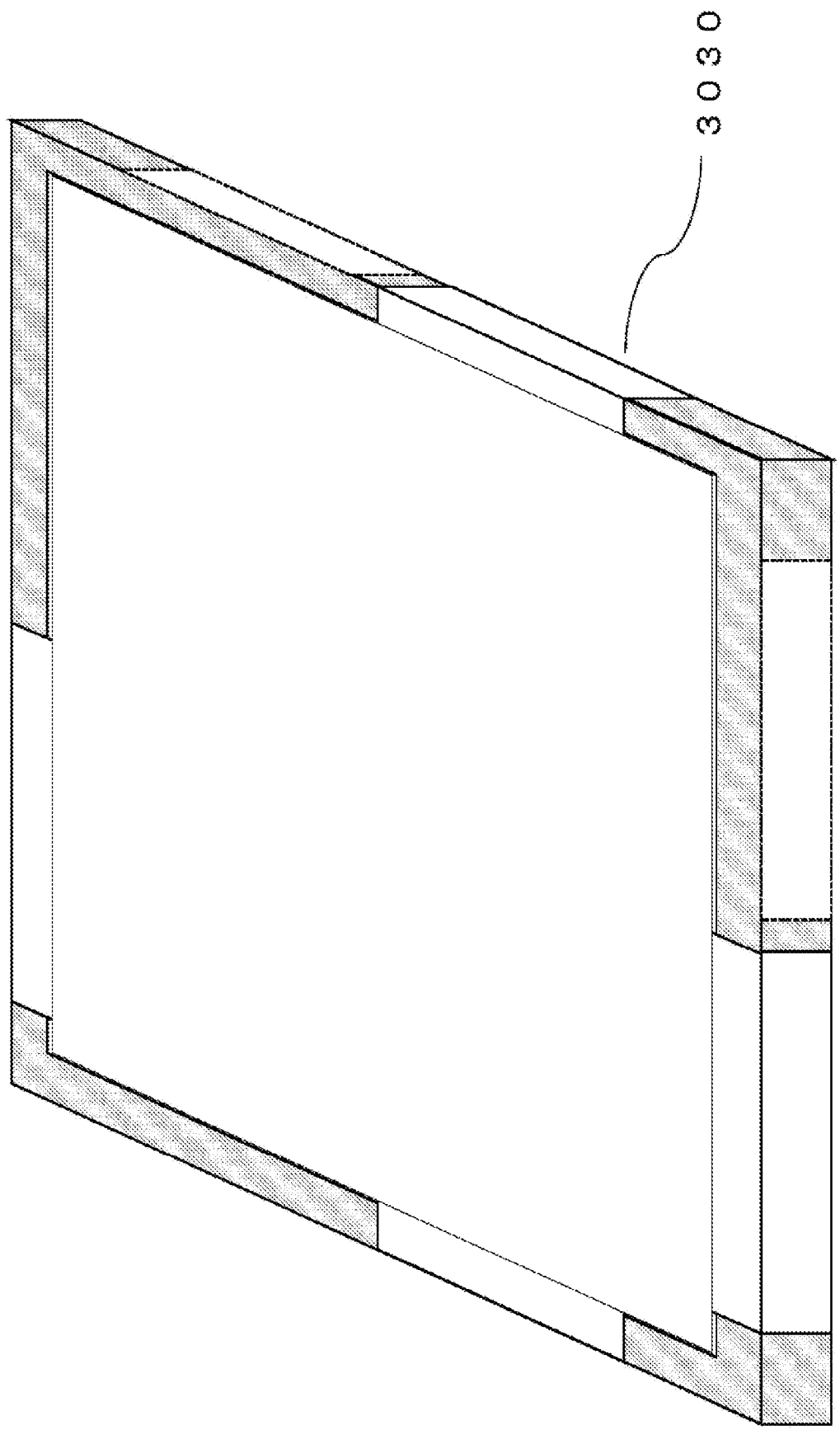
FIG. 33 shows a structure (front) of a lid having a function of connecting electrodes to each other.
Figure 34:
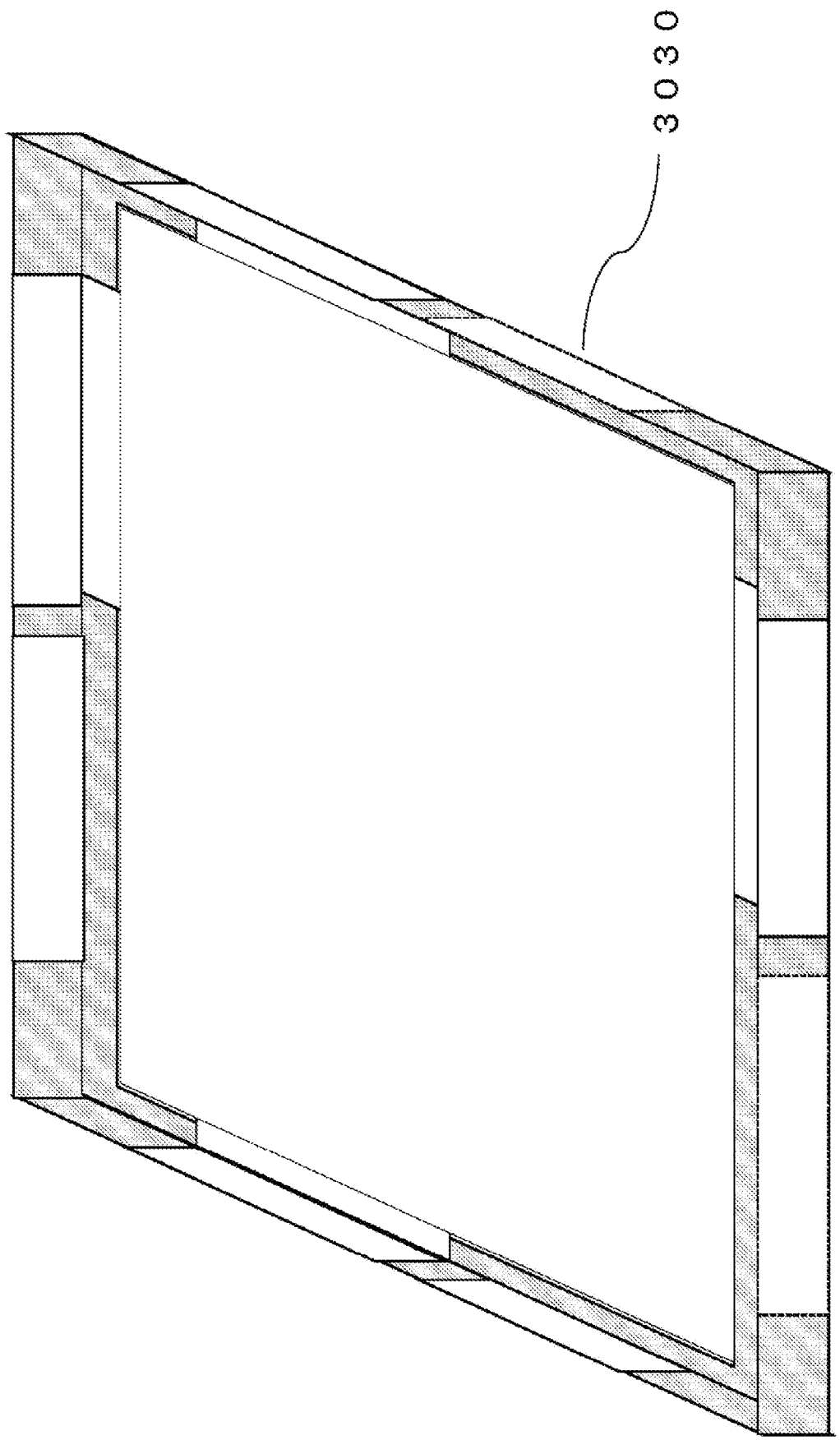
FIG. 34 shows the structure (back) of the lid.
Figure 35:
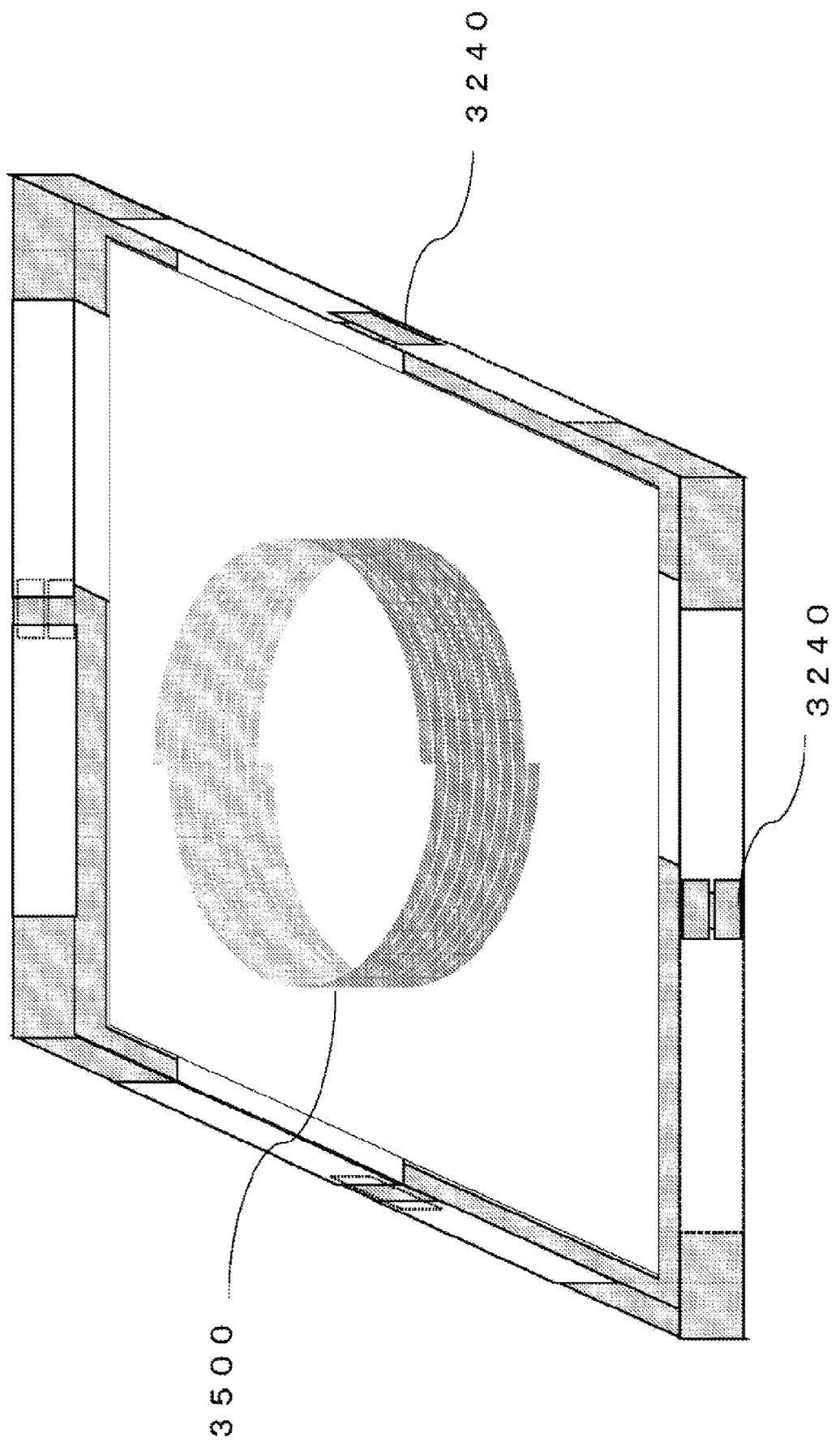
FIG. 35 shows a case where a spring and a capacitor are attached to the structure (back) of the lid.

An example of an embodiment of an item 26 is shown in FIG. 29, FIG. 30, and FIG. 31. A cooling method by a coolant of a three-dimensional stacked integrated circuit according to item 26 and the three-dimensional stacked integrated circuit using the same are the semiconductor according to item 13. By installing electrodes in the corners, peripheral parts, or both of the semiconductor in which BGA packages are stacked and by bringing metal rod-shaped electrodes in contact with the electrodes, stable GND potential with low impedance and a power supply potential are supplied. The metal rod-shaped electrode may have a structure having a capacitor between positive and negative electrodes.

FIG. 31 shows a semiconductor according to item 26, and the semiconductor may include a lid having a function of connecting the electrodes for pressing down the stacked semiconductors and supply a stable potential with low impedance. The lid may be provided with a spring or the like to press down the semiconductor. In addition, the lid may have a path for connecting the potentials to each other to connect the positive and negative potentials.

Figure 36:
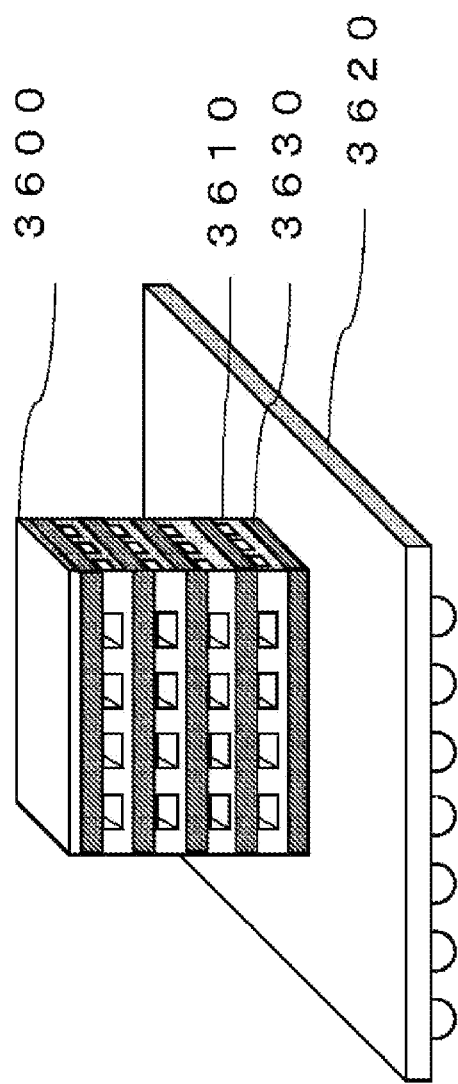
FIG. 36 shows a structure (upper side) of a stacked semiconductor with a groove.
Figure 37:
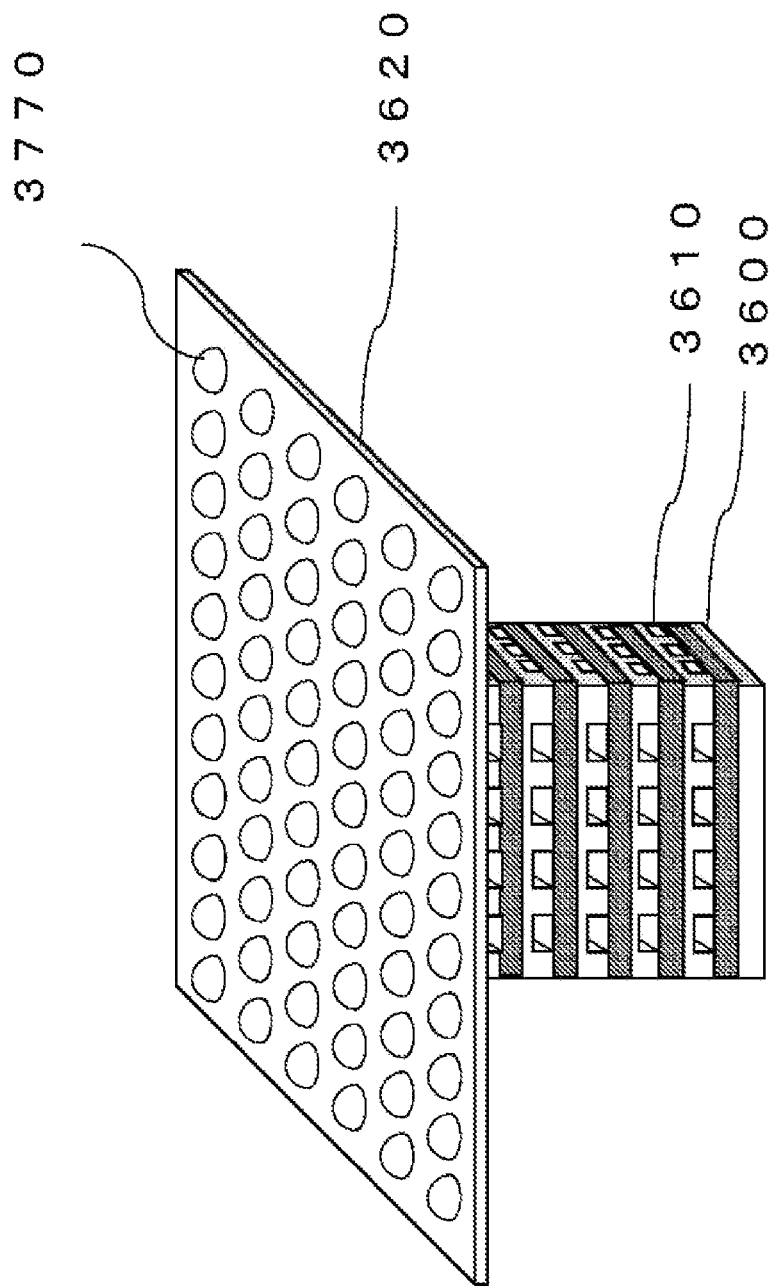
FIG. 37 shows a structure of the stacked semiconductor with the groove (lower side).

An embodiment of item 28 is shown in FIG. 36 and FIG. 37. A cooling method by a coolant of a three-dimensional stacked integrated circuit according to item 28 and the three-dimensional stacked integrated circuit using the same are a semiconductor according to item 10, item 11, and item 12, and may be a normal FC-BGA substrate without grooves in the first layer. The semiconductor of the first layer and the FC-BGA substrate of the first layer are connected by normal FC pads. Between the FC-BGA substrate of the first layer and the semiconductor of the first layer, the FC pads are surrounded by underfill or the like so that water does not enter the FC pads between themselves and the semiconductor of the first layer.

Figure 38:
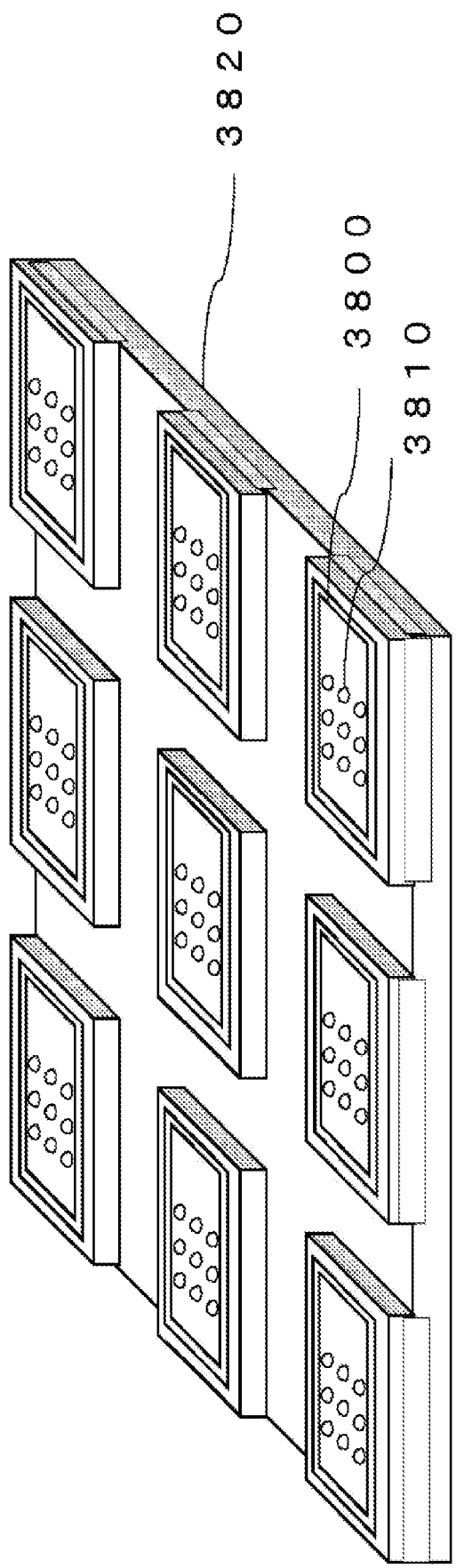
FIG. 38 shows a state in which a TSV is covered with an adhesive or the like in an interposer part of the semiconductor with the groove.

FIG. 38 is a semiconductor according to item 10, item 11, and item 12, and in the stacking parts of its interposers and semiconductor chips, FC pads are solidified with underfill or the like so that coolant does not penetrate the FC pads.

In addition, FIG. 39, FIG. 40, FIG. 41, FIG. 42, FIG. 43, and FIG. 45 are a semiconductor according to item 32, which is a semiconductor according to item 13, and the package having pads on its upper surface according to item 13, for connecting the BGA terminal on the upper surface on its upper and lower sides, is configured itself by a FC-BGA substrate provided in a recess for accommodating the semiconductor and by the lid of a heat spreader.

The difference from a normal FC-BGA substrate is that it has a geometrical pad electrodes (lands) for connecting the BGA package of the surface one above to the upper surface excluding the recess. There are FC bumps that join to the semiconductor in the recess part. The part that should be added to a normal FC-BGA substrate are pads (lands), provided on the surface, for connecting BGA bumps of an upper package by adding a substrate with a hole for storing a semiconductor in the center and extending it upward with through holes.

The reason why BGA pads is not installed on the upper surface of the place on the semiconductor surface is to install the heat spreader on the recess of the substrate in the semiconductor part, apply a compound, and cover it with a lid. The recessed part may be configured in a state of joining a substrate with a hole for storing a semiconductor in the center in the manufacturing process of the substrate, and connecting the substrate that configures the lower part of the package and the upper pads (lands) with through holes. In a case where the distances between the BGA bumps and the pads (lands) are the same between the first layer and the second and subsequent layers, an internal bus of the three-dimensional semiconductor to be configured this time may be configured by coupling the BGA bumps of all of the layers and the lands with through holes. Alternatively, the semiconductor chip and the FC-BGA substrate on an upper lid may be directly bonded with FC balls, and the substrate part and the semiconductor chip may be vertically bonded with the FC balls.

Figure 39:
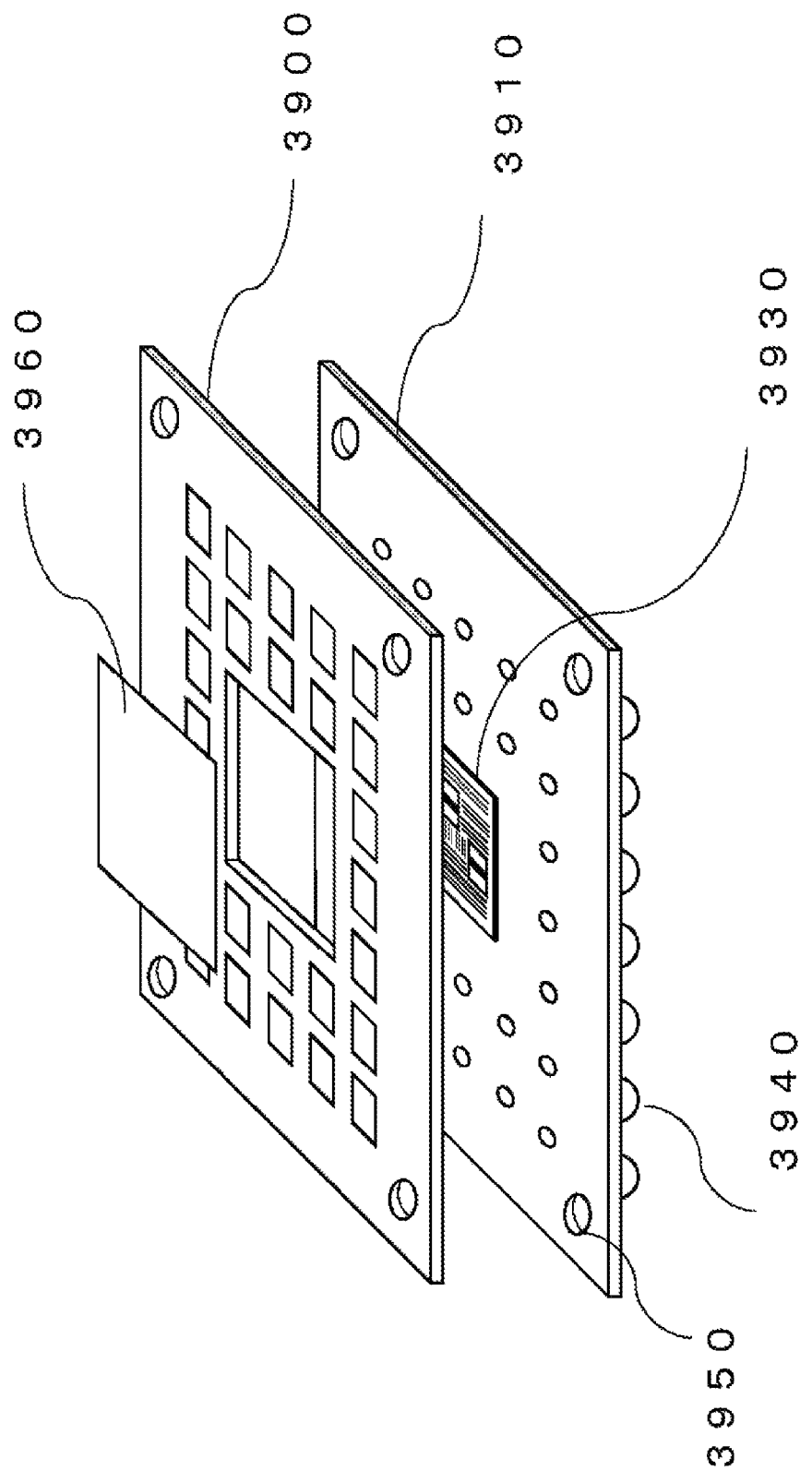
FIG. 39 shows a structure of one layer of a BGA stacked semiconductor.
Figure 41:
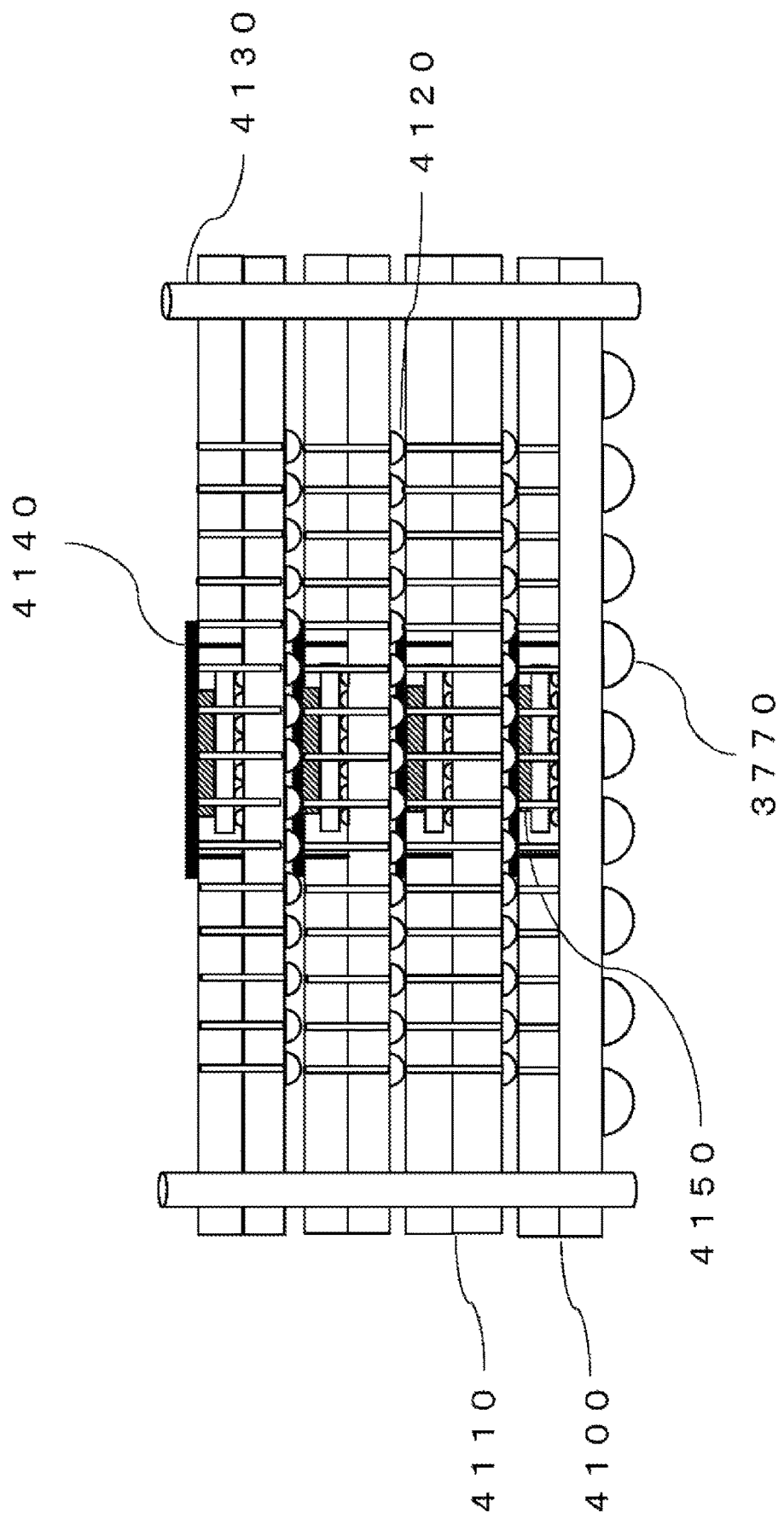
FIG. 41 shows a structure of the BGA stacked semiconductor seen from the side.

In addition, FIG. 39 and FIG. 41 is a semiconductor according to item 13, and the semiconductor itself may be the same in all layers. The FC-BGA substrate of the first layer has pads connected to the upper layer and has pads penetrating the substrate of the upper lid. In the FC-BGA substrate the BGA at the peripheral part is provided with pads that vertically penetrate in the substrate and are connected to the upper lid. The upper lid has pads that electrically penetrate. For the second and subsequent layers, power supply pads according to item 26 may be provided on the side surface of the substrate.

In addition, FIG. 39, FIG. 40, FIG. 41, FIG. 42, FIG. 43, and FIG. 45 are embodiments of the semiconductor of item 33 that is a semiconductor according to item 32, and the semiconductor itself may be the same in all layers. The FC-BGA substrate of the first layer has pads connected to the upper layer and has pads penetrating the substrate of the upper lid. The FC-BGA substrate on the second and subsequent layers is provided with pads that vertically penetrate the BGA at the peripheral part and are connected to the upper lid.

The second and subsequent layers other than the first layer to be soldered to the PCB may be configured by a BGA with small bumps.

The BGA pads on the upper surface of the first layer and the BGA bumps and pads of the second and subsequent layers are for interlayer coupling, and bumps and bump intervals smaller than those of the first layer may be adopted. The BGA pads on the upper surface of the first layer and the BGA bumps of the second and subsequent layers may or may not include an external bus connection.

Only the lowermost chip may be responsible for interconnection with the external bus. In case where the BGA connection with small bumps does not include the external bus connection, the signal propagation distance becomes extremely short, which enables high-speed clock operation. In addition, since the signal is a non-terminated connection, the operation mode takes into consideration reflection as in a PCI bus. Since it is configured by the BGA with small bumps, holes may be formed in the upper FC-BGA substrate and the lower FC-BGA substrate layer, and the layers may be stacked using guide pins or the like in order to improve the alignment accuracy of the stacking.

The electrodes may be provided by plating in the holes of guide pins by a power supply method according to item 26 and item 27, and the guide pins may also be used as bars for power supply.

As according to item 33, the semiconductor according to item 32 may be configured by a BGA with small bumps in the second and subsequent layers other than the first layer soldered to the PCB. FC pads may pass only the signal for the internal bus on the upper side of the substrate of the first layer and the second and subsequent layers. The lowermost chip may be responsible for interconnection with the external bus. Since it is configured by the BGA with small bumps, holes may be formed in the upper FC-BGA substrate and the lower FC-BGA substrate layer, and the layers may be stacked using guide pins or the like in order to improve the alignment accuracy of the stacking.

Figure 40:
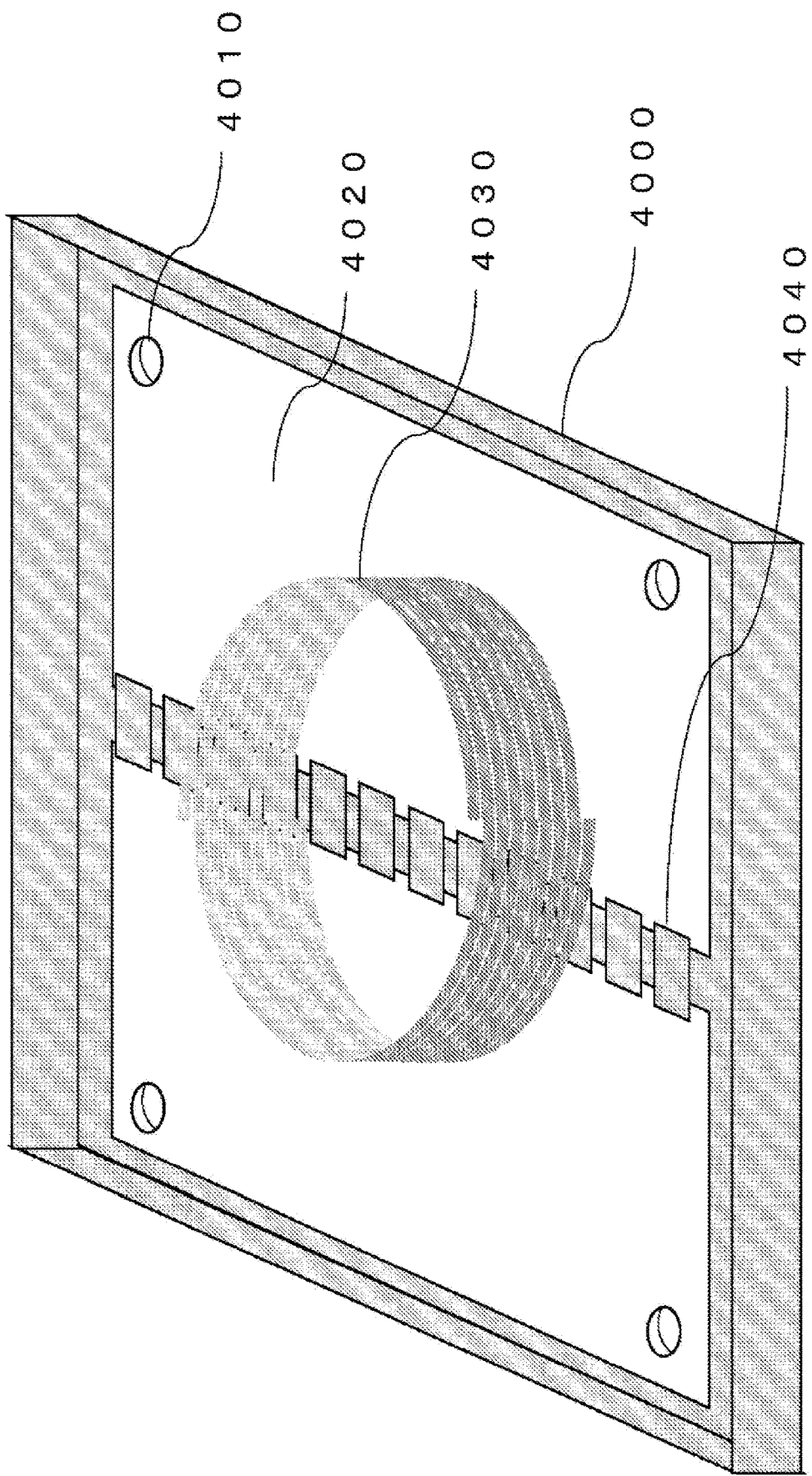
FIG. 40 shows a structure for a lid of the BGA stacked semiconductor.

The electrodes may be provided by plating in the holes of guide pins, and the guide pins may also be used as bars for power supply. As shown in FIG. 40, the guide pins may be used as electrodes in the power supply method according to item 27 that reduces impedance by a restraining lid.

In addition, FIG. 39 and FIG. 41 are the semiconductor according to item 31 and item 32 in which holes are formed in the FC-BGA substrate of the upper lid, and a heat spreader may be attached for cooling, and a compound may be applied between the semiconductor and the heat spreader.

In addition, FIG. 39, FIG. 40, and FIG. 41 are the semiconductor according to item 31, item 32, and item 34 that does not use the small BGA bumps according to item 33, and the second and subsequent layers are the same package as the first layer. In the BGA attached to the package, all layers may be the same semiconductor and package by simply removing BGA bumps of the heat spreader part, disposing BGA bumps for an external connection bus inside and making them BGA bumps for internal interconnection, and removing some BGA bumps for external connection in the second and subsequent layers.

FIG. 40 is a mounting example of the semiconductor according to item 27. It may be the semiconductor according to item 26, and include a lid having a function of connecting the electrodes for pressing down the stacked semiconductors and supply a stable potential with low impedance. The lid may be provided with a spring or the like to press down the semiconductor. In addition, the lid may have a path for connecting the potentials to each other to connect the positive and negative potentials.

FIG. 41 is a mounting example of the semiconductor according to item 32. Although the substrate of the upper lid and the substrate of the lower lid are vertically connected, the connection of the first layer is omitted. In addition, each connection is omitted regarding connection to the semiconductor chip.

It is a semiconductor according to item 13, and the package having pads on its upper surface according to item 13, for connecting the BGA terminal on the upper surface on its upper and lower sides, is configured itself by a FC-BGA substrate provided in a recess for accommodating the semiconductor and by the lid of a heat spreader.

The difference from a normal FC-BGA substrate is that it has geometrical pad electrodes (lands) for connecting the BGA package of the surface one above to the upper surface excluding the recess. There are FC bumps that join to the semiconductor in the recess part. The part that should be added to a normal FC-BGA substrate are pad (lands), provided on the surface, for connecting BGA bumps of an upper package by adding a substrate with a hole for storing a semiconductor in the center and extending it upward with a through hole.

The reason why the BGA pads are not installed on the upper surface of the place on the semiconductor surface is to install the heat spreader on the recess of the substrate in the semiconductor part, apply a compound, and cover it with a lid. The recessed part may be configured in a state of joining a substrate with a hole for storing a semiconductor in the center in the manufacturing process of the substrate, and connecting the substrate that configures the lower part of the package and the upper pads (lands) with through holes. In a case where the distances between the BGA bumps and the pads (lands) are the same between the first layer and the second and subsequent layers, an internal bus of the three-dimensional semiconductor to be configured this time may be configured by coupling the BGA bumps of all of the layers and the lands with through holes.

Figure 42:
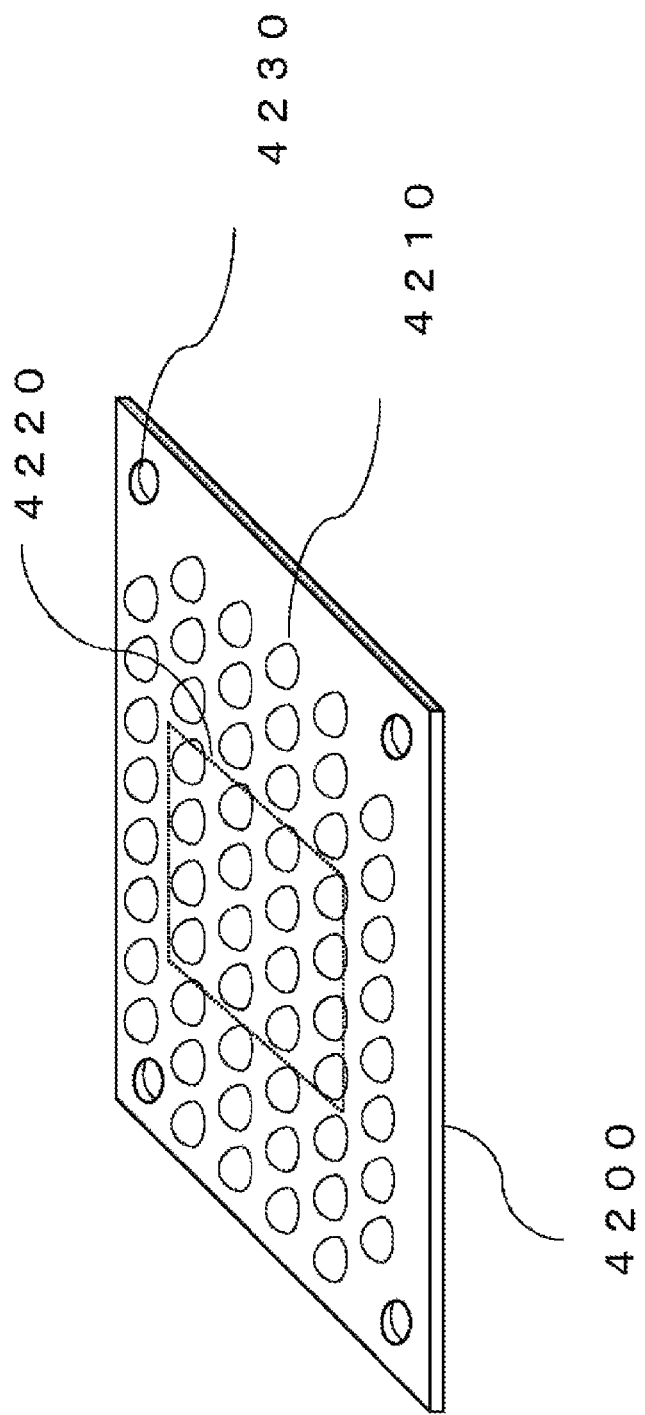
FIG. 42 shows a structure of the first layer of the BGA stacked semiconductor seen from the back.

FIG. 42 is a mounting example of the semiconductor according to item 32. The structure of a layer of the BGA package is shown from the back side. Although all of the BGA bump electrodes are mounted on the package of the first layer, regarding the center part where the heat spreader exists of the second and subsequent layers, it is possible to avoid contact with the heat spreader by not mounting the BGA bump electrodes in this part in the second and subsequent layers of the semiconductor package.

The reason why the BGA pads are not installed on the upper surface of the place on the semiconductor surface is to install the heat spreader on the recess of the substrate in the semiconductor part, apply a compound, and cover it with a lid. The recessed part may be configured in a state of joining a substrate with a hole for storing a semiconductor in the center in the manufacturing process of the substrate, and connecting the substrate that configures the lower part of the package and the upper pads (lands) with through holes. In a case where the distances between the BGA bumps and the pad (land) are the same between the first layer and the second and subsequent layers, an internal bus of the three-dimensional semiconductor to be configured this time may be configured by coupling the BGA bumps of all of the layers and the lands with through holes.

Figure 43:
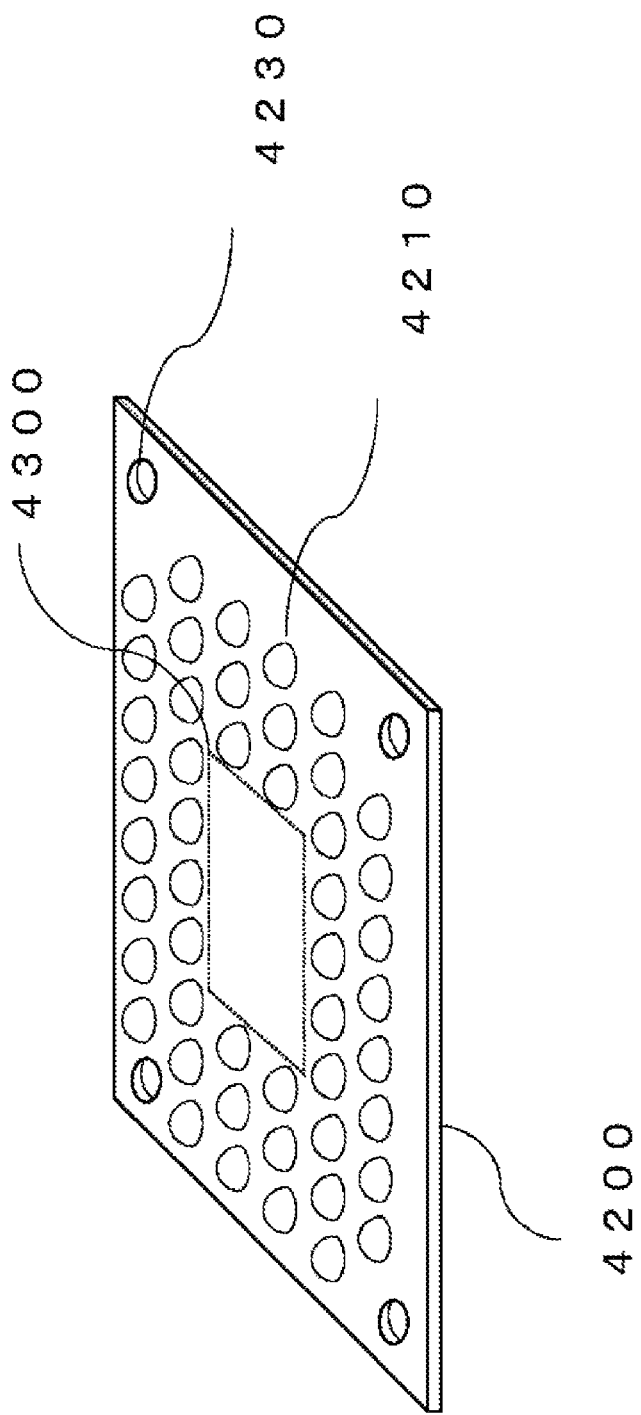
FIG. 43 shows a structure of the second layer of the BGA stacked semiconductor seen from the back.

FIG. 43 is a mounting example of the semiconductor according to item 32. It shows a structure of the second layer of the BGA stacked semiconductor seen from the back side.

It is a semiconductor according to item 13, and the package having pads on its upper surface according to item 13, for connecting the BGA terminal on the upper surface on its upper and lower sides, is configured itself by a FC-BGA substrate provided in a recess for accommodating the semiconductor and by the lid of a heat spreader.

The difference from a normal FC-BGA substrate is that it has a geometrical pad electrodes (lands) for connecting the BGA package of the surface one above to the upper surface excluding the recess. There are FC bumps that join to the semiconductor in the recess part. The part that should be added to a normal FC-BGA substrate is are pads (lands), provided on the surface, for connecting BGA bumps of an upper package by adding a substrate with a hole for storing a semiconductor in the center and extending it upward with a through hole.

The reason why the BGA pads are not installed on the upper surface of the place on the semiconductor surface is to install the heat spreader on the recess of the substrate in the semiconductor part, apply a compound, and cover it with a lid. The recessed part may be configured in a state of joining a substrate with a hole for storing a semiconductor in the center in the manufacturing process of the substrate, and connecting the substrate that configures the lower part of the package and the upper pads (lands) with through holes. In a case where the distances between the BGA bumps and the pads (lands) are the same between the first layer and the second and subsequent layers, an internal bus of the three-dimensional semiconductor to be configured this time may be configured by coupling the BGA bumps of all of the layers and the lands with through holes.

Figure 44:
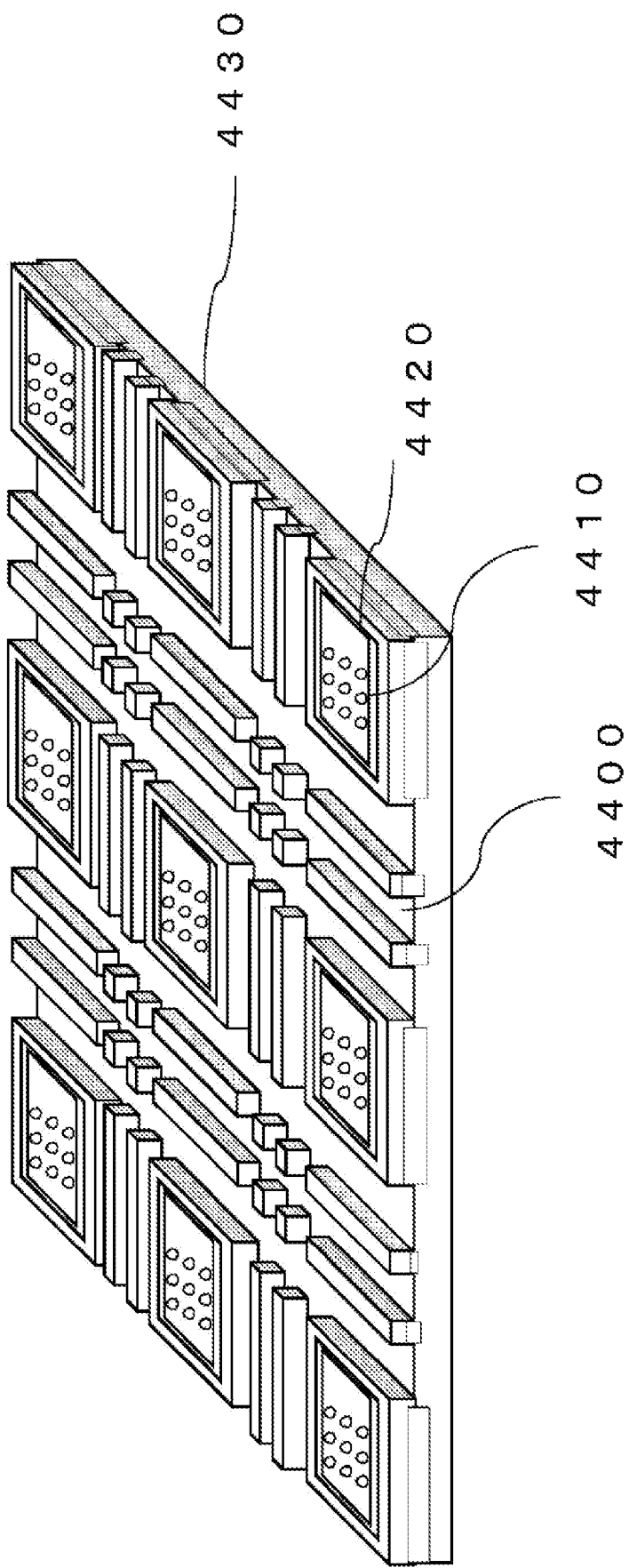
FIG. 44 shows an interposer in which the groove width of the semiconductor with the groove is changed.

FIG. 44 is a mounting example of the semiconductor according to item 30. In the case of the semiconductor according to item 10, item 11, and item 12, it is not always necessary that the grooves through which the coolant passes and the areas of the FC pads with TSVs alternate with each other, and since the area for configuring the semiconductor is lost when there are too many vertical TSV zones, the areas for FC pads with TSVs may be limited in number. The grooves may be adjacent to each other.

Figure 45:
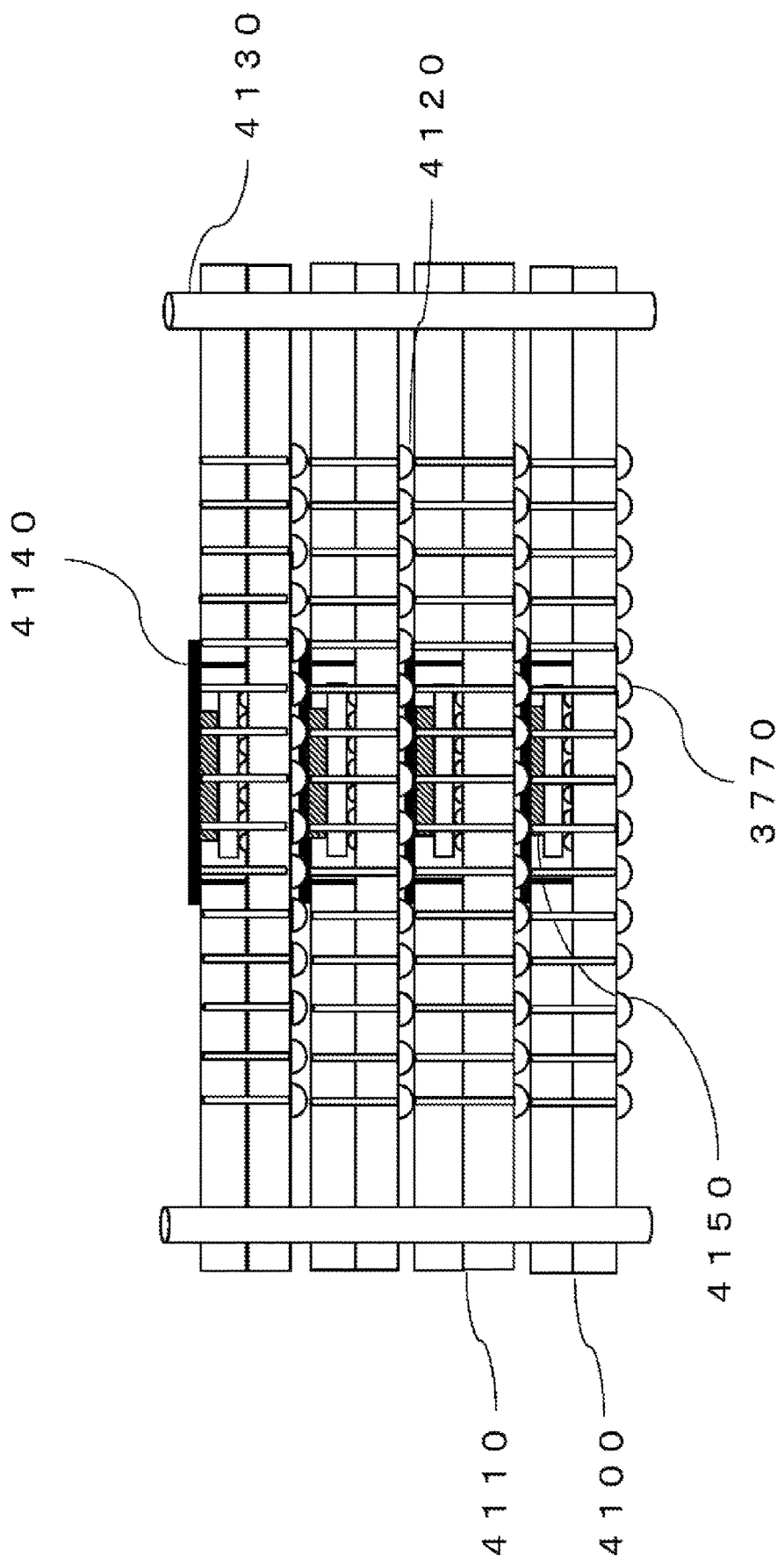
FIG. 45 shows a structure of a stacked semiconductor using BGA bumps of the same size in the first layer and the second and subsequent layers as seen from the side.

FIG. 45 is a mounting example of the semiconductor according to item 34. It is the semiconductor according to item 32 and item 33, and by adopting BGA bumps of the same size in all layers without using the BGA with small bumps according to item 33, in the second and subsequent layers as well, the package is configured by the FC-BGA substrate with the recess for storing the semiconductor chip just as in the first layer, and the package is closed with a compound and a heat spreader. By removing the BGA bumps on the heat spreader part that covers the package, disposing the BGA bumps for the external connection bus inside the lower part of the chip that is blocked by the chip and cannot be penetrated vertically, and disposing the BGA bumps for chip-to-chip interconnection on the outside, simply by removing some BGA bumps for external connection, the second and subsequent layers may be configured by a package based on the same semiconductor in all layers and the same substrate in all layers besides the fact that some BGA bumps are not present.

Figure 46:
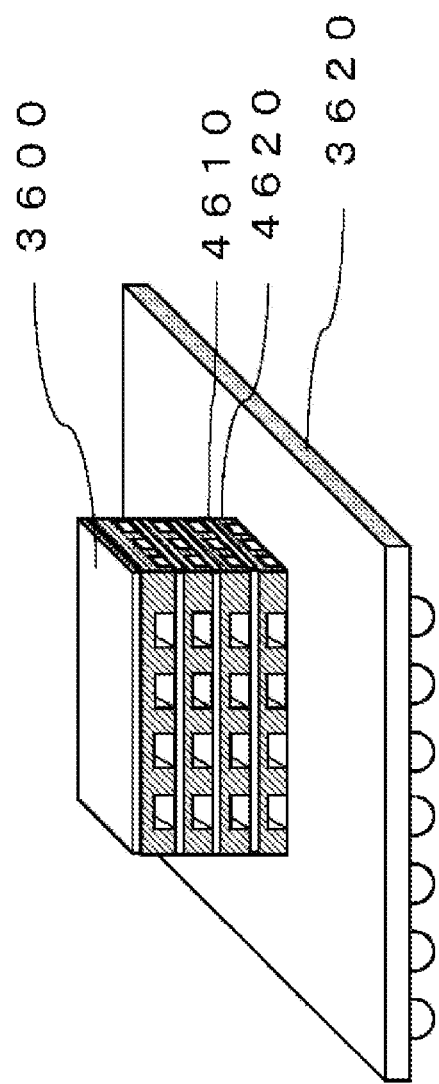
FIG. 46 shows a mounting example of a stacked semiconductor with a groove that has a groove on the semiconductor side.

FIG. 46 is a mounting example of the semiconductor according to item 35. In the case of the semiconductor according to item 10, item 11, item 12, item 28, item 29, and item 30, the grooves through which the coolant passes are not necessarily dug in the interposers but may be dug on the back surfaces of the semiconductors. In this case, the interposers play a role of passing the TSVs and a role of protecting the semiconductor surface on which the compound is mounted. The semiconductors and the interposers to be stacked may be waterproofly fixed with an underfill, an adhesive (glue), an adhesive film, or the like. By doing so, the semiconductors are made thinner by how much the grooves are not dug in the interposers, and the thermal resistance of the interposers is reduced.

According to the semiconductor device described above, it is possible to efficiently cool a plurality of stacked semiconductors chips. Therefore, a large number of semiconductor chips can be stacked. As a result, the physical distance of the bus connecting the semiconductor chips can be shortened, so that it is possible to suppress an increase in power consumption and a great rise in temperature while increasing the processing capability of the semiconductor device.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

REFERENCE SIGNS LIST 10 semiconductor device
20 via
22 via group
30 micro bump
50 logic block
60 memory block
100 interposer
101, 102 surface
103 one end
104, 107 groove
109 other end
110 interposer
111, 112 surface
113 one end
114 groove
115 first groove portion, 116 second groove portion
117 groove
118, 119 through hole
120 interposer
121, 122 surface
123 one end
124 groove
125 first groove portion, 126 second groove portion
127 groove
128, 129 through hole
130, 131, 132 coolant passage
150, 160, 170 interposer
190 cooling device
200, 210, 220 semiconductor chip
240 substrate
241, 242 main surface
250, 260, 270 memory chip
300 surrounding groove
301, 302, 303 groove
330 region
400, 410, 420 interposer
423 one end
404, 414, 424 groove
429 other end
500, 540, 550 heat pipe
600 semiconductor device
1100, 1110, 1120 interposer
1300 grooves
1500 heat pipe
1510, 1520 linear part
1530 curved part
1610, 1620, 1630, 1640, 1650, 1660 semiconductor chip
1601 via group
1611 upper surface
1612 lower surface
1700 semiconductor device
1702 substrate
1711 upper surface
1713, 1714 side surface
1722 lower surface
1710, 1720, 1730, 1740, 1750, 1760 interposer
1791, 1792 grooves
1793, 1794 openings
1800 computer unit
1810 computer
1812 main substrate
1820 mount
1840 computer system
1850 cooling system
1860 liquid immersion tank
1870 coolant
1890 arrow
2900 lid
2910 electrode and holding material
3020 holding material
3030 electrode
3200 positive electrode
3210 negative electrode
3220 electrode holding material
3240 capacitor
3500 spring
3600 interposer without lid, groove, or electrode
3610 interposer with grooves
3620 first layer FC-BGA conversion substrate
3630 first layer semiconductor chip
3770 BGA bump
3800 underfill
3810 FC pad
3820 interposer
3900 FC-BGA conversion substrate, upper part of semiconductor with holes
3910 FC-BGA conversion substrate, lower part
3930 semiconductor chip
3940 BGA bump
3950 hole for passing a metal rod for alignment or a metal rod also having a power supply function
3960 heat spreader, bottom of heat spreader has a square hole
4000 lid 4010 hole with metal leaf spring
4020 electrode
4030 spring
4040 capacitor
4100 first layer semiconductor package
4110 second layer semiconductor package
4120 small BGA bump
4130 metal rod for alignment
4140 heat spreader
4150 compound
4200 first layer FC-BGA conversion substrate
4210 BGA bump
4220 place of heat spreader
4230 hole for passing metal rod for alignment
4300 area where BGA does not exist, avoiding heat spreader
4400 groove
4410 FC ball
4420 underfill
4430 interposer
4610 interposer without grooves that can connect TSV
4620 semiconductor with grooves on back that allows coolant to pass while avoiding TSV

What is claimed is:

1. A three-dimensional stacked integrated circuit, comprising:
a plurality of interposers between respective integrated circuits and below a lowermost integrated circuit of the three-dimensional stacked integrated circuit, wherein a plurality of movement paths of a coolant are respectively provided in the plurality of interposers, and the plurality of movement paths of the coolant provided in the plurality of interposers are connected to each other, wherein
the plurality of interposers include
a first interposer provided with grooves, and
a second interposer that is provided between a surface of the first interposer on which the grooves are provided and a lower surface of the integrated circuit and blocks the grooves provided in the first interposer, and
the movement paths of the coolant are formed by a space sandwiched between the grooves respectively formed in the first interposer and the second interposer, and by holes penetrating through the integrated circuit, the first interposer, and the second interposer, and the coolant flows through a space sandwiched between the grooves and the second interposer, and through the space formed by the holes penetrating through a plurality of the integrated circuits, the first interposer, and the second interposer.

2. The three-dimensional stacked integrated circuit according to claim 1, wherein in the plurality of interposers, grooves formed in adjacent interposers are substantially orthogonal to each other between the adjacent interposers.

3. A three-dimensional stacked integrated circuit, comprising:
a plurality of interposers between respective integrated circuits of the three-dimensional stacked integrated circuit and below a lowermost integrated circuit, wherein a plurality of movement paths of a coolant are respectively provided in the plurality of interposers, and the plurality of movement paths of the coolant provided in the plurality of interposers are connected to each other, wherein
in the plurality of interposers, the movement paths of the coolant provided in adjacent interposers are substantially orthogonal to each other between the adjacent interposers,
the integrated circuits provided between two interposers adjacent to each other in a stacking direction among the plurality of interposers have vertical holes formed thereon in the stacking direction connecting the movement paths of the coolant formed in the adjacent interposers,
interposers and integrated circuits provided between an uppermost interposer and a lowermost interposer among the plurality of interposers are formed with through holes in the stacking direction penetrating from the uppermost interposer to the lowermost interposer, and
one passage through which the coolant flows is formed by the plurality of movement paths of the coolant, the vertical hole, and the through hole provided in the plurality of interposers.

4. The three-dimensional stacked integrated circuit according to claim 1, wherein the plurality of integrated circuits are connected via through vias.

5. The three-dimensional stacked integrated circuit according to claim 1, wherein the plurality of integrated circuits and interposer layers in which grooves are formed are bonded or pressure-bonded with an adhesive including die bonding agent and bonding tape.

6. The three-dimensional stacked integrated circuit according to claim 1, wherein the three-dimensional stacked integrated circuit includes a substrate, an HBM (high bandwidth memory) provided on the substrate, and a three-dimensional array of a plurality of processing units, a plurality of general-purpose GPUs, and a plurality of general-purpose DSP units provided on the substrate, and the substrate is disposed between the plurality of processing units, the plurality of general-purpose GPUs, and the plurality of general-purpose DSP units and the HBM, or the HBM is disposed between the plurality of processing units, the plurality of general-purpose GPUs, and the plurality of general-purpose DSP units and the substrate.

7. The three-dimensional stacked integrated circuit according to claim 1, wherein the grooves through which the coolant passes is formed by digging in an interposer formed by a copper, aluminum plate, or silicon substrate or a back surface of a semiconductor, and the grooves configure a pipeline connected in a stacking direction via the holes formed in the stacking direction.

8. A three-dimensional stacked integrated circuit, comprising:
a plurality of interposers between respective integrated circuits of the three-dimensional stacked integrated circuit and below a lowermost integrated circuit, wherein a plurality of movement paths of a coolant are respectively provided in the plurality of interposers, and the plurality of movement paths of the coolant provided in the plurality of interposers are connected to each other, wherein
the plurality of interposers are formed of copper, aluminum, or silicon substrates, the plurality of interposers has vertical and horizontal grooves through which the coolant passes formed thereon, the grooves extend to edges of the copper, aluminum, or silicon substrates on surrounding surfaces of the three-dimensional stacked integrated circuit and open outside of the plurality of interposers, the three-dimensional stacked integrated circuit is cooled from inside by the coolant entering and being released layer-by-layer in the plurality of interposers from the surrounding surface of the three-dimensional stacked integrated circuit by immersion, and the vertical and horizontal grooves are formed avoiding parts configuring through vias.

9. The three-dimensional stacked integrated circuit according to claim 7, wherein the grooves are V-shaped, U-shaped, or channel-shaped.

10. The three-dimensional stacked integrated circuit according to claim 1, wherein the three-dimensional stacked integrated circuit is immersed, includes an inlet for the coolant, an outlet for the coolant is open in liquid, and cavitation is prevented by applying positive pressure from the inlet.

11. A three-dimensional stacked integrated circuit, comprising:
   a plurality of integrated circuits having BGA packages formed thereon, wherein a lower part of each of the integrated circuits is provided with BGA terminals, an upper surface is provided with pads having a geometrical shape for connecting the BGA terminals with another integrated circuit, the integrated circuits are stacked vertically, the three-dimensional stacked integrated circuit is cooled by immersion using gaps in the BGA terminals of each of the stacked integrated circuits,
   the integrated circuits are pressed down by a holding mechanism so as not to shift when stacked vertically, the holding mechanism includes guides so that the stacked integrated circuits do not shift, a coolant flows through gaps of a ball grid of the BGA terminals, and
   the three-dimensional stacked integrated circuit includes an electrode placed on at least one of a corner and a peripheral part of the three-dimensional stacked integrated circuit, metal rod-shaped electrodes that come in contact with the electrode and supplies a GND potential and a power supply potential, and a capacitor provided between the rod-shaped electrode for supplying the power supply potential and the rod-shaped electrode for supplying the GND potential.

12. The three-dimensional stacked integrated circuit according to claim 11, wherein the pads are spring contacts.

13. The three-dimensional stacked integrated circuit according to claim 11, wherein a vertical connection of the integrated circuits stacked by the pads become a vertical bus.

14. The three-dimensional stacked integrated circuit according to claim 1, including an HBM mounted on top of the three-dimensional stacked integrated circuit.

15. The three-dimensional stacked integrated circuit according to claim 1, wherein memory layers are provided between the integrated circuits, and only the integrated circuits and the memory layers are coupled by through vias.

16. A three-dimensional stacked integrated circuit, comprising:
   a plurality of interposers between respective integrated circuits of the three-dimensional stacked integrated circuit and below a lowermost integrated circuit, wherein a plurality of movement paths of a coolant are respectively provided in the plurality of interposers, and the plurality of movement paths of the coolant provided in the plurality of interposers are connected to each other, wherein
   the three-dimensional stacked integrated circuit includes, above and below the integrated circuits in a stacking direction in the three-dimensional stacked integrated circuit, a metal plate including an aluminum plate not only for contacting BGAs included in the integrated circuits, but also for preventing decomposition of the three-dimensional stacked integrated circuit by pressure of cavitation, and clips for holding the metal plate at four points or more, and comprises an insulator sandwiched between the metal plate and a PCB on which the three-dimensional stacked integrated circuit is installed.

17. The three-dimensional stacked integrated circuit according to claim 1, wherein through vias of data paths for redundancy are provided at a plurality of points.

18. The three-dimensional stacked integrated circuit according to claim 1, wherein the three-dimensional stacked integrated circuit is cooled by immersion and operated at a temperature at which cavitation does not occur.

19. A three-dimensional stacked integrated circuit, comprising:
   a plurality of interposers between respective integrated circuits of the three-dimensional stacked integrated circuit and below a lowermost integrated circuit, wherein a plurality of movement paths of a coolant are respectively provided in the plurality of interposers, and the plurality of movement paths of the coolant provided in the plurality of interposers are connected to each other, wherein
   the three-dimensional stacked integrated circuit is cooled by immersion, and on any one side surface of the three-dimensional stacked integrated circuit, an adapter for injecting the coolant is attached, and a pump for injecting the coolant by positive pressure for preventing cavitation is provided.

20. A three-dimensional stacked integrated circuit, comprising:
   a plurality of interposers between respective integrated circuits of the three-dimensional stacked integrated circuit and below a lowermost integrated circuit, wherein a plurality of movement paths of a coolant are respectively provided in the plurality of interposers, and the plurality of movement paths of the coolant provided in the plurality of interposers are connected to each other, wherein
   the three-dimensional stacked integrated circuit includes an acoustic sensor and a clock frequency controlling device that uses an output of the acoustic sensor to control a clock frequency of the three-dimensional stacked integrated circuit and prevent occurrence of cavitation.

21. A three-dimensional stacked integrated circuit, comprising:
   a plurality of interposers between respective integrated circuits of the three-dimensional stacked integrated circuit and below a lowermost integrated circuit, wherein a plurality of movement paths of a coolant are respectively provided in the plurality of interposers, the plurality of movement paths of the coolant provided in the plurality of interposers are connected to each other, and to prevent decomposition of the three-dimensional stacked integrated circuit by cavitation, the three-dimensional stacked integrated circuit comprises a metal plate including an aluminum plate provided above and below the integrated circuits in a stacking direction in the three-dimensional stacked integrated circuit, four or more metal rods for alignment, and clips for holding the metal plate at four points or more, and comprises insulators sandwiched between the metal plate and a PCB on which the three-dimensional stacked integrated circuit is mounted.

22. The three-dimensional stacked integrated circuit according to claim 21, including an acoustic sensor for detecting whistling that occurs by boiling of the coolant, and a clock frequency controlling device for controlling a clock frequency of the three-dimensional stacked integrated circuit within a range in which whistling does not occur.

23. The three-dimensional stacked integrated circuit according to claim 22, wherein at least one of a depth and a length of the plurality of movement paths are different from each other so that resonance due to whistling does not occur.

24. The three-dimensional stacked integrated circuit according to claim 11, the three-dimensional stacked integrated circuit including a lid having a function of pressing down the stacked integrated circuits and connecting the respective rod-shaped electrodes to each other, wherein the lid includes a path that connects the power supply potential and the GND potential to each other.

25. The three-dimensional stacked integrated circuit according to claim 10, including an electrode placed on at least one of a corner and a peripheral part of the three-dimensional stacked integrated circuit, and metal rod-shaped electrodes that come in contact with the electrode and supplies a GND potential and a power supply potential.

* * * * *